(12) United States Patent
Takizawa et al.

(10) Patent No.: US 8,629,222 B2
(45) Date of Patent: Jan. 14, 2014

(54) CURABLE POLYSILOXANE COMPOSITION, AND POLYSILOXANE CURED PRODUCT, OPTICAL MEMBER, MEMBER FOR AEROSPACE INDUSTRY, SEMICONDUCTOR LIGHT-EMITTING DEVICE, ILLUMINATING DEVICE AND IMAGE DISPLAY DEVICE USING THE SAME

(75) Inventors: Kenichi Takizawa, Fukuoka (JP); Yoshiaki Koyashiki, Fukuoka (JP); Hiroshi Kobayashi, Fukuoka (JP); Masahito Shinbara, Fukuoka (JP); Hanako Kato, Fukuoka (JP); Mari Abe, Kanagawa (JP); Masanori Yamazaki, Kanagawa (JP); Yutaka Mori, Fukuoka (JP)

(73) Assignee: Mitsubishi Chemical Corporation, Tokyo (JP)

( * ) Notice: Subject to any disclaimer, the term of this patent is extended or adjusted under 35 U.S.C. 154(b) by 346 days.

(21) Appl. No.: 12/935,116

(22) PCT Filed: Mar. 27, 2009

(86) PCT No.: PCT/JP2009/056379
§ 371 (c)(1),
(2), (4) Date: Dec. 16, 2010

(87) PCT Pub. No.: WO2009/119841
PCT Pub. Date: Oct. 1, 2009

(65) Prior Publication Data
US 2011/0098420 A1      Apr. 28, 2011

(30) Foreign Application Priority Data
Mar. 28, 2008   (JP) ................. P2008-088316

(51) Int. Cl.
*C08G 77/12*     (2006.01)
*C08F 283/12*    (2006.01)

(52) U.S. Cl.
USPC ............. 525/478; 525/15; 525/474; 525/477

(58) Field of Classification Search
USPC ............... 525/15, 474, 477, 478; 528/15, 31; 524/588, 837
See application file for complete search history.

(56) References Cited

U.S. PATENT DOCUMENTS

| | | | |
|---|---|---|---|
| 3,923,705 A | 12/1975 | Smith | |
| 5,506,302 A | 4/1996 | Shiono et al. | |
| 5,767,193 A * | 6/1998 | Fujiki et al. | 524/847 |
| 6,140,446 A | 10/2000 | Fujiki et al. | |
| 6,306,999 B1 | 10/2001 | Ozai et al. | |
| 7,511,424 B2 | 3/2009 | Sofue et al. | |
| 2004/0156808 A1 | 8/2004 | Kazuhiko et al. | |
| 2005/0129957 A1 | 6/2005 | Kashiwagi et al. | |
| 2006/0035092 A1* | 2/2006 | Shimizu et al. | 428/447 |
| 2006/0229408 A1 | 10/2006 | Shimizu et al. | |
| 2007/0027286 A1* | 2/2007 | Blanc-Magnard et al. | 528/31 |
| 2007/0197742 A1 | 8/2007 | Yamakawa | |
| 2007/0244214 A1 | 10/2007 | Yoshitake et al. | |
| 2007/0298320 A1 | 12/2007 | Barrandon et al. | |
| 2009/0008673 A1 | 1/2009 | Kato et al. | |

FOREIGN PATENT DOCUMENTS

| | | | | |
|---|---|---|---|---|
| GB | 2065661 A | * | 7/1981 | ............. C08L 83/04 |
| JP | 5 86188 | | 4/1993 | |
| JP | 6 49249 | | 2/1994 | |
| JP | 6 200163 | | 7/1994 | |
| JP | 7 48544 | | 2/1995 | |
| JP | 7 126530 | | 5/1995 | |
| JP | 07 064944 | | 7/1995 | |
| JP | 8 259818 | | 10/1996 | |
| JP | 8-269331 | * | 10/1996 | ............. C08L 83/04 |
| JP | 8 269331 | | 10/1996 | |
| JP | 9 77978 | | 3/1997 | |
| JP | 11 222524 | | 8/1999 | |
| JP | 2000 26732 | | 1/2000 | |
| JP | 3 209 897 | | 7/2001 | |
| JP | 3 277 749 | | 2/2002 | |
| JP | 2002 322285 | | 11/2002 | |
| JP | 2005 179541 | | 7/2005 | |
| JP | 2006 077234 | | 3/2006 | |
| JP | 2006 291018 | | 10/2006 | |
| JP | 2006 294821 | | 10/2006 | |
| JP | 2007 527932 | | 10/2007 | |
| WO | WO 03/087209 A1 | | 10/2003 | |
| WO | 2006 090804 | | 8/2006 | |

OTHER PUBLICATIONS

International Search Report issued Jun. 16, 2009 in PCT/JP09/056379 filed Mar. 27, 2009.
Extended European Search Report issued Jun. 26, 2012 in patent application No. 09726172.1.
U.S. Appl. No. 12/950,128, filed Nov. 19, 2010, Kato, et al.

* cited by examiner

*Primary Examiner* — Randy Gulakowski
*Assistant Examiner* — Christopher M Rodd
(74) *Attorney, Agent, or Firm* — Oblon, Spivak, McClelland, Maier & Neustadt, L.L.P.

(57) ABSTRACT

The present invention provides a curable polysiloxane composition which is excellent in light resistance (particularly ultraviolet resistance) and adhesion and has a sufficient heat resistance/hydrothermal resistance and film-forming property and which generates little foaming at curing and does not generate cracks, peeling, coloring, and foaming even when used for a long period of time. A curable polysiloxane composition which comprises a specific hydrosilyl group-containing polysiloxane compound, a specific polysiloxane compound comprising two or more silanol groups in one molecule, and a dehydrogenative condensation reaction catalyst.

19 Claims, 26 Drawing Sheets

(a)

(b)

CURABLE POLYSILOXANE COMPOSITION, AND POLYSILOXANE CURED PRODUCT, OPTICAL MEMBER, MEMBER FOR AEROSPACE INDUSTRY, SEMICONDUCTOR LIGHT-EMITTING DEVICE, ILLUMINATING DEVICE AND IMAGE DISPLAY DEVICE USING THE SAME

CROSS REFERENCE TO RELATED APPLICATION

This application is a 371 of PCT/JP2009/056379, filed on Mar. 27, 2009, and claims priority to Japanese Patent Application No. 2008-088316, filed on Mar. 28, 2008.

TECHNICAL FIELD

The present invention relates to a novel curable polysiloxane composition, and polysiloxane cured product, optical member, member for aerospace industry, semiconductor light-emitting device, illuminating device and image display device using the same. More specifically, the invention relates to a curable polysiloxane composition excellent in heat resistance, light resistance, film-formation capability and adhesion and having a low foaming property, and a polysiloxane cured product, an optical member, a member for aerospace industry, a semiconductor light-emitting device, an illuminating device and an image display device using the same.

BACKGROUND ART

In a semiconductor light-emitting device, especially in a semiconductor light-emitting device such as a light emitting diode (hereinafter abbreviated as "LED" when appropriate) and a semiconductor laser, a semiconductor light-emitting element is generally encapsulated by a member such as a transparent resin (semiconductor light-emitting device member).

An epoxy resin, for example, has been used as the semiconductor light-emitting device member. In addition, a member that comprises a pigment such as a phosphor in the epoxy resin or the like to thereby convert the emission wavelength from the semiconductor light-emitting element has also been known.

However, due to high hygroscopicity of the epoxy resin, there have been problems of cracks caused by heat from the semiconductor light-emitting element when the semiconductor light-emitting device is used for a long time and degradation of the phosphor or the light-emitting element caused by moisture infiltration.

Also in recent years, with shortening of the emission wavelength of LED, there has been a problem of remarkable decrease in luminance of the semiconductor light-emitting device because the epoxy resin degrades and colors in the illumination for a long time and the use at a high output level.

In view of these problems, a silicone resin, which is superior in heat resistance and ultraviolet-ray resistance, has been used as a substitute for the epoxy resin. That is, as materials excellent in heat resistance and ultraviolet-ray resistance, semiconductor light-emitting devices using silicone resins (polysiloxane compositions) have been proposed (Refer, for example, to Patent Documents 1 to 5).

Patent Document 1: JP-A-2006-077234
Patent Document 2: JP-A-2006-291018
Patent Document 3: JP-A-2006-294821
Patent Document 4: WO 2006/090804 pamphlet
Patent Document 5: Japanese Patent No. 3277749

DISCLOSURE OF THE INVENTION

Problems that the Invention is to Solve

Furthermore, for example, Patent Documents 1 to 4 describe curable resin compositions for LED element encapsulating using specific organopolysiloxanes. The organopolysiloxanes described in Patent Documents 1 to 4 have an improved film-formation capability, as compared with a glass material using tetrafunctional silicon alone, by adjusting the crosslinking degree through organic group introduction. However, they require a large amount of silicon of trifunctional or more to be used as a crosslinking component and a cured product thereof is a hard and brittle glass form. Therefore, when it is applied to a large semiconductor light-emitting device such as power LED, a stress cannot be relaxed at the adhesion interface with an LED chip or a reflector and peeling of the encapsulant is liable to occur at a long-time illumination use or at thermal shock such as reflow.

Moreover, the present inventors have disclosed, in Patent Document 4, a semiconductor light-emitting device member comprising specific silicon, which is capable of solving the above problems. However, in the semiconductor light-emitting device using a short-wavelength LED of a near ultraviolet to ultraviolet region, since deterioration such as coloring is apt to occur, it is desirable to impart light resistance against such short-wavelength light. In addition, when the member is used for a semiconductor power device exhibiting further large heat radiation, it is desirable to further increase the level of thermal and hydrothermal stability with maintaining light resistance, film-formation capability and adhesion. Particularly, in the case of a composition comprising a phosphor, there is required thermal stability to maintain luminance of the phosphor even in the illumination for a long time and the use at a high output level. Moreover, it is also desirable to suppress vaporization of low-boiling impurities in the production process of the semiconductor light-emitting device member and improve the production yield in weight of the cured product.

Furthermore, the polysiloxane composition in Patent Document 5 is a gel-like substance that may be used as an LED element-encapsulating resin composition, but the gel-like substance does not become stable in the properties at LED illuminating and thus is not considered to be suitable from the viewpoint that a curable resin composition for encapsulating should bear a purpose of protecting a light-emitting element. In addition, since it is inherently a curing system through a dehydrogenation-type reaction, there is a crucial problem of occurrence of foaming by the influence of hydrogen gas produced as a by-product. Since the foaming becomes a main cause of inducing the following problems, a means for solving them has been desired.

(i) In the case of the use as an encapsulant of a semiconductor light-emitting device, a problem of peeling occurs by the foaming present at the interface between the encapsulant and the other member.

(ii) When foaming occurs at the interface of the phosphor and the interface of the other member, heat conductivity to release the heat generated from the LED chip decreases by the air in the foam and also deterioration of the phosphor and the other member is apt to occur.

(iii) Excitation light of the light-emitting element is apt to escape by the influence of the foam, so that the light conversion efficiency is remarkably reduced.

(iv) It is difficult to always produce equivalent products.

From the above background, there is required an optical member which is excellent in light resistance (particularly ultraviolet-ray resistance) and adhesion and also which has a sufficient thermal resistance and film-formation capability, can encapsulate a semiconductor light-emitting device without generating cracks, peeling and coloring even when used for a long period of time, and affords a high luminance maintenance rate when a phosphor is contained therein. Moreover, there is required an optical member which exhibits little foaming at the curing as and encapsulant, can afford a semiconductor light-emitting device satisfactory in light guiding capability and little in degradation, and can maintain a high luminance maintenance rate for a long period of time when a phosphor is contained therein.

The invention is made in consideration of the aforementioned problems. Namely, an object of the invention is to provide an optical member which is excellent in light resistance (particularly ultraviolet-ray resistance) and adhesion and also which has a sufficient thermal resistance/hydrothermal resistance and film-formation capability, further exhibits little foaming at the curing, can encapsulate a semiconductor light-emitting device without generating cracks, peeling, coloring and foaming even when used for a long period of time, and affords a high luminance maintenance rate when a phosphor is contained therein; a curable polysiloxane composition that is an optical member formation liquid for forming the same, and a member for aerospace industry, a semiconductor light-emitting device, an illuminating device and an image display device utilizing the excellent properties.

Means for Solving the Problems

As a result of intensive investigation to improve particularly the foaming property on a polysiloxane composition, the present inventors have found that a curable polysiloxane composition comprising two or more kinds of siloxane compounds having specific structures and a dehydrogenative condensation reaction catalyst affords a semiconductor light-emitting device member which is excellent in not only light resistance but also adhesion and which has extremely high heat resistance and hydrothermal resistance even when compared with conventional ones, further has a good film-formation capability and also has a high luminance maintenance rate when a phosphor is contained therein, and thus they have accomplished the invention.

Furthermore, they have found that the semiconductor-light-emitting-device-member formation liquid of the invention and a cured product thereof have applicability to not only aforementioned semiconductor light-emitting device fields but also materials for aerospace industry and the other materials for which various properties such as light transmittance (transparency), light resistance, heat resistance, hydrothermal resistance, and UV resistance are required.

Namely, a gist of the invention lies on the following [1] to [19].

[1] A curable polysiloxane composition which comprises:
a siloxane compound comprising two or more hydrosilyl groups in one molecule;
a siloxane compound comprising two or more silanol groups in one molecule; and
a dehydrogenative condensation reaction catalyst, and
which affords a cured product having an average value in height of 0.12 cm or less in the following curing test:
[Curing Test]
(1) 2 g of the curable polysiloxane composition is allowed to stand in a polytetrafluoroethylene-made container having a basal plane diameter of 5 cm and a height of 1 cm under air at the temperature of 150° C. for 6 hours;

(2) after the treatment of the above (1), it is confirmed that the composition has no fluidity (is cured) even when it is allowed to stand for 30 minutes in a state that the inside of the polytetrafluoroethylene-made container is tilted by 45°; and (3) an average value in height from the inner bottom of the container to the top surface of the cured product is measured.

[2] A curable polysiloxane composition which comprises:
a siloxane compound comprising one or more hydrosilyl groups in one molecule and comprising one or more silanol groups in one molecule; and
a dehydrogenative condensation reaction catalyst, and
which affords a cured product having an average value in height of 0.12 cm or less in the above-mentioned curing test.

[3] A curable polysiloxane composition for a semiconductor light-emitting device, which comprises:
a siloxane compound comprising two or more hydrosilyl groups in one molecule;
a siloxane compound comprising two or more silanol groups in one molecule; and
a dehydrogenative condensation reaction catalyst.

[4] A curable polysiloxane composition for a semiconductor light-emitting device, which comprises:
a siloxane compound comprising one or more hydrosilyl groups in one molecule and comprising one or more silanol groups in one molecule; and
a dehydrogenative condensation reaction catalyst.

[5] A curable polysiloxane composition which comprises:
a polysiloxane compound represented by the following general formula (1);
a polysiloxane compound represented by the following general formula (2) and comprising two or more silanol groups in one molecule; and
a dehydrogenative condensation reaction catalyst:

[Chem. 1]

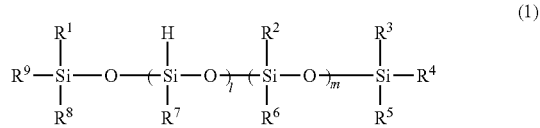

(1)

wherein $R^1$ to $R^3$ and $R^5$ to $R^8$ each independently represent a group selected from a hydrogen atom, an alkyl group, an alkenyl group, an allyl group and $R^{10}R^{11}R^{12}Si$; and $R^9$ to $R^{12}$ each independently represent a group selected from a hydrogen atom, an alkyl group, an alkenyl group and an allyl group; l represents an integer of 2 or larger; and m represents an integer of 0 or larger;

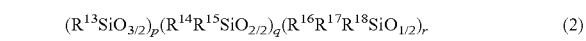

(2)

wherein $R^{13}$ to $R^{18}$ each independently represent a group selected from a hydrogen atom, an alkyl group, an alkenyl group, a hydroxyl group and an allyl group; p, q, and r each represent an integer of 0 or larger; and $p+q+r \geq 1$.

[6] The curable polysiloxane composition according to the above [1] to [5], wherein the dehydrogenative condensation reaction catalyst comprises one or more selected from the group consisting of a metal, a hydroxylamine and boron.

[7] The curable polysiloxane composition according to the above [1] to [6], which further comprises a polysiloxane compound represented by the following general formula (3):

[Chem. 2]

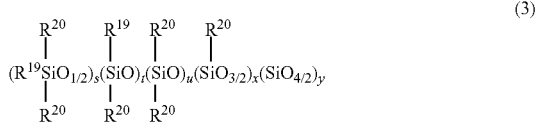

wherein $R^{19}$ is an alkenyl group and $R^{20}$s may be the same as or different from each other and are each a monovalent hydrocarbon group having 6 or less carbon atoms or an alkoxy group having 3 or less carbon atoms; and s and u are each a positive number, and t≥0, x≥0, and y≥0.

[8] The curable polysiloxane composition according to the above [3] to [7], which affords a cured product having an average value in height of 0.12 cm or less in the above-mentioned curing test.

[9] The curable polysiloxane composition according to the above [1] to [8], which is cured within 6 hours under air at the temperature of 150° C.

[10] The curable polysiloxane composition according to the above [1] to [9], wherein a refractive index of the curable polysiloxane composition at temperature of 20° C. at 589 nm is 1.42 or less.

[11] The curable polysiloxane composition according to the above [1] to [10], wherein 95 mol % or more of the substituent excluding the hydride group and the silanol group among all the substituents bound to the silicon atom of the siloxane compound contained in the curable polysiloxane composition is methyl group.

[12] The curable polysiloxane composition according to the above [1] to [11], wherein one or more selected from Pt, Pd, Pb, Sn, Zn, Fe, Ti, Zr and Bi are used as a metal component of the dehydrogenative condensation reaction catalyst.

[13] A polysiloxane cured product obtained by curing the curable polysiloxane composition according to the above [1] to [12].

[14] The polysiloxane cured product according to the above [13], wherein a measurement value of hardness (Shore A) by durometer type A is 5 or larger and 90 or smaller and a light transmittance over the whole wavelengths of 400 nm or more and 800 nm or less at a film thickness of 1 mm is 80% or more.

[15] An optical member comprising the polysiloxane cured product according to the above [13] or [14].

[16] A member for aerospace industry comprising the polysiloxane cured product according to the above [13] or [14].

[17] A semiconductor light-emitting device comprising the optical member according to the above [15].

[18] An illuminating device comprising the semiconductor light-emitting device according to the above [17].

[19] An image display device comprising the semiconductor light-emitting device according to the above [17].

Advantage of the Invention

The curable polysiloxane composition of the invention is excellent in heat resistance, light resistance, hydrothermal resistance, and UV resistance and also suppresses foaming. Moreover, by using the curable polysiloxane composition of the invention, a polysiloxane cured product having the above excellent properties can be obtained.

Furthermore, the polysiloxane cured product of the invention is high in light transmittance (transparency), light resistance, heat resistance, hydrothermal resistance, and the like and exhibits suppressed foaming, so that the cured product can be preferably used for various optical members.

The optical members can be preferably used for semiconductor light-emitting devices, optical guide plates, and waveguides. Furthermore, since the curable polysiloxane composition, polysiloxane cured product, and optical member of the invention are also high in hydrothermal resistance, UV resistance and the like in addition to the aforementioned properties, they can be also applied to material for which these various properties are required, for example, materials for devices using semiconductor light-emitting elements emitting light in an ultraviolet to near ultraviolet region (ultraviolet to near ultraviolet LED), materials for aerospace industry, and the other materials.

BRIEF DESCRIPTION OF THE DRAWINGS

FIG. 1 is a schematic sectional view showing Embodiment A-1.
FIG. 2 is a schematic sectional view showing Embodiment A-2.
FIG. 3 shows Embodiment B-1,
and FIG. 3(a) is a schematic sectional view and FIG. 3(b) is an enlarged view of the substantial part of FIG. 3(a).
FIG. 4 is a schematic sectional view showing Embodiment B-2.
FIG. 5 is a schematic sectional view showing Embodiment B-3.
FIG. 6 is a schematic sectional view showing Embodiment B-4.
FIG. 7 is a schematic sectional view showing Embodiment B-5.
FIG. 8 is a schematic sectional view showing Embodiment B-6.
FIG. 9 is a schematic sectional view showing Embodiment B-7.
FIG. 10 is a schematic sectional view showing Embodiment B-8.
FIG. 11 is a schematic sectional view showing Embodiment B-9.
FIG. 12 is a schematic sectional view showing Embodiment B-10.
FIG. 13 is a schematic sectional view showing Embodiment B-11.
FIG. 14 is a schematic sectional view showing Embodiment B-12.
FIG. 15 is a schematic sectional view showing Embodiment B-13.
FIG. 16 is a schematic sectional view showing Embodiment B-14.
FIG. 17 is a schematic sectional view showing Embodiment B-15.
FIG. 18 is a schematic sectional view showing Embodiment B-16.
FIG. 19 is a schematic sectional view showing Embodiment B-17.
FIG. 20 is a schematic sectional view showing Embodiment B-18.
FIG. 21 is a schematic sectional view showing Embodiment B-19.
FIG. 22 is a schematic sectional view showing Embodiment B-20.
FIG. 23 is a schematic sectional view showing Embodiment B-21.
FIG. 24 is a sectional view of the substantial part, showing Embodiment B-21.

FIG. 25 is a schematic sectional view showing Embodiment B-22.

FIG. 26 is a sectional view of the substantial part, showing Embodiment B-22.

FIG. 27 is a schematic sectional view showing Embodiment B-23.

FIG. 28 is a perspective view of the substantial part, showing Embodiment B-23.

FIG. 29 is a schematic sectional view showing Embodiment B-24.

FIG. 30 is a sectional view of the substantial part, showing Embodiment B-24.

FIG. 31 is a perspective view of the substantial part, showing Embodiment B-24.

FIG. 32 is a schematic sectional view showing Embodiment B-25.

FIG. 33 is a schematic sectional view showing Embodiment B-26.

FIG. 34 is a schematic sectional view showing Embodiment B-27.

FIG. 35 is a schematic sectional view showing Embodiment B-28.

FIG. 36 is a schematic sectional view showing Embodiment B-29.

FIG. 37 shows Embodiment B-30, and FIG. 37(a) is a schematic sectional view and FIG. 37(b) is an enlarged view of the substantial part of FIG. 37(a).

FIG. 38 is a schematic sectional view showing Embodiment B-31.

FIG. 39 is a schematic sectional view showing Embodiment B-32.

FIG. 40 is a schematic sectional view showing Embodiment B-33.

FIG. 41 is a schematic sectional view showing Embodiment B-34.

FIG. 42 is a schematic sectional view showing Embodiment B-35.

FIG. 43 is a schematic sectional view showing Embodiment B-36.

FIG. 44 is a schematic sectional view showing Embodiment B-37.

FIG. 45 is a schematic sectional view showing Embodiment B-38.

FIG. 46 is a schematic sectional view showing Embodiment B-39.

FIG. 47 is a schematic sectional view showing Embodiment B-40.

FIG. 48 is a schematic sectional view showing Embodiment B-41.

FIG. 49 is an explanatory drawing of another configuration example of the substantial part of each Embodiment.

FIG. 50(a) and 50(b) are respectively explanatory drawings of basic concepts of each Embodiment.

Figure 1:
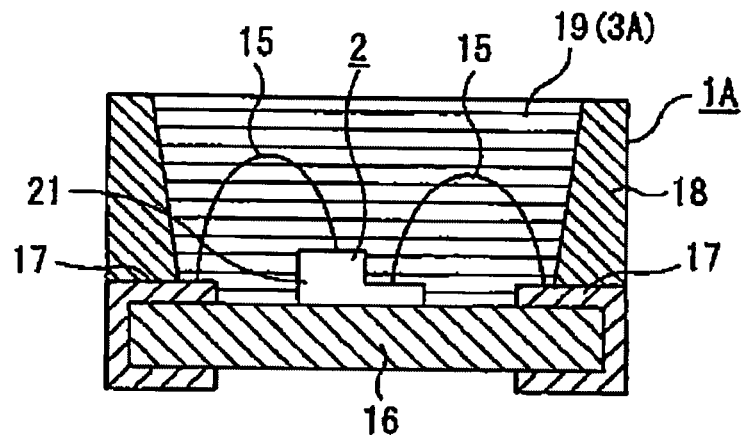
[FIG. 1]

DESCRIPTION OF REFERENCE NUMERALS AND SIGNS 1, 1A, 1B: Light-emitting device (semiconductor light-emitting device)
2: Light-emitting element
3A: Transparent member (semiconductor light-emitting device member)
3B: Phosphor part (semiconductor light-emitting device member)
4a, 4b: Part of light emitted from light-emitting element
5: Light of wavelengths specific to phosphor components, such as phosphor particles, fluorescent ions and fluorescent dyes, contained in the phosphor part
11: Mold part
12, 13: Lead terminal
14: Mirror (cup part)
15: Conductive wire
16: Insulating substrate
16a: Hollow
17: Printed wiring
18: Frame
19: Encapsulating part
19a: Encapsulating function part
19b: Lens function part
19c: Recess
19d: Through-hole
21: Light-emitting layer part
23: Reflective layer
24: Bump
33, 34: Phosphor part
35: Solid medium
36: Lid
101: Cup
102: LED chip
103: LED element

BEST MODE FOR CARRYING OUT THE INVENTION

The present invention will be described in detail below, but it is to be understood that the invention is not limited to the following embodiment and can be carried out with adding various modifications thereto as far as they do not depart from the gist of the invention.

[1] Curable Polysiloxane Composition

As one embodiment of the curable polysiloxane composition of the invention, it comprises: a siloxane compound comprising two or more hydrosilyl groups in one molecule; and a siloxane compound comprising two or more silanol groups in one molecule.

Moreover, as another embodiment of the curable polysiloxane composition of the invention, it comprises a siloxane compound comprising one or more hydrosilyl groups in one molecule and comprising one or more silanol groups in one molecule.

The siloxane compound comprising two or more hydrosilyl groups in one molecule is an organohydrogensilane or a linear, branched, or three-dimensional net-like organohydrogenpolysiloxane, which has at least two, preferably three or more SiH bonds in one molecule. Among them, the organohydrogenpolysiloxane is hardly vaporized at curing and thus preferable. As a substituent for the organohydrogenpolysiloxane, groups to be mentioned below can be used but preferably, those having no aliphatic unsaturated bond are suitable.

In the above organohydrogenpolysiloxane, as substituted or unsubstituted monovalent hydrocarbon groups bound to a silicon atom, there may be usually mentioned those having 1 to 12, preferably about 1 to 8 carbon atoms and more specifically, there may be mentioned alkyl groups such as methyl group, ethyl group, propyl group, isopropyl group, butyl group, isobutyl group, tert-butyl group, pentyl group, neopentyl group, hexyl group, cyclohexyl group, octyl group, nonyl group and decyl group; aryl groups such as phenyl group, tolyl group, xylyl group and naphthyl group; aralkyl groups such as benzyl group, phenylethyl group and phenylpropyl group; alkenyl groups such as vinyl group, allyl group, propenyl group, isopropenyl group, butenyl group, hexenyl group, cyclohexenyl group and octenyl group; and those where a part or all of the hydrogen atoms of these groups are substituted with a halogen atom such as fluorine, bromine or chlorine, cyano group or the like, e.g., halogen-substituted alkyl groups such as chloromethyl group, chloropropyl group, bromoethyl group and trifluoropropyl group, cyanoethyl group, and the like. Moreover, an alkoxy group having 1 to 3 carbon atoms may be contained in an amount within 3 wt %.

The above organohydrogensilane and organohydrogenpolysiloxane includes $(CH_3)SiH_3$, $(CH_3)_2SiH_2$, $(C_6H_5)SiH_3$, 1,1,3,3-tetramethyldisiloxane, 1,3,5,7-tetramethylcyclotetrasiloxane, both terminal trimethylsiloxy group-containing methylhydrogenpolysiloxane, both terminal trimethylsiloxy group-containing dimethylsiloxane/methylhydrogensiloxane copolymer, both terminal dimethylhydrogensiloxy group-containing dimethylpolysiloxane, both terminal dimethylhydrogensiloxy group-containing dimethylsiloxane/methylhydrogensiloxane copolymer, both terminal trimethylsiloxy group-containing methylhydrogensiloxane/diphenylsiloxane copolymer, both terminal trimethylsiloxy group-containing methylhydrogensiloxane/diphenylsiloxane/dimethylsiloxane copolymer, a copolymer composed of a $(CH_3)_2HSiO_{1/2}$ unit and a $SiO_{4/2}$ unit, a copolymer composed of a $(CH_3)_2HSiO_{1/2}$ unit, a $SiO_{4/2}$ unit, and a $(C_6H_5)SiO_{3/2}$ unit, and the like.

Among them, the compound represented by the above general formula (1) can be preferably used.

The siloxane compound comprising two or more silanol groups in one molecule acts as a crosslinking agent which cures the composition by a dehydrogenative condensation reaction with the above-mentioned hydroxyl group-containing siloxane, and is a linear, branched, or three-dimensional net-like organopolysiloxane having at least two silanol groups in one molecule. As the substituents for the organopolysiloxane, the substituents same as in the case of the aforementioned organohydrogenpolysiloxane can be used but preferably, those having no aliphatic unsaturated bond are suitable. Among them, the compound represented by the general formula (2) can be preferably used.

The siloxane compound comprising one or more hydrosilyl groups in one molecule and comprising one or more silanol groups in one molecule is a linear, branched, or three-dimensional net-like organopolysiloxane comprising one or more hydrosilyl group and one or more silanol groups in one molecule, which has both properties of the siloxane compound comprising two or more hydrosilyl groups in one molecule and the siloxane compound comprising two or more silanol groups in one molecule in combination. As the substituents for the organopolysiloxane, the substituents same as in the case of the aforementioned organohydrogenpolysiloxane can be used but preferably, those having no aliphatic unsaturated bond are suitable. For example, such compounds can be obtained by reacting the above-mentioned organohydrogenpolysiloxane comprising two or more hydrosilyl groups in one molecule with the organopolysiloxane comprising two or more silanol groups in one molecule by a method of dehydrogenative condensation, hydrolytic polycondensation, or the like. The above-mentioned production method is one example and the production method is not limited thereto.

Moreover, as one embodiment of the curable polysiloxane composition of the invention, it comprises: a polysiloxane compound represented by the following general formula (1); a polysiloxane compound represented by the following general formula (2) and comprising two or more silanol groups in one molecule; and a curing catalyst comprising a dehydrogenative condensation reaction catalyst (preferably, a metal, a hydroxylamine, or boron).

[Chem. 3]

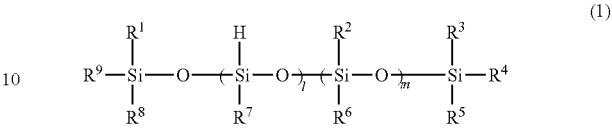

In the general formula (1), $R^1$ to $R^3$ and $R^5$ to $R^8$ each independently represent a group selected from a hydrogen atom, an alkyl group, an alkenyl group, an allyl group and $R^{10}R^{11}R^{12}Si$; $R^4$ and $R^9$ to $R^{12}$ each independently represent a group selected from a hydrogen atom, an alkyl group, an alkenyl group and an allyl group; l represents an integer of 2 or larger; and m represents an integer of 0 or larger.

$$(R^{13}SiO_{3/2})_p(R^{14}R^{15}SiO_{2/2})_q(R^{16}R^{17}R^{18}SiO_{1/2})_r \quad (2)$$

In the general formula (2), $R^{13}$ to $R^{18}$ each independently represent a group selected from a hydrogen atom, an alkyl group, an alkenyl group and an allyl group; p, q, and r each represent an integer of 0 or larger; and p+q+r≥1.

It is preferred that at least 80 mol % or more, preferably 95 mol % or more, further preferably 99 mol % or more of $R^1$ to $R^{18}$ are methyl group.

Moreover, as one embodiment of the curable polysiloxane composition of the invention, the above curable polysiloxane composition can further comprise a polysiloxane compound having an alkenyl group, which is represented by the following general formula (3) or the like:

[Chem. 4]

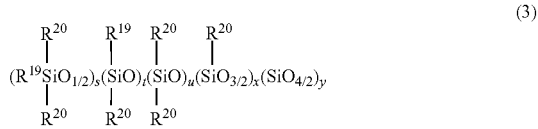

wherein $R^{19}$ is an alkenyl group, $R^{20}$s may be the same as or different from each other and are each a monovalent hydrocarbon group having 6 or less carbon atoms or an alkoxy group having 3 or less carbon atoms, and it is preferred that at least 80 mol % or more, preferably 95 mol % or more, further preferably 99 mol % or more thereof are methyl group; and s and u are each a positive number and t≥0, x≥0, and y≥0.

As the above-mentioned silicon-containing compound comprising an alkenyl group, there may be mentioned vinyl group-containing polyorganosiloxanes which may be the same or different. One kind of them can be used singly or two or more kinds thereof can be used in any ratio and in any combination. Among the above, a vinyl group-containing polyorganosiloxane comprising two or more vinyl groups in the molecule is preferable.

As the vinyl group-containing polyorganosiloxane comprising two or more vinyl groups in the molecule, specifically, there are mentioned both terminal vinylpolydimethylsiloxanes manufactured by Gelest Inc.:

DMS-V00,
DMS-V03,
DMS-V05,
DMS-V21,

DMS-V22,
DMS-V25,
DMS-V31,
DMS-V33,
DMS-V35,
DMS-V41,
DMS-V42,
DMS-V46,
DMS-V52,
both terminal vinyldimethylsiloxane-diphenylsiloxane copolymers manufactured by Gelest Inc.:
PDV-0325,
PDV-0331,
PDV-0341,
PDV-0346,
PDV-0525,
PDV-0541,
PDV-1625,
PDV-1631,
PDV-1635,
PDV-1641,
PDV-2331,
PDV-2335,
both terminal vinylphenylmethylsiloxane manufactured by Gelest Inc.:
PMV-9925,
trimethylsilyl group-containing vinylmethylsiloxane-dimethylsiloxane copolymers manufactured by Gelest Inc.:
VDT-123
VDT-127
VDT-131
VDT-153
VDT-431
VDT-731
VDT-954
vinyl T-structure polymers manufactured by Gelest Inc.:
VTT-106,
MTV-124,
and others such as vinyl group-containing cyclic dimethylpolysiloxanes.

In the following, features of the curable polysiloxane composition of the invention will be explained.

[1-1] Hydroxyl Group-containing Polysiloxane Compound

The curable polysiloxane composition of the invention preferably comprises a hydrosilyl group-containing polysiloxane compound represented by the following general formula (1). By the presence of the hydrosilyl group in the siloxane skeleton, tuning of crosslinking density can be easily achieved.

[Chem. 5]

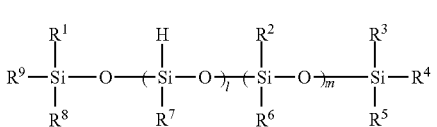

(1)

In the general formula (1), $R^1$ to $R^3$ and $R^5$ to $R^8$ each independently represent a group selected from a hydrogen atom, an alkyl group, an alkenyl group, an allyl group and $R^{10}R^{11}R^{12}Si$; $R^4$ and $R^9$ to $R^{12}$ each independently represent a group selected from a hydrogen atom, an alkyl group, an alkenyl group, and an allyl group; l represents an integer of 2 or larger; and m represents an integer of 0 or larger.

($R^1$ to $R^3$ and $R^5$ to $R^8$)

$R^1$ to $R^3$ and $R^5$ to $R^8$ each independently represent a group selected from a hydrogen atom, an alkyl group, an alkenyl group, an allyl group and $R^{10}R^{11}R^{12}Si$. Among them, the alkyl group, the alkenyl group, the allyl group, and $R^{10}R^{11}R^{12}Si$ may be further substituted with a halogen atom.

Examples of preferable alkyl groups include, for example, methyl group, ethyl group, propyl group and a trifluoropropyl group.

Examples of preferable alkenyl group include, for example, vinyl group.

Examples of preferable allyl group include, for example, phenyl group.

Among them, as preferable ones, phenyl group, methyl group and the like may be mentioned.

($R^4$, $R^9$ to $R^{12}$)

$R^4$ and $R^9$ to $R^{12}$ each independently represent a group selected from a hydrogen atom, an alkyl group, an alkenyl group and an allyl group. The Alkyl Group, the Alkenyl group and the allyl group may be further substituted with a halogen atom and preferred alkyl group, alkenyl group, and allyl group are the same as in the case of the above $R^1$ to $R^3$ and $R^5$ to $R^8$.

Among them, as preferable ones, phenyl group, methyl group and the like may be mentioned.

As the hydrosilyl group-containing polysiloxane compound represented by the general formula (1), specifically, for example, there are mentioned hydride terminated polydimethylsiloxanes, polymethylhydrosiloxanes trimethylsilyl terminated and the like. As these, it is also possible to use commercially available products and examples thereof include KF-99, KF-9901 manufactured by Shin-Etsu Chemical Co., Ltd.; SH 1107 series manufactured by Dow Corning Toray Co., Ltd.; TSF484, TSL9586 manufactured by Momentive Performance Materials Inc.; H-Siloxane manufactured by WACKER ASAHIKASEI SILICONE Co., Ltd.; HMS series, DMS series manufactured by Gelest Inc.; and the like.

In the above hydrosilyl group-containing polysiloxane compound, the weight-average molecular weight in terms of polystyrene is important and is usually 160 or more, preferably 500 or more.

Particularly, when the curable polysiloxane composition of the invention is cured to form a cured product thereof, it is preferred that the weight-average molecular weight is further 5000 or more in order to suppress the shrinkage under air at the temperature of 200° C. or higher and it is preferred that the weight-average molecular weight is further 27000 or more in order to facilitate the curing of the curable polysiloxane composition of the invention.

Moreover, the weight-average molecular weight is usually 700000 or less, preferably 100000 or less.

Particularly, in order to lower viscosity to improve handling ability, it is preferable that the weight-average molecular weight is further 90000 or less.

Regarding the above-mentioned hydrosilyl group-containing polysiloxane compound, one kind thereof may be used singly or two or more kinds may be used in any combination and in any ratio.

[1-2] Polysiloxane Compound Comprising Two or More Hydroxyl Groups in One Molecule The curable polysiloxane composition of the invention preferably comprises a polysiloxane compound represented by the following general formula (2) and comprising two or more hydroxyl groups in one molecule. By comprising two or more hydroxyl groups in one molecule, it becomes possible to increase the molecular weight to a high molecular weight linearly or three-dimensionally through a reaction with a trifunctional molecule while crosslinking.

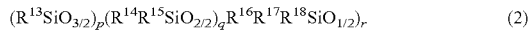
$$(R^{13}SiO_{3/2})_p(R^{14}R^{15}SiO_{2/2})_q R^{16}R^{17}R^{18}SiO_{1/2})_r \quad (2)$$

In the general formula (2), $R^{13}$ to $R^{18}$ each independently represent a group selected from a hydrogen atom, an alkyl group, an alkenyl group and an allyl group; p, q, and r each represent an integer of 0 or larger; and $p+q+r \geq 1$.

($R^{13}$ to $R^{18}$)

$R^{13}$ to $R^{18}$ each independently represent a group selected from a hydrogen atom, an alkyl group, an alkenyl group, and an allyl group. The alkyl group, the alkenyl group, and the allyl group may be further substituted with a halogen atom, and preferable alkyl group, alkenyl group, and allyl group are the same as in the case of the above $R^1$ to $R^3$ and $R^5$ to $R^8$.

Among them, as preferable ones, phenyl group, methyl group and the like may be mentioned.

In the above-mentioned polysiloxane compound comprising two or more silanol groups in one molecule, from the viewpoint of appropriately suppressing a viscosity increase at curing, it is important to control the amount of the silanol groups in the molecule so as not to be exceedingly large. That is, the number of the silanol groups in $R^{13}$ to $R^{18}$ is usually 99.9% or less, preferably 99.5% or less and further preferably 99% or less, and usually 1% or more, preferably 1.5% or more and further preferably 2% or more, based on the total number of the substituents of $R^{13}$ to $R^{18}$. When the amount of the silanol group is too large, the viscosity increase rate is too large and hence handling ability is not good. Moreover, when the amount of the silanol group is too small, there is a case where the proceeding of the reaction becomes slow or is insufficient.

As specific examples of the polysiloxane compound comprising two or more hydroxyl groups in one molecule, which is represented by the general formula (2), for example, hydroxyl terminated polydimethylsiloxanes (silanol terminated polydimethylsiloxanes) and the like may be mentioned. Moreover, as these polysiloxane compounds comprising two or more hydroxyl groups in one molecule, commercially available products can be used and, for example, as hydroxyl terminated polydimethylsiloxanes manufactured by Momentive Performance Materials Inc., there may be mentioned XC96-723, XF3905, YF3057, YF3800, YF3802, YF3807, YF3897 and the like.

The weight-average molecular weight of the polysiloxane compound comprising two or more hydroxyl groups in one molecule, in terms of polystyrene, is usually 160 or more, preferably 400 or more and further preferably 500 or more, and usually 700000 or less, preferably 50000 or less, and further preferably 30000 or less. When the molecular weight is less than the range, there is a possibility that the cured product becomes hard and brittle. Moreover, when the molecular weight is more than the above range, there is a possibility that curing is difficult to occur.

One kind of the above polysiloxane compound comprising two or more hydroxyl groups in one molecule may be used singly or two or more thereof may be used in any combination and in any ratio.

[1-3-1] Mixture of Polysiloxane Compounds

The polysiloxane composition of the invention comprises, for example, a siloxane compound comprising two or more hydrosilyl groups in one molecule and a siloxane compound comprising two or more silanol groups in one molecule, but the blending amount thereof is usually 100:1 to 1:100, preferably 20:1 to 1:20 and further preferably 10:1 to 1:10 as a molar ratio of Si—H (hydrosilyl group) to Si—OH (silanol group). When the polysiloxane compound represented by the above general formula (1) is too much or the polysiloxane compound represented by the above general formula (2) is too much, curing becomes insufficient.

The siloxane compound comprising one or more hydrosilyl groups and one or more silanol groups in one molecule can be singly transformed into a curable composition by mixing it with a dehydrogenative condensation reaction catalyst but, if necessary, can be transformed into a composition excellent in curability by mixing an SiH/SiOH-containing siloxane compound having a molecular weight different from each other or a siloxane compound having a different SiH/SiOH ratio.

The polysiloxane composition of the invention comprises at least the polysiloxane compounds represented by the above general formulae (1) and (2), but the blending amount thereof is usually 100:1 to 1:100, preferably 20:1 to 1:20 and further preferably 10:1 to 1:10 as a molar ratio of Si—H (hydrosilyl group) to Si—OH (silanol group). When the polysiloxane compound represented by the above general formula (1) is too much or the polysiloxane compound represented by the above general formula (2) is too much, curing becomes insufficient.

Regarding the substituents of $R^1$ to $R^{20}$ of the above polysiloxane compounds represented by the general formulae (1) and (2), (3), preferred are those where 95 mol % or more, preferably 98 mol % or more, further preferably 99 mol % or more of the substituents excluding the hydride group and the hydroxyl group are an alkyl group. The ratio of the alkyl groups is usually 100 mol % or less. As the alkyl group, methyl group, ethyl group, propyl group and the like may be mentioned and, from the viewpoint of stability, methyl group is preferable.

Namely, since the hydride group and the hydroxyl group are essential substituents for the curing reaction, it is necessary to be suitably contained therein but, from the viewpoint of light and thermal stability of the cured product, those comprising a large amount of the alkyl groups as the other substituents are preferable. When the alkyl groups are contained too little and are substituted with the other substituents, stability becomes poor.

[1-3-2] Dehydrogenative Condensation Reaction Catalyst (also Referred to as Curing Catalyst)

The curable polysiloxane composition of the invention comprises a dehydrogenative condensation reaction catalyst, particularly a siloxane compound dehydrogenative condensation reaction catalyst. The siloxane compound dehydrogenative condensation reaction catalyst preferably comprises at least one selected from the group consisting of a metal, boron, and a hydroxylamine. As the metal component, one or more selected from Pt, Pd, Pb, Sn, Zn, Fe, Ti, Zr and Bi is preferably used and particularly, Pt, Pd, and Sn are preferable since the reactivity is high. Particularly, Sn is preferred, which has an appropriate activity, enables easy control of the reaction rate, and is industrially easily available. Among Sn-based curing catalysts, Sn(IV)-based one is further preferable. Moreover, when the cured product is used in the vicinity of an electrode, the use of a hydroxylamine, a platinum-based catalyst or the like is preferably used since electrode coloring or the like hardly occur.

As specific examples of the curing catalyst, for example, there may be mentioned dioctyltin laurate, tin 2-ethylhexanoate, zinc stearate, diethylhydroxylamine, tris(pentafluorophenyl)borane and the like. Moreover, a platinum vinylsiloxane complex, chloroplatinic acid and the like can be also suitably used but, since they are highly active and the cured product tends to be a foam, if necessary, a curing inhibitor such as ethynylcyclohexanol may be used in combination and foaming can be suppressed by adopting stepwise temperature elevation for the curing temperature.

One kind of the above curing catalyst may be used singly or two or more kinds thereof may be used in any combination and in any ratio. In addition, any reaction accelerator and reaction inhibitor may be used in combination.

It is important to add the above-mentioned curing catalyst in such an amount that the curable polysiloxane composition of the invention is at least cured and severe foaming does not occur at curing. For example, the catalyst is contained in an amount of usually 0.001% by weight or more, preferably 0.002% by weight or more and more preferably 0.005% by weight or more, and usually 0.3% by weight or less, preferably 0.2% by weight or less and more preferably 0.1% by weight or less in the total raw material weight in terms of a hydroxylamine, boron, or a metal element.

Particularly, in the case of using the Sn(IV)-based catalyst, from the viewpoint of suppressing the amount of tin oxide formed with time, the amount is preferably 0.08% by weight or less.

Incidentally, the content of the above-mentioned curing catalyst can be measured by ICP analysis.

[1-4] Curability

The curable polysiloxane composition of the invention is preferably cured under air at the temperature of 150° C. usually within 6 hours, preferably within 4 hours, and further preferably within 3 hours. Namely, since the curable polysiloxane composition of the invention is relatively short in curing time, the composition is economically superior and there is a technical significance that, when a filler is kneaded therein, the filler is not precipitated. Moreover, since curing is possible at such a relatively low temperature as 150° C., a decrease in performance of constituting elements of a semiconductor light-emitting device, particularly a semiconductor light-emitting element and a phosphor, by heat can be also suppressed.

In the invention, "curing" means a change from a state of showing fluidity to a state of showing no fluidity. For example, an uncured state or a cured state can be judged by the presence or absence of fluidity even when a subject is allowed to stand for 30 minutes in a state tilted by 45° from a horizontal plane, respectively.

A time for curing the curable polysiloxane composition of the invention under air at the temperature of 150° C. is preferably within 6 hours and further preferably within 5 hours. Moreover, the time is usually 0.2 hour or more and preferably 0.5 hour or more. When the curing time is too long, a filler is precipitated at the time when the filler is kneaded therein and also the cost is high since a long-term curing treatment is necessary. When the curing time is too short, handling is difficult and the composition is cured before leveling, resulting in unevenness on the formed surface in some cases.

In order to accelerate the curing rate, there are a method of selecting an appropriate catalyst, a method of using a polysiloxane raw material having many branches, a method of using a polysiloxane raw material having a high molecular weight, a method of actively removing elimination components such as hydrogen to be generated at curing, and the like.

In addition, the curable polysiloxane composition of the invention has a feature that the film thickness becomes relatively thin by curing. This fact has a technical significance in view of capability of producing a homogeneous film having little foaming.

That is, the curable polysiloxane composition of the invention has an average value in height (thickness) of usually 0.12 cm or less, preferably 0.118 cm or less, further preferably 0.115 cm or less and usually 0.09 cm or more, preferably 0.1 cm or more. The increase in the average value in height means the entrainment of bubbles and air. When the average value in height is too large, there is a case where foaming is apt to occur. When the average value in height is too small, there is a case where the amount of solid matter is too small or shrinkage during curing is apt to occur.

[Curing Test]

(1) 2 g of the curable polysiloxane composition is allowed to stand in a polytetrafluoroethylene-made container having a basal plane diameter of 5 cm and a height of 1 cm under air at the temperature of 150° C. for 6 hours.

(2) After the treatment of the above (1), it is confirmed that the composition has no fluidity (is cured) even when it is allowed to stand for 30 minutes in a state that the inside of the polytetrafluoroethylene-made container is tilted by 45°.

(3) An average value in height from the inner bottom of the container to the top surface of the cured product is measured.

In this regard, the average value in height in the above (3) is specifically measured according to the following procedures (4) to (6).

(4) Water is added to the polytetrafluoroethylene-made container after the above-mentioned curable polysiloxane composition has been cured therein (after the treatment of the above (2)).

(5) The volume of water added is measured and a value obtained by dividing the volume by the area of the base (5 cm) is regarded as an "average value in height of water".

(6) The average value in height is calculated according to the following equation.

{Average value in height (cm)}={Height of container (1 cm)}−{Average value in height of water (cm)}

In order to form the cured product as non-foamed one and control the average value in height within the preferable range, it is suitable to control the curing rate so that curing occurs after low-boiling volatile components such as generated hydrogen, dissolved air/water and the like have been completely discharged to the outside of the curable composition system. For example, the composition ratio of the compound of the general formula (1) to the compound represented by the general formula (2) is suitably 1:10 to 10:1. When the compound represented by the general formula (3) is added in addition to the compounds represented by the general formulae (1) and (2), the ratio of the sum of (1) and (2) to (3) is suitably 10:1 to 1:1, preferably 5:1 to 1:1. Moreover, it is suitable to select the raw materials so that the molar ratio of the hydrosilyl group possessed by the compound represented by the general formula (1) to the silanol group possessed by the compound represented by the general formula (2), SiH/SiOH, becomes usually 1 to 20, preferably 1 to 10. Since the molecular weight of the raw material polysiloxane influences reactivity, for example, the molecular weight of the silanol group-containing polysiloxane represented by the general formula (2) is preferably in the range of 500 or more. The suitable concentration of the catalyst varies depending on the kind of the catalyst and is not categorically determined but is usually 0.001% by weight or more, preferably 0.002% by weight or more and more preferably 0.005% by weight or more, and usually 0.3% by weight or less, preferably 0.2% by weight or less and more preferably 0.1% by weight or less in the total raw material weight.

[1-5] Refractive Index

Regarding the refractive index of the curable polysiloxane composition of the invention, the refractive index of light having a wavelength of 589 nm at a temperature of the curable polysiloxane compound of 20° C. is usually 1.42 or less, preferably 1.419 or less and further preferably 1.418 or less, and usually 1.35 or more, preferably 1.40 or more. In the case of the application to an optical member, the refractive index of a general light-emitting device is about 2.5 or less but, in the invention, it is preferable to select one having a relatively low refractive index, also from the viewpoint of light stability of a resin.

In the curable polysiloxane composition of the invention, it is preferable that 80 mol % or more, preferably 95 mol % or more, further preferably 99 mol % or more of the substituent excluding the hydride group and the silanol group among all the substituents bound to the silicon atom of the siloxane compound contained in the curable polysiloxane composition are an alkyl group. Moreover, the alkyl group is preferably methyl group.

Among all the substituents bound to the silicon atom of the siloxane compound, the molar fraction of the substituent excluding the hydride group and the silanol group can be calculated as molar percentage by (molar ratio calculated from total area of peaks of alkyl groups bound to a silicon atom of siloxane compound)/(molar ratio calculated from total area of peaks of all substituents (excluding hydride group and hydroxyl group) bound to a silicon atom of siloxane compound) from the measured spectrum using liquid H-nuclear magnetic resonance spectrum, solid H-nuclear magnetic resonance spectrum, solid Si-nuclear magnetic resonance spectrum, or a complementary combination thereof.

Specifically, among the substituents $R^1$ to $R^{20}$ of the above general formulae (1), (2) and (3), preferred are those where 80 mol % or more, preferably 95 mol % or more, further preferably 98 mol % or more, particularly preferably 99 mol % of all the substituents excluding the hydride group and the hydroxyl group are an alkyl group. Moreover, when the above-mentioned refractive index is too large and is more than the refractive index of a light-emitting device, there is a possibility that efficiency of extracting light is not improved. Furthermore, when the refractive index is too small, for example, there is a possibility that the efficiency of extracting light is not improved as compared with an existing semiconductor light-emitting device member.

The refractive index of the curable polysiloxane composition of the invention can be usually measured by a refractometer. Specifically, an Abbe refractometer (using sodium D line (589 nm)) can be employed.

As a method of controlling the refractive index of the curable polysiloxane composition of the invention within the above range, for example, it may be mentioned to appropriately select the kind and blending amount of the above-mentioned polysiloxane compounds, as described below. Particularly, in any of the polysiloxane compounds (compounds represented by the above-mentioned general formulae (1) and (2)), preferably in all of them, the refractive index of light having a wavelength of 589 nm at temperature of 20° C. is usually 1.42 or less, preferably 1.419 or less and further preferably 1.418 or less and usually 1.35 or more, preferably 1.40 or more. When the above refractive index is too large and is more than the refractive index of a light-emitting device, there is a possibility that the efficiency of extracting light is not improved. Furthermore, when the refractive index is too small, for example, there is a possibility that the efficiency of extracting light is not improved as compared with an existing semiconductor light-emitting device member. In this regard, the measurement of the refractive index of the above polysiloxane compound can be performed in the same manner as the measurement of the refractive index of the curable polysiloxane composition of the invention.

[1-6] Properties of Curable Polysiloxane Composition

The viscosity of the curable polysiloxane composition of the invention is not limited but is usually 20 mPa·s or more, preferably 100 mPa·s or more and more preferably 200 mPa·s or more, and usually 1500 mPa·s or less, preferably 1000 mPa·s or less and more preferably 800 mPa·s or less at liquid temperature of 25° C. In this regard, the above viscosity can be measured by an RV type viscometer (e.g., an RV type viscometer "RVDV-II⁺Pro" manufactured by Brookfield Company).

[1-7] Combination with Other Member

The curable polysiloxane composition of the invention may be used singly but, for the purpose of adjusting properties such as the viscosity, curing rate, hardness of the cured product, and improvement in easiness of application, the composition may be mixed with other liquid medium.

As the liquid medium to be used, inorganic materials and/or organic materials can be employed.

Examples of the inorganic materials include, for example, metal alkoxides, ceramic precursor polymers, solutions obtained by hydrolytic polymerization of a solution comprising a metal alkoxide by sol-gel method, inorganic materials obtained by solidifying combinations thereof (for example, inorganic materials comprising a siloxane bond), and the like.

Examples of the organic materials include thermoplastic resins, thermosetting resins, light curing resins and the like. More specifically, examples thereof include, for example, methacrylic resins such as methyl polymethacrylate; styrene resins such as polystyrene, and styrene-acrylonitrile copolymers; polycarbonate resins; polyester resins; phenoxy resin; butyral resin; polyvinyl alcohol; cellulose resins such as ethyl cellulose, cellulose acetate and cellulose acetate butyrate; epoxy resins; phenol resins; silicone resins; and the like. Particularly in the case where a high-power light-emitting device such as an illuminating device is required, a silicon-containing compound is preferably used for the purpose of heat resistance, light resistance and the like.

The silicon-containing compound means a compound comprising a silicon atom in the molecule. Examples thereof include organic materials (silicone materials) such as polyorganosiloxane, inorganic materials such as silicon oxide, silicon nitride and silicon oxynitride, and glass materials such as borosilicate, phosphosilicate and alkali silicate. Among them, silicone materials are preferable in view of easy handling and the like.

The silicone material usually indicates organic polymers having a siloxane bond as the main chain. Examples thereof include compounds represented by the general composition formula (1) and/or mixtures thereof.

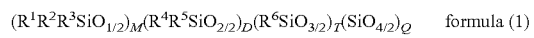

$(R^1R^2R^3SiO_{1/2})_M(R^4R^5SiO_{2/2})_D(R^6SiO_{3/2})_T(SiO_{4/2})_Q$   formula (1)

In the above formula, $R^1$ to $R^6$ can be the same as or different from each other, and are selected from the group consisting of an organic functional group, silyl groups, hydroxyl group and hydrogen atom. M, D, T and Q are a number of 0 to smaller than 1, and they satisfies $M+D+T+Q=1$.

When categorizing the silicone materials based on the curing mechanism, there may be usually mentioned silicone materials of an addition polymerization-curable type, a condensation polymerization curable type, an ultraviolet ray-curable type, a peroxide vulcanized type and the like. Of these, preferable are the addition polymerization-curable type (addition type silicone resin) and the condensation-curable type (condensing type silicone resin) and the ultraviolet ray-curable type. In the following, the addition type silicone material and the condensing type silicone material will be explained.

[1-7-1] Addition Type Silicone Material

The addition type silicone material represents a material in which the polyorganosiloxane chain is crosslinked by means of an organic additional bond. Typical example includes, for example, a compound having an Si—C—C—Si bond as the crosslinking point, which can be obtained through a reaction of a vinylsilane with a hydrosilane in the presence of an addition type catalyst such as a Pt catalyst, and the like. As such compounds, commercially available ones can be used. For example, as concrete commercial names of the addition polymerization-curable type, "LPS-1400", "LPS-2410" and "LPS-3400" and the like manufactured by Shin-Etsu Chemical Co., Ltd may be mentioned.

The above-mentioned addition type silicone material can be obtained, for example, concretely by mixing an (A) alkenyl group-containing organopolysiloxane represented by the following average composition formula (1a) and a (B) hydrosilyl group-containing organopolysiloxane represented by the following average composition formula (2a) in such a quantitative ratio that the total amount of the hydrosilyl group of (B) is 0.5 to 2.0 times relative to the total amount of the alkenyl group of (A) and reacting them in the presence of a (C) addition-reaction catalyst in a catalyst quantity.

The (A) alkenyl group-containing organopolysiloxane is an organopolysiloxane comprising at least two alkenyl groups bound to a silicon atom in one molecule, which is represented by the following composition formula (1a).

$$R_nSiO_{[(4-n)/2]} \quad (1a)$$

(In the formula (1a), R represents an identical or different substituted or unsubstituted monovalent hydrocarbon group, an alkoxy group or hydroxyl group, n is a positive number satisfying $1 \leq n < 3$, where at least one of R is an alkenyl group.)

The (B) hydrosilyl group-containing polyorganosiloxane is an organohydrogen polysiloxane comprising at least two hydrogen atoms bound to a silicon atom in one molecular, which is represented by the following composition formula (2a).

$$R'_aH_bSiO_{[(4-a-b)/2]} \quad (2a)$$

(In the formula (2a), R' represents an identical or different substituted or unsubstituted monovalent hydrocarbon group exclusive of alkenyl group, a and b are positive numbers satisfying $0.7 \leq a \leq 2.1$, $0.001 \leq b \leq 1.0$ and $0.8 \leq a+b \leq 2.6$.)

In the following, more detailed explanation will be given on the addition type silicone resin.

In the R of the above-mentioned formula (1a), the alkenyl group is preferably an alkenyl group having 2 to 8 carbon atoms, such as vinyl group, allyl group, butenyl group or pentenyl group. Further, when the R is a hydrocarbon group, it is preferably selected from monovalent hydrocarbon groups having 1 to 20 carbon atoms, such as alkyl groups such as methyl group and ethyl group, vinyl group, and phenyl group. More preferably, it is methyl group, ethyl group or phenyl group. The Rs may be the same as or different from each other. However, when UV resistance is required, it is preferable that 80% or more of the Rs is methyl group. R may be an alkoxy group having 1 to 8 carbon atoms or hydroxyl group. However, the content of the alkoxy group and the hydroxyl group is preferably 3% or less of the weight of the (A).

In the above-mentioned composition formula (1a), n is a positive number satisfying $1 \leq n < 3$. When it is 3 or larger, sufficient strength as an encapsulant cannot be achieved. When it is smaller than 1, it is difficult to synthesize this organopolysiloxane on synthesis.

The (A) alkenyl group-containing organopolysiloxane may be used as only a single kind thereof or two or more kinds thereof may be used in any combination and in any ratio.

Next, the (B) hydrosilyl group-containing polyorganosiloxane functions as a cross-linking agent for curing the composition through a hydrosilylation reaction with the (A) alkenyl group-containing organopolysiloxane.

In the composition formula (2a), R' represents a monovalent hydrocarbon group exclusive of alkenyl group. As R', the same groups as those for R in the composition formula (1a) (exclusive of alkenyl group, however) can be cited. When UV resistance is required in its application, it is preferable that at least 80% or more of the R's is methyl group.

In the composition formula (2a), a is a positive number, and is usually 0.7 or larger, preferably 0.8 or larger, and usually 2.1 or smaller, preferably 2 or smaller. In addition, b is a positive number, and is usually 0.001 or larger, preferably 0.01 or larger, and usually 1.0 or smaller. In addition, a+b is 0.8 or larger, preferably 1 or larger, and 2.6 or smaller, preferably 2.4 or smaller.

In addition, the (B) hydrosilyl group-containing polyorganosiloxane comprises at least two SiH bonds, preferably three or more SiH bonds in one molecule.

The molecular structure of the (B) hydrosilyl group-containing polyorganosiloxane may be either linear, cyclic, branched or three-dimensional network structure. There can be used one wherein the number of silicon atoms (or degree of polymerization) in one molecule is usually 3 or more and usually 1000 or less, preferably 300 or less.

The (B) hydrosilyl group-containing polyorganosiloxane may be used as only a single kind thereof or two or more kinds thereof may be used in any combination and in any ratio.

The mixing amount of the above-mentioned (B) hydrosilyl group-containing polyorganosiloxane depends on the total amount of the alkenyl groups of the (A) alkenyl group-containing organopolysiloxane. More specifically, the total amount of the SiH of the (B) hydrosilyl group-containing polyorganosiloxane may be usually 0.5 times by mol or more, preferably 0.8 times by mol or more, and usually 2.0 times by mol or less, preferably 1.5 times by mol or less, relative to the total amount of the alkenyl groups of the (A) alkenyl group-containing organopolysiloxane.

The (C) addition-reaction catalyst is a catalyst to accelerate the hydrosilylation addition reaction of the alkenyl groups in the (A) alkenyl group-containing organopolysiloxane with the SiH groups in the (B) hydrosilyl group-containing polyorganosiloxane. This (C) addition-reaction catalyst includes, for example, platinum-based catalysts such as platinum black, platinic chloride, chloroplatinic acid, reaction products of chloroplatinic acid and monohydric alcohols, complexes of chloroplatinic acid and olefins, and platinum bisacetoacetate; and platinum-group metallic catalysts such as palladium-based catalysts and rhodium-based catalysts.

The (C) addition-reaction catalyst may be used as only a single kind thereof or two or more kinds thereof may be used in any combination and in any ratio.

The mixing amount of the addition-reaction catalyst may be catalyst quantity. Usually, as a platinum-group metal, it is preferable for it to be added at 1 ppm or higher, particularly 2 ppm or higher, and 500 ppm or lower, particularly 100 ppm or lower, relative to the total weight of the (A) alkenyl group-containing organopolysiloxane and (B) hydrosilyl group-containing polyorganosiloxane.

To the composition for obtaining the addition type silicone material, an addition-reaction inhibitor for enhancing the curability and the pot life and a linear non-reactive organopolysiloxane, a linear or cyclic low-molecular-weight organopolysiloxane having about 2 to 10 silicon atoms and the like in addition to, for example, a linear diorganopolysiloxane comprising an alkenyl group for adjusting hardness and viscosity may be added as optional components, in addition to the above-mentioned (A) alkenyl group-containing organopolysiloxane, (B) hydrosilyl group-containing polyorganosiloxane and (C) addition-reaction catalyst, within an range where the advantageous effect of the present invention is not impaired.

As the addition type silicone material, any known ones can be used. Furthermore, an additive or an organic group for improving the adhesion to metals or ceramics may be introduced thereinto. Silicone materials described in Japanese Patent No. 3909826 and Japanese Patent No. 3910080 and JP-A-2003-128922, JP-A-2004-221308 and JP-A-2004-186168 are preferable, for example.

The addition type silicone material has advantages that it forms no elimination components at curing and is difficult to contract with curing, a curing catalyst common to the case of the composition of the invention, such as platinum, can be used, and freedom in the selection of the refractive index and hardness of the cured product by molecular design and the selection of the curing rate by catalyst design is high. The mixture of the addition type silicone and the composition of the invention can afford a composition having excellent heat resistance, UV resistance and adhesion derived from the composition of the invention and also the above-mentioned advantages of the addition type silicone.

[1-7-2] Condensing Type Silicone Material

Examples of the condensing type silicone material include, for example, a compound having an Si—O—Si bond at the crosslinking point, which is obtained through hydrolysis and polycondensation of an alkylalkoxysilane.

Concrete examples include polycondensates obtained by performing hydrolysis and polycondensation of the compounds represented by the following general formulae (1b) and/or (2b), and/or oligomers thereof

$$M^{m+}X_n Y^1_{m-1} \quad (1b)$$

(In the formula (1b), M represents at least one element selected from silicon, aluminum, zirconium and titanium, X represents a hydrolyzable group, $Y^1$ represents a monovalent organic group, m represents an integer of 1 or larger representing the valence of M, and n represents an integer of 1 or larger representing the number of X groups, where m≥n.)

$$(M^{s+}X_t Y^1_{s-t-1})_u Y^2 \quad (2b)$$

(In the formula (2b), M represents at least one element selected from silicon, aluminum, zirconium and titanium, X represents a hydrolyzable group, $Y^1$ represents a monovalent organic group, $Y^2$ represents a u-valent organic group, s represents an integer of 1 or larger representing the valence of M, t represents an integer of 1 or larger and s−1 or smaller, and u represents an integer of 2 or larger.)

As the curing catalyst, a metal chelate compound or the like can be used preferably, for example. The metal chelate compound preferably comprises at least one of Ti, Ta, Zr, Hf, Zn and Sn. It more preferably contains Zr.

As the condensing type silicone material, any known ones can be used. For example, semiconductor light-emitting device members described in JP-A-2006-77234, JP-A-2006-291018, JP-A-2006-316264, JP-A-2006-336010, JP-A-2006-348284, and WO 2006/090804 pamphlet are preferably used.

The condensing type silicone material has advantages that it is excellent in heat resistance/light resistance and adhesion and freedom in the selection of the refractive index and hardness of the cured product by molecular design is high. The mixture of the condensing type silicone and the composition of the invention can afford a composition having excellent heat resistance, UV resistance and adhesion derived from the composition of the invention and also the above-mentioned advantages of the condensing type silicone.

[2] Polysiloxane Cured Product

The polysiloxane cured product of the invention is obtained by curing the curable polysiloxane composition of the invention. In the following, the properties will be described.

[2-1] Refractive Index

With regard to the refractive index of the polysiloxane cured product of the invention, the refractive index of light having a wavelength of 589 nm at a temperature of the polysiloxane cured product of the invention of 20° C. is usually 1.55 or less, preferably 1.42 or less, further preferably 1.419 or less, particularly preferably 1.418 or less and usually 1.35 or more, preferably 1.40 or more. In the case of the application to an optical member, the refractive index of a general light-emitting device is about 2.5 or less but, in the invention, it is preferred to select one having a relatively low refractive index from the viewpoint of light stability of a resin. When the above refractive index is too large and is more than the refractive index of a light-emitting device, there is a possibility that the efficiency of extracting light is not improved. Furthermore, when the refractive index is too small, for example, there is a possibility that the efficiency of extracting light is not improved as compared with an existing semiconductor light-emitting device member.

The refractive index of the polysiloxane cured product of the invention can be usually measured by a refractometer.

Specifically, an Abbe refractometer (using sodium D line (589 nm)) can be employed using a singly/independently cured product film with a smooth surface, which is formed into a film thickness of 1 mm or more, as a sample.

[2-2] Transmittance

The polysiloxane cured product of the invention preferably has light transmittance, over the whole wavelengths of 400 nm or more and 800 nm or less, of usually 80% or more, preferably 90% or more, and further preferably 95% or more at a film thickness of 1 mm.

[2-3] Other Physical Properties

The polysiloxane cured product of the invention has the above-mentioned major properties, but it is preferable that it has also additional structures and properties described in the following.

[2-3-1] Basic Skeleton

The basic skeleton of the polysiloxane cured product of the invention is usually a metalloxane skeleton, and preferably an inorganic siloxane skeleton (siloxane bond) the same as glasses (silicate glasses) and the like. As is evident from Table 1 below, which is a comparison table of chemical bonds, a siloxane bond has the following superior features when the polysiloxane cured product is used in the application of an optical member and the like.

(I) The light resistance is superior because the bond energy is large and thus pyrolysis and photolysis rarely occur.

(II) It is electrically polarized slightly.

(III) The chain structure thereof has a high degree of freedom, leading to a highly flexible structure and free rotation about the siloxane chain.

(IV) The degree of oxidation is large, so that further oxidization is not occurred.

(V) It is rich in electrical insulating properties.

TABLE 1

Chemical Bond Comparison Table

| Bond | Bond distance (Å) | Bond energy (kcal/mol) | Bond angle (°) |
|---|---|---|---|
| Si—O—Si | 1.64 | 108 | 130 to 160 |
| C—O—C | 1.43 | 86 | 110 |
| C—C—C | 1.54 | 85 | 109 |

From these features, it can be understood that a polysiloxane cured product based on silicone, which is formed by a skeleton in which siloxane bonds are connected three-dimensionally with a high degree of crosslinking, can become a protective film that is similar to minerals such as glasses and rocks and excellent in heat resistance and light resistance, in contrast to an epoxy resin. Particularly, a silicone-based polysiloxane cured product comprising a methyl group as its substituent is superior in light resistance, because such a polysiloxane cured product does not have absorption in the ultraviolet region and therefore photolysis is unlikely to occur.

The silicon content of the polysiloxane cured product of the invention is usually 20% by weight or more, preferably 25% by weight or more and more preferably 30% by weight or more. On the other hand, the upper limit thereof is usually a range of 47% by weight or less, because the silicon content of a glass that consists of $SiO_2$ is 47% by weight. Meanwhile, when the polysiloxane cured product is intended to be high in refractive index, the above content is usually 10% by weight or more and 47% by weight or less, since a component necessary for the higher refractive index may be contained.

The silicon content of the polysiloxane cured product can be calculated based on the result of inductively coupled plasma spectrometry (hereinafter abbreviated as "ICP" when appropriate) analysis according to, for example, the method described below.

[Measurement of Silicon Content]

The polysiloxane cured product is ground to pieces of about 100 μm and kept in a platinum crucible in air at 450° C. for 1 hour, then at 750° C. for 1 hour and at 950° C. for 1.5 hours for baking. After removal of carbon components, the small amount of residue obtained is added with a 10-fold amount or more of sodium carbonate, and then heated by a burner to melt it. Then, the melted product is cooled, followed by adding desalted water, being diluted to several ppm in terms of silicon, while adjusting pH value to around neutrality with hydrochloric acid. Thereafter, ICP analysis is performed.

[2-3-2] UV Transmittance

The polysiloxane cured product of the present invention preferably has light transmittance, with respect to the emission wavelength of a semiconductor light-emitting device, of usually 80% or more, further 85% or more, and still further 90% or more at a film thickness of 1.0 mm, when used as an optical member for a semiconductor light-emitting device. The efficiency of extracting light in the semiconductor light-emitting device is enhanced by various technologies. However, if the transparency of a translucent member for encapsulating a semiconductor light-emitting element or holding a phosphor is low, the luminance of a semiconductor light-emitting device using the same will be reduced, making it difficult to obtain a high-luminance semiconductor light-emitting device product.

In this context, a "emission wavelength of a semiconductor light-emitting device" varies depending on the type of semiconductor light-emitting device, but it generally refers to wavelengths in a range of usually 300 nm or longer, preferably 350 nm or longer, and usually 900 nm or shorter, preferably 500 nm or shorter. If the light transmittance is low with respect to the wavelengths in this range, the polysiloxane cured product absorbs the light and the efficiency of extracting light decreases, making it impossible to obtain a high-luminance semiconductor light-emitting device. Furthermore, such a low light transmittance is undesirable because energy for the reduced efficiency of extracting light is converted into heat, leading to the thermal degradation of the semiconductor light-emitting device.

Incidentally, encapsulating members tend to degrade due to light in the ultraviolet to blue region (wavelength: 300 nm to 500 nm). Therefore, it is preferable since the advantageous effect is enhanced when the polysiloxane cured product superior in durability is used for a semiconductor light-emitting device having its emission wavelength in this region.

The light transmittance of the polysiloxane cured product can be measured with an ultraviolet spectrophotometer by, for example, a technique described below, using a sample of singly cured product film with a smooth surface, which is formed into a thickness of 1 mm.

[Measurement of Transmittance]

The transmittance is measured using a singly cured product film of the polysiloxane cured product of about 1 mm in thickness with a smooth surface and without scatterings owing to defects or unevenness, using an ultraviolet spectrophotometer (UV-3100, manufactured by Shimadzu Corporation) in the wavelengths of 200 nm to 800 nm.

The shape of the semiconductor light-emitting device is diverse, but mostly it is used in a thick-film state having thickness exceeding 0.1 mm. However, it is sometimes used as a thin film, in such cases as providing a thin-film phosphor layer (for example, a layer comprising nanometer-size phosphor particles or fluorescent ions, having thickness of several μm) at the position apart from the LED chip (light-emitting element) or providing a high refractive-index light extracting film on a thin film right above the LED chip. In such cases, it is preferable that the film with this thickness shows a transmittance of 80% or more. Even in the application form of such a thin-film, the polysiloxane cured product of the invention shows excellent light resistance, heat resistance and is excellent in encapsulating performance, as well as can be formed into a film steadily without generating cracks or the like.

[2-3-3] Peak Area Ratio

The polysiloxane cured product of the invention preferably satisfies the following condition. That is, in the polysiloxane cured product of the invention, the ratio of (total area of peaks of the chemical shift of −40 ppm or more and 0 ppm or less)/(total area of peaks of the chemical shift of less than −40 ppm) in a solid Si-nuclear magnetic resonance spectrum (hereinafter referred to as "peak area ratio according to the invention" when appropriate) is usually 3 or more, preferably 5 or more, and still preferably 10 or more, and usually 200 or less, preferably 100 or less, and still preferably 50 or less.

That the peak area ratio according to the invention falls within the above range means that the polysiloxane cured product of the invention comprises more bifunctional silanes than silanes of trifunctional or more, such as trifunctional silanes and tetrafunctional silanes. By comprising more bifunctional silanes, as described above, the polysiloxane cured product of the invention can present elastomer properties and thus the stress can be relieved.

However, the polysiloxane cured product of the invention may present elastomer properties even without satisfying the above-mentioned condition of the peak area ratio according to the invention. This is a case when, for example, the polysiloxane cured product of the invention is produced by using, as a crosslinking agent, a coupling agent such as an alkoxide of a metal excluding silicon. The technique used for making the polysiloxane cured product of the invention present elastomer properties is arbitrary and is not limited to the above-mentioned condition with respect to the peak area ratio according to the invention.

[2-3-4] Functional Group

The polysiloxane cured product of the invention may have a functional group capable of forming a hydrogen bond with a predetermined functional group (for example, hydroxyl group or an oxygen in metalloxane bond) that is present on the surface of a resin such as polyphthalamide, a ceramic or a metal. A container for a semiconductor light-emitting device (such as a cup described later, hereinafter referred to as "container of semiconductor light-emitting device" as appropriate) is usually formed of a ceramic or a metal. Also, a hydroxyl group usually exists on the surface of a ceramic and a metal. Thus, for the purpose of securing adhesion, the polysiloxane cured product may have a functional group capable of forming a hydrogen bond with the hydroxyl group. However, as mentioned above, in the curable polysiloxane of the invention, it is preferred for the curable polysiloxane composition of the invention that, among all the substituents bound to the silicon atom of the siloxane compounds contained in the curable polysiloxane composition, 80 mol % or more, preferably 95 mol % or more, further preferably 99 mol % or more of the substituent excluding the hydride group and the silanol group are an alkyl group. Moreover, the alkyl group is preferably methyl group.

Among all the substituents bound to the silicon atom of the siloxane compound, the molar fraction of the substituent excluding the hydride group and the silanol group can be calculated as molar percentage by (molar ratio calculated from total area of peaks of alkyl groups bound to a silicon atom of siloxane compound)/(molar ratio calculated from total area of peaks of all substituents (excluding hydride group and hydroxyl group) bound to a silicon atom of siloxane compound) from the measured spectrum using liquid H-nuclear magnetic resonance spectrum, solid H-nuclear magnetic resonance spectrum, solid Si-nuclear magnetic resonance spectrum, or a complementary combination thereof.

In the substituents $R^1$ to $R^{20}$ of the above general formulae (1), (2), and (3), it is preferable that 80 mol % or more, preferably 95 mol % or more, further preferably 99 mol % of the substituents excluding the hydride group and the hydroxyl group are an alkyl group, so that the content of the functional group capable of forming a hydrogen bond with that hydroxyl group preferably falls within the range.

Examples of the functional group capable of forming a hydrogen bond with the hydroxyl group, which is possessed by the polysiloxane cured product of the invention, include, for example, a silanol group, an alkoxy group, an amino group, an imino group, a methacryl group, an acryl group, a thiol group, an epoxy group, an ether group, a carbonyl group, a carboxyl group, a sulfonate group and the like. Of these, a silanol group and an alkoxy group are preferable from the viewpoint of heat resistance. In this regard, one type of the functional group or two or more types of the functional groups may be used.

Whether the polysiloxane cured product of the invention has any functional group capable of forming a hydrogen bond with the hydroxyl group, as described above, can be checked by a spectroscopic technique such as solid Si—NMR, solid $^1$H-NMR, infrared resonance spectrum (IR), Raman spectrum or the like.

[2-3-5] Heat Resistance

The polysiloxane cured product of the invention is excellent in heat resistance. That is, the polysiloxane cured product has a property that transmittance thereof with respect to light having a predetermined wavelength hardly varies even when left under a high temperature condition. More specifically, the maintenance rate of transmittance of the polysiloxane cured product of the invention with respect to the light having a wavelength of 400 nm before and after being kept for 500 hours at temperature of 200° C. is usually 80% or more, preferably 90% or more and more preferably 95% or more, and usually 110% or less, preferably 105% or less and more preferably 100% less.

The above ratio of variation can be measured in the same way as the method of measuring the UV transmittance, described earlier in [2-3-2], by means of measuring transmittance using an ultraviolet/visible spectrophotometer.

[2-3-6] UV Resistance

The polysiloxane cured product of the invention is excellent in light resistance. That is, the polysiloxane cured product of the invention has a property that transmittance thereof with respect to the light having a predetermined wavelength hardly varies even when irradiated with UV (ultraviolet light). More specifically, the maintenance rate of transmittance of the polysiloxane cured product of the invention with respect to the light having a wavelength of 400 nm before and after being irradiated with light whose central wavelength is 380 nm and radiant intensity is 0.4 kW/m$^2$ for 72 hours is usually 80% or more, preferably 90% or more and more preferably 95% or more, and usually 110% or less, preferably 105% or less and more preferably 100% or less.

The above ratio of variation can be measured in the same way as the method of measuring the UV transmittance, described earlier in [2-3-2], by means of measuring transmittance using an ultraviolet/visible spectrophotometer.

[2-3-7] Residual Amount of Catalyst

The polysiloxane cured product of the invention is usually produced using curing catalysts. Therefore, usually in the polysiloxane cured product of the invention, these catalysts are remained. Specifically, the polysiloxane cured product of the invention comprises the above-mentioned curing catalysts in an amount of usually 0.001% by weight or more, preferably 0.01% by weight or more and more preferably 0.02% by weight or more, and usually 0.3% by weight or less, preferably 0.2% by weight or less and more preferably 0.1% by weight or less, in terms of a metal element.

The above-mentioned content of the curing catalyst can be measured by ICP analysis.

[2-3-8] Low-boiling Component

It is preferable for the polysiloxane cured product of the invention that the integrated area of chromatogram, in TG-mass (pyrolytic MS chromatogram), of the gas generated by heating at the range of 40° C. to 210° C. is small.

TG-mass detects low-boiling components in the polysiloxane cured product by heating the polysiloxane cured product. A large integrated area of chromatogram in the range of 40° C. to 210° C. indicates that low-boiling components such as water, solvent and three-membered to five-membered cyclic siloxanes are present in the component. In such a case, there are such possibilities that (i) the large amount of low-boiling components induces occurrence or bleed-out of air bubbles in the process of using the cured product, thereby lowering the adhesion to the container of semiconductor light-emitting device, and (ii) a heat generated during use induces occurrence or bleed-out of air bubbles. Thus, it is preferable for the polysiloxane cured product of the invention to comprise less low-boiling components.

As methods for suppressing the amount of above-mentioned low-boiling components to be detected by TG-mass to a low level in the polysiloxane cured product of the invention, for example, the following methods may be mentioned.
(i) Inhibiting the unreacted low-molecular-weight raw materials from remaining by carrying out the polymerization curing reaction sufficiently.
(ii) Removing the low-boiling components efficiently in processes other than the reaction processes such as the polymerization reaction.

For example, it corresponds to the removal of the low-boiling components in the raw material beforehand. Specifically, it is to perform, with respect to each raw material component before polymerization, a process for removing the low-boiling components by distillation, for example, at usually 60° C. or higher, preferably 80° C. or higher and more preferably 100° C. or higher, and usually 150° C. or lower, preferably 130° C. or lower and more preferably 120° C. or lower, under a pressure of 100 mmHg or lower, preferably 20 mmHg or lower.

[2-3-9] Hardness

The polysiloxane cured product of the invention is preferably a member presenting elastomer properties. An optical member of a semiconductor light-emitting device or the like generally uses a plurality of members whose thermal expansion coefficients are different in many cases but the elastomer properties presented by the polysiloxane cured product of the invention can relieve stress caused by expansion and shrinkage of the members to be used in the optical member. Therefore, a semiconductor device that is resistant to a peeling, crack, and breaking of wire while in use and superior in reflow resistance and temperature cycling resistance can be provided.

More specifically, the measurement value of hardness (Shore A) by durometer type A, of the polysiloxane cured product, is usually 5 or larger, preferably 7 or larger, and still preferably 10 or larger, and usually 90 or smaller, preferably 80 or smaller, and still preferably 70 or smaller. With the measurement value of hardness in the above range being provided, the optical member of the invention can obtain such advantages as being more resistant to cracks and being superior in reflow resistance and temperature cycling resistance.

The above measurement value of hardness (Shore A) can be measured according to a method described in JIS K6253. More specifically, the measurement can be made using an A-type rubber hardness tester manufactured by Kori Seiki MFG. Co., Ltd.

[2-3-10] Combined Use with Other Members

The polysiloxane cured product of the invention may be used as an encapsulant singly. However, in the uses requiring more strict cutoff of oxygen or moisture, for example, in the case where it encapsulates an organic phosphor, a phosphor that is liable to deteriorate by oxygen or moisture, or a semiconductor light-emitting device, retention of the phosphor, encapsulating the semiconductor light-emitting element or extracting light is carried out with the polysiloxane cured product of the invention and further, an air-tight encapsulating with a highly air-tight material such as a glass plate or an epoxy resin may be carried out in the outer side of them, or vacuum encapsulating may be performed. In this case, the shape is not specially limited and it is enough that the encapsulated body, coating or coated surface by the polysiloxane cured product of the invention is substantially protected and blocked from outside by an air-tight material such as a metal, glass or highly air-tight resin, so as to allow no passage of oxygen and moisture.

In addition, the polysiloxane cured product of the invention may be used as an adhesive agent for a semiconductor light-emitting device because it is excellent in adhesion as described above. More specifically, for example, the polysiloxane cured product of the invention can be used in the cases of bonding a semiconductor element and a package, a semiconductor element and a sub mount, package constituents each other, a semiconductor light-emitting device and an external optical element, by means of application, printing or potting the polysiloxane cured product. Since the polysiloxane cured product of the invention is excellent particularly in light resistance and heat resistance, it provides a semiconductor light-emitting device with high reliability enough to stand a long-time use, when it is used as an adhesive for a high-power semiconductor light-emitting device that is exposed to high temperature or ultraviolet rays for a long time.

The polysiloxane cured product of the invention can achieve sufficient adhesion just by itself. However, for the purpose of securing more sufficient adhesion, surface treatments for improving adhesion may be performed on the surface that will come directly in contact with the polysiloxane cured product. Examples of such surface treatment include, for example: a formation of an adhesion-improving layer using a primer or a silane coupling agent, a chemical surface treatment using a chemical agent such as an acid or an alkali, a physical surface treatment using plasma irradiation, ion irradiation or electron beam irradiation, a surface-roughening treatment by sandblasting, etching, microparticles coating or the like. Other examples of the surface treatment include, for example, known surface treatment methods disclosed in JP-A-5-25300, "Hyomen Kagaku", Vol. 18 No. 9, pp 21-26, written by Norihiro Inagaki, "Hyomen Kagaku", Vol. 19 No. 2, pp 44-51 (1998), written by Kazuo Kurosaki, and the like.

[2-3-11] Others

There is no limitation on the shape and the dimension of the polysiloxane cured product of the invention, and they can be decided arbitrarily. For example, when the polysiloxane cured product is used as an encapsulant with which the inside of a certain container of a semiconductor light-emitting device is filled, the shape and the dimension of the polysiloxane cured product of the invention are decided according to the shape and the dimension of the container of the semiconductor light-emitting device. Moreover, when the polysiloxane cured product is formed on the surface of a certain substrate, it is often formed into a film shape, and the dimension thereof is set arbitrarily depending on its use. Also when the polysiloxane cured product of the invention is used for an optical guide plate or a member for aerospace industry, any shape can be used arbitrarily according to the site to be applied.

However, one of the advantageous effects of the polysiloxane cured product of the invention is that it can be formed into a thick film when it is formed into a film shape. Optical members hitherto used are difficult in forming them into thick films, due to occurrence of cracks or the like caused by an internal stress or the like but, there are no such problems in the polysiloxane cured product of the invention and it can be formed into a thick film steadily. Regarding its specific range, it is preferable for the polysiloxane cured product of the invention to be formed with thickness of usually 0.1 µm or larger, preferably 10 µm or larger and more preferably 100 µm or larger. There is no limitation on the upper limit thereof, but it is usually 10 mm or smaller, preferably 5 mm or smaller and more preferably 1 mm or smaller. In this context, when the thickness of the film is not uniform, the "thickness of the film" indicates the thickness of the film at its thickest portion.

In addition, the polysiloxane cured product of the invention can usually encapsulate a semiconductor light-emitting device for a longer period of time than conventional ones without generating cracks or peelings. More specifically, when a semiconductor light-emitting device is encapsulated with the polysiloxane cured product of the invention and the semiconductor light-emitting device is illuminated in a continuous manner at temperature of 85° C. and relative humidity of 85% with usually 20 mA or more, preferably 350 mA or more of driving current, the luminance after usually 500 hours or longer, preferably 1000 hours or longer, more preferably 2000 hours or longer is not decreased as compared with that of just after switched on.

The polysiloxane cured product may comprise other components, depending on its use. For example, when the polysiloxane cured product of the invention is used as a constituent member of a semiconductor light-emitting device or the like, it may comprise a phosphor, inorganic particles or the like. Explanation will be given on this point later, together with an explanation on the use.

The other components may be used as only a single kind thereof or two or more kinds thereof may be used in any combination and in any ratio.

[3] Production Method of Polysiloxane Composition and Polysiloxane Cured Product The curable polysiloxane composition of the invention is obtained by mixing the above-mentioned hydrosilyl group-containing polysiloxane compound represented by the general formula (1), the above-mentioned polysiloxane compound represented by the general formula (2) and comprising two or more silanol groups in one molecule and the above-mentioned curing catalyst and, if necessary, the other additive(s). The mixing method is not particularly limited.

In another embodiment of the invention, the curable polysiloxane composition of the invention is obtained by mixing the above-mentioned hydrosilyl group-containing polysiloxane compound represented by the general formula (1), the above-mentioned polysiloxane compound represented by the general formula (2) and comprising two or more silanol groups in one molecule, the above-mentioned polysiloxane compound represented by the general formula (3) and comprising two or more alkenyl groups in one molecule, and the dehydrogenative condensation reaction catalyst and the addition condensation catalyst and, if necessary, the other additive(s). The mixing method is not particularly limited. When the composition is heated to cure, the dehydrogenative condensation reaction of (1) and (2) and the addition polymerization reaction of (1) and (3) simultaneously proceed. When the total amount of the silanol group in the composition is larger than the sum of the alkenyl group and the hydrosilyl group, the resulting cured product is a polysiloxane comprising a silanol group and excellent in adhesion. The dehydrogenative condensation reaction catalyst and the addition polymerization catalyst may be used separately but a catalyst possessing functions of a dehydrogenative condensation reaction catalyst and a addition polymerization catalyst, such as a platinum-based catalyst, may be used as a single kind.

Moreover, the method for producing the polysiloxane cured product of the invention is not limited as far as it has a process of curing the curable polysiloxane composition of the invention. When the polycondensate comprises a solvent, the solvent may be removed by distillation in advance before drying.

The polysiloxane cured product of the invention is usually cured under air at the temperature of 150° C. within 6 hours. In carrying out the invention, the following will describe preferable curing conditions in detail.

The curing treatment is performed in the range of usually 15° C. or higher, preferably 50° C. or higher, and more preferably 100° C. or higher, and usually 300° C. or lower, preferably 200° C. or lower, and more preferably 170° C. or lower in the case of performing under normal pressure. By maintaining a liquid phase under an elevated pressure, it is also possible to perform the treatment at a higher temperature.

The curing time varies depending on the reaction temperature but is performed in the range of usually 0.1 hour or longer, preferably 0.5 hour or longer, and further preferably 0.8 hour or longer, and usually 100 hours or shorter, more preferably 20 hours or shorter, and further preferably 15 hours or shorter.

In the above-mentioned curing conditions, when the time is short or the temperature is too low, there is a possibility that the strength of the cured product becomes insufficient owing to insufficient polymerization. When the time is long or the temperature is too high, the molecular weight of the curable polysiloxane composition increases and curing proceeds exceedingly fast to make the structure of the cured product nonuniform, so that cracks are apt to occur. Furthermore, from the standpoint of consumption of energy, economical efficiency becomes poor. Based on the above tendencies, it is desirable to appropriately select the conditions depending on desired physical properties.

When a solvent is used in the mixing process of raw materials, it is preferable to remove the solvent by distillation from the curable polysiloxane composition (solvent distillation process) usually before or during the above-mentioned curing treatment (polymerization process). Thereby, the curable polysiloxane composition comprising no solvent (liquid semipolycondensate) can be obtained, which can be subjected to the polymerization as it is.

A method of removing the solvent by distillation is arbitrary unless the advantages of the invention are remarkably impaired. However, it is suitable to avoid removing the solvent by distillation at a temperature equal to or higher than the decomposition start temperature of the curable polysiloxane composition.

Specific range of the temperature condition at the removal of the solvent by distillation is usually 60° C. or higher, preferably 80° C. or higher, and more preferably 100° C. or higher, and usually 450° C. or lower, preferably 300° C. or lower, and more preferably 200° C. or lower. When the temperature is lower than the lower limit of the range, there is a possibility that the removal of the solvent by distillation becomes insufficient and when the temperature is higher than the upper limit, there is a possibility that the curable polysiloxane composition is gelled.

Moreover, the pressure condition at the removal of the solvent by distillation is usually normal pressure. Further, if necessary, the pressure is reduced so that the boiling point of the reaction solution at the removal of the solvent by distillation does not reach the decomposition start temperature. Also, the lower limit of the pressure is around a pressure at which a main component of the curable polysiloxane composition is not removed by distillation.

When the polysiloxane cured product of the invention is used as a semiconductor light-emitting device and also is heated together with the semiconductor light-emitting device, curing is preferably performed usually at a temperature equal to or lower than the heat-resistant temperature of the components of the semiconductor light-emitting device, preferably at a temperature of 200° C. or lower. Moreover, in the invention, as mentioned above, curing is possible at such a relatively low temperature as about 150° C. or lower, so that curing is preferably performed at 150° C. or lower in the case where stabilization of the components of the semiconductor light-emitting device, particularly a semiconductor light-emitting element and a phosphor is intended.

[3-5] Others

After the aforementioned polymerization process, various types of post-treatments may be performed on the resultant polysiloxane cured product, if necessary. Examples of the post-treatment include a surface treatment for improving the adhesion to the mold parts, preparation of antireflection film, preparation of a fine uneven surface for improving the efficiency of extracting light, and the like.

[4] Optical Member

The polysiloxane cured product of the invention is not particularly limited in its use and can be suitably used for various optical members owing to its excellency in various properties such as light transmittance (transparency), light resistance, heat resistance, hydrothermal resistance, UV resistance, and little-foaming property. Specific examples of the use of the optical members comprising the polysiloxane cured product of the invention include semiconductor light-emitting devices, optical guide plates, members for aerospace industry, and the like.

The optical member comprising the polysiloxane cured product of the invention may be used with appropriately determining its shape, degree of transparency, and the like, depending on the use of the optical member, or the other compound such as a phosphor or an inorganic particle may be used in combination. When these other compounds are used in combination, they may be mixed into the curable polysiloxane composition and the resultant mixture may be used, for example.

For example, when the optical member of the invention is used as a member (encapsulant) for encapsulating a semiconductor light-emitting element or the like of a semiconductor light-emitting device, the optical member can be more suitably used for specific use by using a phosphor particle and/or an inorganic particle in combination. In the following, such combined uses of a phosphor particle and an inorganic particle will be described.

[4-1] Phosphor

In the case where the polysiloxane cured product of the invention is used as an optical member, for example, the polysiloxane cured product of the invention can be used as a member for wavelength conversion by dispersing a phosphor in the polysiloxane cured product of the invention, which is molded inside a cup of a semiconductor light-emitting device as described below or applied as a thin film on an appropriate transparent support.

One kind of phosphor may be used singly or two or more kinds thereof may be used in any combination and in any ratio.

[4-1-1] Kind of Phosphor

There is no special limitation on the composition of the phosphor. Preferable one are those in which a host crystal such as a metal oxide represented by $Y_2O_3$, $Zn_2SiO_4$ or the like, a phosphate represented by $Ca_5(PO_4)_3Cl$ or the like, and a sulfide represented by ZnS, SrS, CaS or the like is combined with an ion of a rare earth metal such as Ce, Pr, Nd, Pm, Sm, Eu, Tb, Dy, Ho, Er, Tm or Yb, or an ion of a metal such as Ag, Cu, Au, Al, Mn or Sb as an activator or coactivator.

Preferable examples of the host crystal include, for example, sulfides such as (Zn,Cd)S, $SrGa_2S_4$, SrS and ZnS; oxysulfides such as $Y_2O_2S$; aluminate such as $(Y,Gd)_3Al_5O_{12}$, $YAlO_3$, $BaMgAl_{10}O_{17}$, $(Ba,Sr)(Mg,Mn)Al_{10}O_{17}$, $(Ba,Sr,Ca)(Mg,Zn,Mn)Al_{10}O_{17}$, $BaAl_{12}O_{19}$, $CeMgAl_{11}O_{19}$, $(Ba,Sr,Mg)O\cdot Al_2O_3$, $BaAl_2Si_2O_8$, $SrAl_2O_4$, $Sr_4Al_{14}O_{25}$ and $Y_3Al_5O_{12}$; silicate such as $Y_2SiO_5$ and $Zn_2SiO_4$; oxides such as $SnO_2$ and $Y_2O_3$; borate such as $GdMgB_5O_{10}$ and $(Y,Gd)BO_3$; halophosphate such as $Ca_{10}(PO_4)_6(F,Cl)_2$ and $(Sr,Ca,Ba,Mg)_{10}(PO_4)_6O_2$; phosphate such as $Sr_2P_2O_7$ and $(La,Ce)PO_4$.

No particular limitation is imposed on the element composition of the above host crystal and activator or coactivator. Partial substitution with the element of the same group is possible. Any phosphor obtained can be used as far as it absorbs light in the near ultraviolet to visible region and emits visible light.

More concretely, those listed below can be used as the phosphor. The list shown below serves just as an example and phosphors that can be used in the present invention are not limited to these examples. In the following examples, phosphors different in only part of the structure are shown abbreviated for the sake of convenience. For example, "$Y_2SiO_5:Ce^{3+}$", "$Y_2SiO_5:Tb^{3+}$" and "$Y_2SiO_5:Ce^{3+},Tb^{3+}$" are combined to refer to as "$Y_2SiO_5:Ce^{3+},Tb^{3+}$", and "$La_2O_2S:Eu$", "$Y_2O_2S:Eu$" and "$(La,Y)_2O_2S:Eu$" are combined to refer to as "$(La,Y)_2O_2S:Eu$". Abbreviated part is indicated by comma-separation.

[4-1-1-1] Red Phosphor

An example of the specific wavelength range of fluorescence emitted by a phosphor which emits red fluorescence (hereinafter referred to as "red phosphor" when appropriate) is preferably such that the peak wavelength thereof is usually 570 nm or longer, preferably 580 nm or longer, and usually 700 nm or shorter, preferably 680 nm or shorter.

Examples of such a red phosphor include, for example, europium-activated alkaline earth silicon nitride phosphors represented by $(Mg,Ca,Sr,Ba)_2Si_5N_8:Eu$, which are constituted by fractured particles having red fractured surfaces and emit light in the red region, europium-activated rare earth oxychalcogenide phosphors represented by $(Y,La,Gd,Lu)_2O_2S:Eu$, which are constituted by growing particles having nearly spherical shapes typical of regular crystal growth and emit light in the red region, and the like.

Also applicable in the present embodiment are phosphors, which are described in JP-A-2004-300247, comprising an oxynitride and/or an oxysulfide comprising at least one element selected from the group consisting of Ti, Zr, Hf, Nb, Ta, W and Mo, and also comprising an oxynitride having an α-sialon structure in which all or part of Al element is replaced by Ga element. These are phosphors comprising oxynitride and/or oxysulfide.

In addition, applicable as the red phosphor other than the above are: Eu-activated oxysulfide phosphors such as $(La,Y)_2O_2S:Eu$; Eu-activated oxide phosphors such as $Y(V,P)O_4:Eu$ and $Y_2O_3:Eu$; Eu,Mn-activated silicate phosphors such as $(Ba,Sr,Ca,Mg)_2SiO_4:Eu,Mn$ and $(Ba,Mg)_2SiO_4:Eu,Mn$; Eu-activated sulfide phosphors such as $(Ca,Sr)S:Eu$; Eu-activated aluminate phosphors such as $YAlO_3:Eu$; Eu-activated silicate phosphors such as $LiY_9(SiO_4)_6O_2:Eu$, $Ca_2Y_8(SiO_4)_6O_2:Eu$, $(Sr,Ba,Ca)_3SiO_5:Eu$ and $Sr_2BaSiO_5:Eu$; Ce-activated aluminate phosphors such as $(Y,Gd)_3Al_5O_{12}:Ce$ and $(Tb,Gd)_3Al_5O_{12}:Ce$; Eu-activated nitride phosphors such as $(Ca,Sr,Ba)_2Si_5N_8:Eu$, $(Mg,Ca,Sr,Ba)SiN_2:Eu$ and $(Mg,Ca,Sr,Ba)AlSiN_3:Eu$; Ce-activated nitride phosphors such as $(Mg,Ca,Sr,Ba)AlSiN_3:Ce$; Eu,Mn-activated halophosphate phosphors such as $(Sr,Ca,Ba,Mg)_{10}(PO_4)_6Cl_2:Eu,Mn$; Eu,Mn-activated silicate phosphors such as $(Ba_3Mg)Si_2O_8:Eu,Mn$ and $(Ba,Sr,Ca,Mg)_3(Zn,Mg)Si_2O_8:Eu,Mn$; Mn-activated germanate phosphors such as $3.5MgO\cdot 0.5MgF_2\cdot GeO_2:Mn$; Eu-activated oxynitride phosphors such as Eu-activated α-sialon; Eu,Bi-activated oxide phosphors such as $(Gd,Y,Lu,La)_2O_3:Eu,Bi$; Eu,Bi-activated oxysulfide phosphors such as $(Gd,Y,Lu,La)_2O_2S:Eu,Bi$; Eu,Bi-activated vanadate phosphors such as $(Gd,Y,Lu,La)VO_4:Eu,Bi$; Eu, Ce-activated sulfide phosphors such as $SrY_2S_4:Eu$, Ce; Ce-activated sulfide phosphors such as $CaLa_2S_4:Ce$; Eu,Mn-activated phosphate phosphors such as $(Ba,Sr,Ca)MgP_2O_7:Eu,Mn$ and $(Sr,Ca,Ba,Mg,Zn)_2P_2O_7:Eu,Mn$; Eu,Mo-activated tungstate phosphors such as $(Y,Lu)_2WO_6:Eu,Mo$; Eu, Ce-activated nitride phosphors such as $(Ba,Sr,Ca)_xSi_yN_z:Eu,Ce$ (x,y,z being an integer of 1 or larger); Eu,Mn-activated halophosphate phosphors such as $(Ca,Sr,Ba,Mg)_{10}(PO_4)_6(F,Cl,Br,OH):Eu,Mn$; Ce-activated silicate phosphors such as $((Y,Lu,Gd,Tb)_{1-x}Sc_xCe_y)_2(Ca,Mg)_{1-r}(Mg,zn)_{2+r}Si_{z-q}Ge_qO_{12+\delta}$; and the like.

Also applicable as the red phosphor are: red organic phosphors comprising rare earth element ion complexes comprising anions such as β-diketonates, β-diketones, aromatic carboxylic acids or Broensted acids as ligands, perylene pigments (for example, dibenzo {[f,f']-4,4',7,7'-tetraphenyl}diindeno[1,2,3-cd:1',2',3'-1m]perylene), anthraquinone pigments, lake pigments, azo pigments, quinacridone pigments, anthracene pigments, isoindoline pigments, isoindolinone pigments, phthalocyanine pigments, triphenylmethane-based basic dyes, indanthrone pigments, indophenol pigments, cyanine pigments and dioxazine pigments.

Also, among red phosphors, those whose peak wavelength is 580 nm or longer, preferably 590 nm or longer, and 620 nm or shorter, preferably 610 nm or shorter can be suitably used as an orange phosphor. Examples of such orange phosphors include: $(Sr,Ba)_3SiO_5:Eu$, $(Sr,Mg)_3(PO_4)_2:Sn^{2+}$, $SrCaAlSiN_3:Eu$, Eu-activated oxynitride phosphors such as Eu-activated a-sialon, and the like.

[4-1-1-2] Green Phosphor

An example of the specific wavelength range of fluorescence emitted by a phosphor which emits green fluorescence (hereinafter referred to as "green phosphor" when appropriate) is preferably such that the peak wavelength thereof is usually 490 nm or longer, preferably 500 nm or longer, and usually 570 nm or shorter, preferably 550 nm or shorter.

Examples of such a green phosphor include, for example, europium-activated alkaline earth silicon oxynitride phosphors represented by $(Mg,Ca,Sr,Ba)Si_2O_2N_2:Eu$, which are constituted by fractured particles having fractured surfaces and emit light in the green region, europium-activated alkaline earth silicate phosphors represented by $(Ba,Ca,Sr,Mg)_2SiO_4:Eu$, which are constituted by fractured particles having fractured surfaces and emit light in the green region, and the like.

In addition, applicable as the green phosphor other than the above are: Eu-activated aluminate phosphors such as $Sr_4Al_{14}O_{25}:Eu$ and $(Ba,Sr,Ca)Al_2O_4:Eu$; Eu-activated silicate phosphors such as $(Sr,Ba)Al_2Si_2O_8:Eu$, $(Ba,Mg)_2SiO_4:Eu$, $(Ba,Sr,Ca,Mg)_2SiO_4:Eu$ and $(Ba,Sr,Ca)_2(Mg,Zn)Si_2O_7:Eu$; Ce,Tb-activated silicate phosphors such as $Y_2SiO_5:Ce$, Tb; Eu-activated borophosphate phosphors such as $Sr_2P_2O_7-Sr_2B_2O_5:Eu$; Eu-activated halosilicate phosphors such as $Sr_2Si_3O_8\text{-}2SrCl_2:Eu$; Mn-activated silicate phosphors such as $Zn_2SiO_4:Mn$; Tb-activated aluminate phosphors such as $CeMgAl_{11}O_{19}:Tb$ and $Y_3Al_5O_{12}:Tb$; Tb-activated silicate phosphors such as $Ca_2Y_8(SiO_4)_6O_2:Tb$ and $La_3Ga_5SiO_{14}:Tb$; Eu,Tb,Sm-activated thiogalate phosphors such as $(Sr,Ba,Ca)Ga_2S_4:Eu,Tb,Sm$; Ce-activated aluminate phosphors such as $Y_3(Al,Ga)_5O_{12}:Ce$ and $(Y,Ga,Tb,La,Sm,Pr,Lu)_3(Al,Ga)_5O_{12}:Ce$; Ce-activated silicate phosphors such as $Ca_3Sc_2Si_3O_{12}:Ce$ and $Ca_3(Sc,Mg,Na,Li)_2Si_3O_{12}:Ce$; Ce-activated oxide phosphors such as $CaSc_2O_4:Ce$; Eu-activated oxynitride phosphors such as $SrSi_2O_2N_2:Eu$, $(Sr,Ba,Ca)Si_2O_2N_2:Eu$ and Eu-activated β-sialon; Eu,Mn-activated aluminate phosphors such as $BaMgAl_{10}O_{17}:Eu,Mn$; Eu-activated aluminate phosphors such as $SrAl_2O_4:Eu$; Tb-activated oxysulfide phosphors such as $(La,Gd,Y)_2O_2S:Tb$; Ce,Tb-activated phosphate such as $LaPO_4:Ce,Tb$; sulfide phosphors such as $ZnS:Cu,Al,ZnS:Cu,Au,Al$; Ce,Tb-activated borate phosphors such as $(Y,Ga,Lu,Sc,La)BO_3:Ce,Tb$, $Na_2Gd_2B_2O_7:Ce,Tb$ and $(Ba,Sr)_2(Ca,Mg,Zn)B_2O_6:K,Ce$, Tb; Eu,Mn-activated halosilicate phosphors such as $Ca_8Mg(SiO_4)_4Cl_2:Eu,Mn$; Eu-activated thioaluminate phosphors or thiogallate phosphors such as $(Sr,Ca,Ba)(Al,Ga,In)_2S_4:Eu$; Eu,Mn-activated halosilicate phosphors such as $(Ca,Sr)_8(Mg,Zn)(SiO_4)_4Cl_2:Eu,Mn$; and the like.

Also applicable as the green phosphor are: fluorescent dyes such as pyridine-phthalimide condensation derivatives, benzoxadinone-based one, quinazoline-based one, coumarine-based one, quinophthalone-based one and nalthalimide-based one; and organic phosphors such as terbium complexes having hexyl salicylate as its ligand.

[4-1-1-3] Blue Phosphor

An example of the specific wavelength range of fluorescence emitted by a phosphor which emits blue fluorescence (referred to as "blue phosphor" when appropriate) is such that the peak wavelength thereof is usually 420 nm or longer, preferably 440 nm or longer, and usually 480 nm or shorter, preferably 470 nm or shorter.

Examples of such a blue phosphor include europium-activated barium magnesium aluminate phosphors represented by $BaMgAl_{10}O_{17}:Eu$, which are constituted by growing particles having nearly hexagonal shapes typical of regular crystal growth and emit light in the blue region, europium-activated calcium halphosphate phosphors represented by $(Ca,Sr,Ba)_5(PO_4)_3Cl:Eu$, which are constituted by growing particles having nearly spherical shapes typical of regular crystal growth and emit light in the blue region, europium-activated alkaline earth chloroborate phosphors represented by $(Ca,Sr,Ba)_2B_5O_9Cl:Eu$, which are constituted by growing particles having nearly cubic shapes typical of regular crystal growth and emit light in the blue region, and europium-activated alkaline earth aluminate phosphors represented by $(Sr,Ca,Ba)Al_2O_4:Eu$ or $(Sr,Ca,Ba)_4Al_{14}O_{25}:Eu$, which are constituted by fractured particles having fractured surfaces and emit light in the blue-green region.

In addition, applicable as the blue phosphor other than the above are: Sn-activated phosphate phosphors such as $Sr_2P_2O_7:Sn$; Eu-activated aluminate phosphors such as $Sr_4Al_{14}O_{25}:Eu$, $BaMgAl_{10}O_{17}:Eu$ and $BaAl_8O_{13}:Eu$; Ce-activated thiogallate phosphors such as $SrGa_2S_4:Ce$ and $CaGa_2S_4:Ce$; Eu-activated aluminate phosphors such as $(Ba,Sr,Ca)MgAl_{10}O_{17}:Eu$ and $BaMgAl_{10}O_{17}:Eu,Tb,Sm$; Eu,Mn-activated aluminate phosphors such as $(Ba,Sr,Ca)MgAl_{10}O_{17}:Eu,Mn$; Eu-activated halophosphate phosphors such as $(Sr,Ca,Ba,Mg)_{10}(PO_4)_6Cl_2:Eu$ and $(Ba,Sr,Ca)_5(PO_4)_3(Cl,F,Br,OH):Eu,Mn,Sb$; Eu-activated silicate phosphors such as $BaAl_2Si_2O_8:Eu$, $(Sr,Ba)_3MgSi_2O_8:Eu$; Eu-activated phosphate phosphors such as $Sr_2P_2O_7:Eu$; sulfide phosphors such as $ZnS:Ag$, $ZnS:Ag,Al$; Ce-activated silicate phosphors such as $Y_2SiO_5:Ce$; tungstate phosphors such as $CaWO_4$; Eu,Mn-activated borophosphate phosphors such as $(Ba,Sr,Ca)BPO_5:Eu,Mn$, $(Sr,Ca)_{10}(PO_4)_6\cdot nB_2O_3:Eu$ and $2Sr.0.84P_2O_5.0.16B_2O_3:Eu$; Eu-activated halosilicate phosphors such as $Sr_2Si_3O_8.2SrCl_2:Eu$; and the like.

Also applicable as the blue phosphor are, for example: fluorescent dyes such as naphthalimide-based one, benzoxazole-based one, styryl-based one, coumarine-based one, pyrazoline-based one and triazole-based one; organic phosphors such as thulium complexes; and the like.

[4-1-1-4] Yellow Phosphor

An example of the specific wavelength range of fluorescence emitted by a phosphor which emits yellow fluorescence (hereinafter referred to as "yellow phosphor" when appropriate) is usually 530 nm or longer, preferably 540 nm or longer, more preferably 550 nm or longer, and usually 620 nm or shorter, preferably 600 nm or shorter, more preferably 580 nm or shorter. If the emission peak wavelength of the yellow phosphor is too short, there is a possibility that yellow components may be decreased and the semiconductor light-emitting device may be inferior in color rendering. If it is too long, there is a possibility that the luminance of the semiconductor light-emitting device may be lowered.

Examples of the yellow phosphor include, for example, various phosphors such as oxide, nitride, oxynitride, sulfide and oxysulfide phosphors. Particularly, examples include: garnet phosphors represented by $RE_3M_5O_{12}$:Ce (where RE represents at least one element selected from Y, Tb, Gd, Lu and Sm, and M represents at least one element selected from Al, Ga and Sc), $M^2{}_3M^3{}_2M^4{}_3O_{12}$:Ce (where $M^2$ is a divalent metal element, $M^3$ is a trivalent metal element and $M^4$ is a tetravalent metal element) and the like, and having garnet structures; orthosilicate phosphors represented by $AE_2M^5O_4$:Eu (where AE represents at least one element selected from Ba, Sr, Ca, Mg and Zn, and $M^5$ represents at least one element selected from Si and Ge) and the like; oxynitride phosphors in which a part of oxygen, which is a constituent element of the above types of phosphors, is substituted with nitrogen; and Ce-activated phosphors such as nitride phosphors having $CaAlSiN_3$ structures such as $AEAlSiN_3$:Ce (where AE represents at least one element selected from Ba, Sr, Ca, Mg and Zn).

Also applicable as the yellow phosphor other than the above are Eu-activated phosphors such as sulfide phosphors such as $CaGa_2S_4$:Eu, $(Ca,Sr)Ga_2S_4$:Eu and $(Ca,Sr)(Ga,Al)_2S_4$:Eu; and oxynitride phosphors having SiAlON structures such as $Ca_x(Si,Al)_{12}(O,N)_{16}$:Eu.

[4-1-1-5] Other Phosphors

The polysiloxane cured product of the invention may comprise phosphors other than those cited above. For example, the polysiloxane cured product of the invention may be a fluorescent glass in which an ionic phosphor material or an organic/inorganic phosphor component is dissolved or dispersed uniformly and transparently.

[4-1-2] Particle Diameter of Phosphor

No particular limitation is imposed on the particle diameter of phosphors used in the invention. However, the median particle diameter ($D_{50}$) thereof is usually 0.1 μm or larger, preferably 2 μm or larger, more preferably 5 μm or larger, and usually 100 μm or smaller, preferably 50 μm or smaller, more preferably 20 μm or smaller. When the median particle diameter ($D_{50}$) of the phosphors is within the above range, the light emitted from the semiconductor light-emitting element can be scattered sufficiently, in the semiconductor light-emitting device to be described later. In addition, in such a case, the light emitted from the semiconductor light-emitting element is absorbed in the phosphor particles sufficiently, and therefore, not only the wavelength conversion is performed highly efficiently but also the light emitted from the phosphors is radiated in all directions. Thereby, a white light can be obtained by mixing primary lights from the several kinds of phosphors and also a uniform whiteness can be obtained, so that a uniform white light and illumination intensity can be obtained in the synthesized light emitted from the semiconductor light-emitting device. On the other hand, when the median particle diameter ($D_{50}$) of the phosphors is larger than the above range, the phosphors can not fill the space of the light-emitting part sufficiently, and therefore, there is a possibility that the light emitted from the semiconductor light-emitting element may not be absorbed in the phosphors sufficiently, in the semiconductor light-emitting device to be described later. When the median particle diameter ($D_{50}$) of the phosphors is smaller than the above range, emission efficiency of the phosphors will be reduced, and therefore, there is a possibility that illumination intensity of the semiconductor light-emitting device may be reduced.

It is preferable that the particle size distribution (QD) of the phosphor particles is smaller for the purpose of equalizing the dispersion state of the particles in the polysiloxane cured product. However, the smaller the particle size distribution is, the lower the classification efficiency will be and therefore the higher the cost will be. For that reason, it is usually 0.03 or larger, preferably 0.05 or larger, more preferably 0.07 or larger, and usually 0.4 or smaller, preferably 0.3 or smaller, more preferably 0.2 or smaller.

In the invention, the median particle diameter ($D_{50}$) and particle size distribution (QD) can be obtained from a weight-standard particle size distribution curve. The weight-standard particle size distribution curve is obtained from the measurement of particle size distribution by laser diffraction/scattering method, and concretely, the measurement can be performed as follows.

[Method of Measuring Weight-standard Particle Size Distribution Curve]

(1) Phosphor is dispersed in a solvent such as ethylene glycol under the condition under air at the temperature of 25° C. and humidity of 70%.

(2) It is measured by a laser diffraction particle size distribution analyzer (LA-300, manufactured by HORIBA, Ltd) in the particle diameter range of 0.1 μm to 600 μm.

(3) The particle diameter value whose integrated value is 50% in this weight-standard particle size distribution curve is represented by "median particle diameter $D_{50}$". The particle diameter values whose integrated values are 25% and 75% are represented by $D_{25}$ and $D_{75}$, respectively. QD is defined as $(D_{75}-D_{25})/(D_{75}+D_{25})$. Small value of QD means a narrow particle size distribution.

Also, the shape of the phosphor particles is not particularly limited as far as the formation of the polysiloxane cured product is not affected. For example, it is not limited as far as the fluidity or the like of the phosphor part formation liquid (namely, mixed liquid of the phosphor and the polysiloxane cured product) is not affected.

[4-1-3] Surface Treatment of Phosphor

A surface treatment may be performed to the phosphor used in the invention, for the purpose of enhancing the water resistance or preventing unnecessary aggregation of the phosphor in the polysiloxane cured product. Examples of such a surface treatment include a surface treatment using an organic material, an inorganic material, a glass material, or the like as described in JP-A-2002-223008, a coating treatment with a metal phosphate as described in JP-A-2000-96045 and the like, a coating treatment with a metal oxide, known surface treatments such as silica coating, and the like.

As one concrete example of the surface treatment, for example, for coating the surface of a phosphor with the above-mentioned metal phosphate, the following surface treatment (i) to (iii) is performed.

(i) Predetermined amounts of a water-soluble phosphate such as potassium phosphate or sodium phosphate and a water-soluble metal salt compound of at least one metal element selected from alkaline earth metals, Zn and Mn, such as calcium chloride, strontium sulfate, manganese chloride or zinc nitrate, are mixed into a phosphor suspension liquid and stirred.

(ii) A phosphate of at least one metal element selected from alkaline earth metals, Zn and Mn is formed in the suspension, and simultaneously the metal phosphate formed is deposited on the surface of the phosphor.

(iii) Water is removed.

Other preferable examples of surface treatment include, as silica coating, a method in which $SiO_2$ is deposited by neutralizing a liquid glass, a method of surface treatment with a hydrolyzed alkoxysilane (for example, JP-A-3-231987) and the like. Of these, the method of surface treatment with a hydrolyzed alkoxysilane is preferable from the standpoint of enhancing the dispersibility.

[4-1-4] Mixing Method of Phosphor

In the invention, the method of adding phosphor particles is not particularly limited. If phosphor particles are in a good dispersion state, it is sufficient only to post-mix phosphor particles into the above-mentioned curable polysiloxane composition. That is, it is sufficient to prepare a phosphor part formation liquid by mixing the curable polysiloxane composition of the invention and the phosphor, and to form a polysiloxane composition by using this phosphor part formation liquid.

Some kinds of phosphors are hydrolyzable. However, in the polysiloxane cured product of the invention, almost no liberated water exists in a liquid state (curable polysiloxane composition) before coating, and therefore such phosphors can also be used without being hydrolyzed.

Further, when phosphor particles or inorganic particles (to be described later) are dispersed in the polysiloxane cured product of the invention, it is possible to modify the surface of the particles with organic ligands in order to improve dispersibility. An addition type silicone resin, which has previously been used as a semiconductor light-emitting device member, was liable to undergo curing inhibition by these organic ligands and could not be mixed/cured with particles which had been subjected to such a surface treatment. This is because platinum-based catalyst used in the addition reaction type silicone resin interacts strongly with the organic ligands and loses capability of hydrosilylation, resulting in poor curing. Examples of these poisoning substances include organic compounds comprising N, P, S or the like, ionic compounds of heavy metals such as Sn, Pb, Hg, Bi and As, and organic compounds comprising a multiple bond such as an acetylene group (flux, amines, vinyl chloride, or sulfur vulcanized rubber). On the other hand, the polysiloxane cured product of the invention is related to a condensing-type curing mechanism, which is less liable to undergo curing inhibition by these poisoning substances. Therefore, the polysiloxane cured product of the invention can be used more freely in combination with phosphor particles or inorganic particles, whose surfaces are modified with organic ligands, and further, with phosphor components such as complex phosphors. Thus, the polysiloxane cured product possesses an excellent property as a phosphor binder and a transparent material for introducing nano particles with high refractive index.

[4-1-5] Content of Phosphor

The content of the phosphor in the polysiloxane cured product of the invention can be selected arbitrary insofar as the advantage of the invention is not significantly impaired. Actually, it can be selected freely depending on its form of applications. As regards a semiconductor light-emitting device emitting white light, which is used for white LED, white-light illuminating device or the like, if the entire recess of the package including the semiconductor light-emitting element is filled by means of potting, with dispersing the phosphor uniformly, the total content of the phosphor is usually 0.1% by weight or more, preferably 1% by weight or more, more preferably 5% by weight or more, and usually 35% by weight or less, preferably 30% by weight or less, more preferably 28% by weight or less.

In the same use application, but when a material with phosphor dispersed in a high concentration is coated as a thin film, at the portion apart from the emission surface (for example, the opening surface of the package in which recess comprising the semiconductor light-emitting element is filled with a transparent encapsulant, the light-emitting surface of an external optical member such as a glass lid/lens/optical guide plate for LED air-tight encapsulating, and the like) of the semiconductor light-emitting element of the semiconductor light-emitting device, the total content is usually 5% by weight or more, preferably 7% by weight or more, more preferably 10% by weight or more, and usually 90% by weight or less, preferably 80% by weight or less, more preferably 70% by weight or less.

When a white light is intended to obtain by mixing the emission color of the semiconductor light-emitting element and emission color of the phosphor, generally a part of the light emitted from the semiconductor light-emitting element passes through. Therefore, in such a case, the concentration of the phosphor tends to be as low as close to the lower limit of the above-mentioned range. On the other hand, when a white light is obtained by converting all of the light emitted from the semiconductor light-emitting element into the light with emission color of the phosphor, it is preferable that the concentration of the phosphor is high. Therefore, in such a case, the concentration of the phosphor tends to be as high as close to the upper limit of the above-mentioned range. If the content of the phosphor is more than this range, coating performance may be lowered, or low efficiency of phosphor utilization due to an optical interference, and therefore, there is a possibility that luminance of the semiconductor light-emitting device may be reduces. If the content of the phosphor is less than the range, there is a possibility that the wavelength conversion by the phosphor will be insufficient and therefore the intended emission color may not be obtained.

An example of the application of the semiconductor light-emitting device emitting white light is shown above. However, the concrete content of the phosphor is not limited thereto and varies widely depending on the intended color, emission efficiency of the phosphors, color mixing method, specific gravity of the phosphors, film thickness of coating, shape of the semiconductor light-emitting device or the like.

The curable polysiloxane composition of the invention has advantages such as low viscosity, good compatibility with phosphors or inorganic particles and good coating properties that can be maintained even when high concentration of phosphors or inorganic particles are dispersed therein, in comparison with the conventional material for optical members such as epoxy resins and silicone resins. Moreover, it can be of high viscosity as needed by such a method of adjusting the degree of polymerization and adding thixotropic agent such as aerosil. Namely, the composition is very flexible in adjustment of viscosity according to the intended content of phosphors. Therefore, it is possible to provide a coating liquid that can correspond flexibly to not only the kinds or shapes of coated objects but also various coating methods such as potting, spin coating and printing.

The content of the phosphor in the polysiloxane cured product can be determined by the following procedure, if the composition of the phosphor can be identified. A phosphor-containing sample is prebaked after being pulverized so as to remove carbon components, followed by removing silicon components as hydrofluorosilicic acid by hydrofluoric acid treatment. By dissolving the residue in diluted sulfuric acid, the metal elements, which are the main components, are converted into an aqueous solution and the quantity of the main component metal element is determined by known elemental analyses such as ICP, flame analysis or fluorescent X-ray analysis. Then, the content of the phosphor can be determined by calculation. If the shapes and particle diameters of the phosphors are uniform and the specific gravity thereof is known, the content of phosphor can be determined by a simplified method in which the number of the particles per unit area is obtained by image analysis of the cross section of the coating and then is converted into the content of phosphor.

The phosphor content in the phosphor part formation liquid can be set so that the phosphor content in the polysiloxane cured product falls within the above range. Thus, when the weight of the phosphor part formation liquid is not changed in the drying process, the phosphor content in the phosphor part formation liquid will be equal to the phosphor content in the polysiloxane cured product. When the weight of the phosphor part formation liquid is changed in the drying process, for example, in the case where the phosphor part formation liquid comprises a solvent or the like, the phosphor content in the phosphor part formation liquid other than the solvent or the like may be set so as to be the same as the phosphor content in the polysiloxane cured product.

[4-2] Combined Use of Inorganic Particles (Filler)

In the case where the optical member comprising at least the polysiloxane cured product of the invention is used for a semiconductor light-emitting device, inorganic particles may be further contained for the purpose of improving the optical properties and workability, or obtaining any of effects <1> to <5> shown below.

<1> By mixing inorganic particles as a light scattering substance into the polysiloxane cured product to cause light from the semiconductor light-emitting device to scatter, the amount of light from the semiconductor light-emitting element incident on the phosphor is increased and the efficiency of wavelength conversion is improved, as well as the angle of spreading light from the semiconductor light-emitting device to the outside is widened.

<2> By blending the polysiloxane cured product with inorganic particles as a binder, crack generation is prevented.

<3> By blending the curable polysiloxane composition with inorganic particles as a viscosity modifier, viscosity of the liquid is increased.

<4> By blending the polysiloxane cured product with inorganic particles, the shrinkage thereof is reduced.

<5> By blending the polysiloxane cured product with inorganic particles, the refractive index thereof is adjusted so as to improve the efficiency of extracting light.

In this case, it is suitable to mix an appropriate amount of inorganic particles into the curable polysiloxane composition, similarly to the phosphor particles, according to purposes. Effects that can be obtained in this case depend on the kind and the amount of inorganic particles to be mixed.

For example, when an ultrafine particle silica (manufactured by Nippon Aerosil Co., Ltd., commercial name: AEROSIL#200 or RX200) having a particle diameter of about 10 nm is used as the inorganic particle, the effect of the above <3> is noticeable because thixotropy of the curable polysiloxane composition increases.

When a fractured silica or spherical silica whose particle diameter is about several µm is used as the inorganic particle, it functions mainly as the aggregate for the polysiloxane cured product and increase in thixotropy is just a little, so that the effects of the above <2> and <4> are noticeable.

Also, when inorganic particles having a diameter of about 1 µm, whose refractive index is different from that of the polysiloxane cured product, are used, the effect of the above <1> is noticeable because the light scattering at the interface between the polysiloxane cured product and the inorganic particles increases.

When inorganic particles having a refractive index larger than that of the polysiloxane cured product and having a diameter of 3 to 5 nm, more specifically equal to or less than the emission wavelength are used, the refractive index of the polysiloxane cured product can be improved while maintaining transparency thereof, so that the effect of the above <5> is noticeable.

Therefore, the kind of inorganic particles to be mixed may be selected according to the purposes. Only one kind thereof may be selected or a plurality kinds thereof may be combined. Also, in order to improve the dispersibility, a surface treatment may be applied with a surface treatment agent such as a silane coupling agent.

[4-2-1] Kind of Inorganic Particles

Exemplified kinds of inorganic particles to be used include: inorganic oxide particles such as silica, barium titanate, titanium oxide, zirconium oxide, niobium oxide, aluminum oxide, cerium oxide and yttrium oxide; and diamond particles. However, other materials can be also selected depending on the purposes and thus the inorganic particles are not limited thereto.

Inorganic particles may be in any form, depending on the purposes, such as a powder and a slurry. However, when the transparency must be maintained, it is preferable to equalize the refractive indexes of the inorganic particles and the polysiloxane cured product of the invention or to add the particles as aqueous or solvent-based transparent sol to the curable polysiloxane composition.

[4-2-2] Median Particle Diameter of Inorganic Particles

There is no special limitation on the median particle diameter of these inorganic particles (primary particles). Usually, it is about 1/10 or less that of phosphor particles. More specifically, the following median particle diameter is adopted depending on the purpose. For example, when the inorganic particle is used as a light scattering agent, the median particle diameter thereof preferably falls within 0.1 µm to 10 µm. For example, when the inorganic particle is used as an aggregate, the median particle diameter thereof preferably falls within 1 nm to 10 µm. For example, when the inorganic particle is used as a thickener (thixotropic agent), the median particle diameter thereof preferably falls within 10 nm to 100 nm. For example, when the inorganic particle is used as a refractive index adjusting agent, the median particle diameter thereof preferably falls within 1 nm to 10 nm.

[4-2-3] Mixing Method of Inorganic Particle

There is no special limitation on the method of mixing inorganic particles in the invention. Usually, it is recommended that the mixing be performed using a planetary mixer, similarly to phosphor, while defoaming is done. For example, when small particles which are liable to aggregate like aerosil are mixed, aggregated particles are crushed after particle mixing, as needed, using a beads mill, a three-axis roll or a mixer with high shear, and then large particles which are easy to mix, such as phosphor, may be mixed.

[4-2-4] Content of Inorganic Particle

The content of the inorganic particle in the polysiloxane cured product of the invention can be selected arbitrary insofar as the advantage of the invention is not significantly impaired. Actually, it can be selected freely depending on its form of applications. For example, when the inorganic particle is used as light scattering agent, the content thereof preferably falls within 0.01 to 10% by weight. For example, when the inorganic particle is used as an aggregate, the content thereof preferably falls within 1 to 50% by weight. For example, when the inorganic particle is used as a thickener (thixotropic agent), the content thereof preferably falls within 0.1 to 20% by weight. For example, when the inorganic particle is used as a refractive index adjusting agent, the content thereof preferably falls within 10 to 80% by weight. When the amount of inorganic particle is too small, there is a possibility that the desired advantageous effects may be unobtainable. When the amount is too large, there is a possibility that various properties such as adhesion, transparency and hardness of the cured product may be affected adversely.

The curable polysiloxane composition of the invention has advantages such as low viscosity, high compatibility with phosphors or inorganic particles and good coating properties that can be maintained even when high concentration of inorganic particles are dispersed therein, in comparison with the conventional materials for optical members, such as epoxy resins and silicone resins. Moreover, it can be of high viscosity as needed by such a method of adjusting the degree of polymerization and adding a thixotropic agent such as aerosil. Namely, the composition is very flexible in adjustment of viscosity according to the intended content of inorganic particles. Therefore, the composition can provide a coating liquid that can correspond very flexibly to not only the kinds or shapes of coated objects but also the various coating methods such as potting, spin coating and printing.

The content of the inorganic particles in the polysiloxane cured product can be measured in the same manner as in the case of the above-described content of phosphor.

The inorganic particle content in the curable polysiloxane composition can be set so that the inorganic particle content in the polysiloxane cured product falls within the above range. Thus, when the weight of the curable polysiloxane composition is not changed in the drying process, the inorganic particle content in the curable polysiloxane composition will be equal to the inorganic particle content in the polysiloxane cured product. When the weight of the curable polysiloxane composition is changed in the drying process, for example, in the case where the curable polysiloxane composition comprises a solvent or the like, the inorganic particle content in the curable polysiloxane composition other than the solvent or the like may be set so as to be the same as the inorganic particle content in the polysiloxane cured product.

[4-3] Combined Use of Conductive Filler/Heat Conductive Filler

A conductive filler may be also contained, for example when the optical member comprising at least the polysiloxane cured product of the invention is used for a semiconductor light-emitting device, for the purpose of imparting electric conductivity and forming an electric circuit at a lower temperature than the temperature used at soldering using a technique such as printing or potting.

Examples of conductive filler to be used include precious metal powders such as silver powder, gold powder, platinum powder and palladium powder, base/precious metal powders such as copper powder, nickel powder, aluminum powder, brass powder and stainless steel powder, base/precious metal powders plated or alloyed with a precious metal such as silver, organic resin powders or silica powders coated with a precious metal or a base metal, and carbon-based fillers such as carbon black or graphite powder. However, other materials can also be selected depending on the purpose and thus the conductive filler is not limited thereto. The conductive filler may be used either as a single kind, or two or more kinds thereof may be used in any combination and in any ratio.

The conductive filler may be supplied in any form such as powder or slurry, depending on the purpose. When transparency needs to be maintained or print formation with fine wiring is necessary, it is preferably added to the curable polysiloxane composition as aqueous or solvent-based transparent sol with no aggregation or as nano particle powder with its surface modified to allow easy redispersion.

Examples of the form of these metal powders include flake (scale), sphere, grain, dendrite, and three-dimensional aggregation of spherical primary particles. Of these, the use of silver powder as main component is preferable from the standpoint of conductivity, cost and reliability. In terms of conductivity, combined use of silver powder and a small amount of carbon black and/or graphite powder is more preferable. Further, from the standpoint of conductivity and reliability, the use of silver powder in the form of flake or sphere is preferable, and the combined use of flake and sphere silver powders is most preferable. Further, an inorganic filler such as silica, talc, mica, barium sulfate or indium oxide may be added in a small amount, if needed.

Preferable proportion (mass ratio) of silver powder and carbon black and/or graphite fine powder is as follows. On the supposition that the total amount of silver powder and carbon black and/or graphite fine powder is 100 mass ratio, the upper limit of silver powder is preferably 99.5 mass ratio or less, more preferably 99 mass ratio or less, and the lower limit thereof is 85 mass ratio or more, preferably 90 mass ratio or more.

There is no special limitation on the median particle diameter of the conductive filler. Usually, it is 0.1 µm or larger, preferably 0.5 µm or larger, and more preferably 1 µm or larger, and usually 50 µm or smaller, preferably 20 µm or smaller, and more preferably 10 µm or smaller. Particularly, when transparency or micro-fabrication capability is required, it is usually 3 nm or larger, preferably 10 nm or larger, and usually 150 nm or smaller, preferably 100 nm or smaller.

The content of the conductive filler is usually 50% by weight or more, preferably 75% by weight or more, and more preferably 80% by weight or more, assuming that the total amount of the conductive filler and the binder resin is 100% by weight. From the viewpoint of adhesion and ink viscosity, it is usually 95% by weight or less, preferably 93% by weight or less, and more preferably 90% by weight or less. When the amount of the conductive filler is too small, there is a possibility that the desired advantageous effects may be unobtainable. When the amount is too large, there is a possibility that various properties such as adhesion, transparency and hardness of the cured product may be affected adversely.

Moreover, a heat conductive filler may be also contained, for example, when the optical member comprising at least the polysiloxane cured product of the invention is used in the semiconductor light-emitting device, for the purpose of imparting heat conductivity and providing a die-bonding layer using a technology such as printing or potting.

Examples of the heat conductive filler to be used include precious metal powders such as silver powder, gold powder, platinum powder and palladium powder, base/precious metal powders such as copper powder, nickel powder, aluminum powder, brass powder and stainless steel powder, base/precious metal powders plated or alloyed with a precious metal such as silver, carbon-based fillers such as carbon black or graphite powder, ceramics powders such as SiC and SiN, diamond powder, and the like. However, other materials can also be selected depending on the purpose and thus the heat conductive filler is not limited thereto. The heat conductive filler may be used either as a single kind, or two or more kinds thereof may be used in any combination and in any ratio. The used amount and particle diameter of the heat conductive filler are preferably the same as those of the above-mentioned conductive filler.

The curable polysiloxane composition of the invention has advantages such as low viscosity, high compatibility with phosphors or inorganic particles and sufficient coating properties that can be maintained even when high concentration of inorganic particles are dispersed therein, in comparison with the conventional materials for optical members, such as epoxy resins and silicone resins. Moreover, it can be of high viscosity as needed by such a method of adjusting the degree of polymerization and adding a thixotropic agent such as aerosil. Namely, the composition is very flexible in adjustment of viscosity according to the intended content of inorganic particles. Therefore, the composition can provide a coating liquid that can correspond very flexibly to not only the kinds or shapes of coated objects but also the various coating methods such as potting, spin coating and printing.

The content of the inorganic particles in the curable polysiloxane composition can be measured in the same manner as in the case of the above-described content of phosphor.

[4-4] Combined Use with Other Members

The curable polysiloxane composition of the invention may be used as an encapsulant singly. However, in the uses requiring more strict cutoff of oxygen or moisture, for example, in the case where it encapsulates an organic phosphor, a phosphor that is liable to deteriorate by oxygen or moisture, or a semiconductor light-emitting device, retention of the phosphor, encapsulating the semiconductor element or extracting light is carried out with the member of the invention and further, an air-tight encapsulating with a highly air-tight material such as a glass plate or an epoxy resin may be carried out in the outer side of them, or vacuum encapsulating may be performed. In this case, the shape of the semiconductor light-emitting device is not specially limited and it is enough that the encapsulated body, coating or coated surface by the curable polysiloxane composition of the invention is substantially protected and blocked from outside by an air-tight material such as a metal, glass or highly air-tight resin, so as to allow no passage of oxygen and moisture.

In addition, the curable polysiloxane composition of the invention may be used as an adhesive for a semiconductor light-emitting device because it is excellent in adhesion as described above. More specifically, for example, the polysiloxane cured product of the invention can be used in the cases of bonding a semiconductor element and a package, a semiconductor element and a sub mount, package constituents each other, a semiconductor light-emitting device and an external optical element, by means of application, printing or potting the polysiloxane cured product. Since the polysiloxane cured product of the invention is excellent particularly in light resistance and heat resistance, it provides a semiconductor light-emitting device with high reliability enough to stand a long-time use, when the polysiloxane cured product is used as an adhesive for a high-power semiconductor light-emitting device that is exposed to high temperature or ultraviolet rays for a long time.

The polysiloxane cured product of the invention can achieve sufficient adhesion just by itself. However, for the purpose of securing more sufficient adhesion, surface treatments for improving adhesion may be performed on the surface that will come directly in contact with the polysiloxane cured product. Examples of such surface treatment include, for example: a formation of an adhesion-improving layer using a primer or a silane coupling agent, a chemical surface treatment using a chemical agent such as an acid or an alkali, a physical surface treatment using plasma irradiation, ion irradiation or electron beam irradiation, a surface-roughening treatment by sandblasting, etching, fine particles coating and the like. Other examples of the surface treatment for improving adhesion include, for example, known surface treatment methods disclosed in JP-A-5-25300, "Hyomen Kagaku", Vol. 18 No. 9, pp 21-26, written by Norihiro Inagaki, "Hyomen Kagaku", Vol. 19 No. 2, pp 44-51 (1998), written by Kazuo Kurosaki, and the like.

[5] Embodiments of Semiconductor Light-emitting Device

As an example of the optical member of the invention comprising at least the polysiloxane cured product of the invention, the semiconductor light-emitting device comprising at least the optical member of the invention (hereinafter referred to as a "semiconductor light-emitting device of the invention" when appropriate) will be explained with reference to embodiments thereof. In each embodiment below, the semiconductor light-emitting device of the invention is abbreviated as a "light-emitting device" when appropriate. Further, the optical member of the invention to be used for the semiconductor light-emitting device of the invention is referred to as a semiconductor light-emitting device member. In addition, a site at which the optical member of the invention is used will be described all at once after the description of all the embodiments. However, these embodiments are used only for convenience of description, and therefore, the examples of the semiconductor light-emitting device comprising at least the optical member of the invention are not limited to these embodiments.

[5-1] Basic Concept

The semiconductor light-emitting devices of the invention using the semiconductor light-emitting device member of the invention, for example, includes the following application examples A) and B). In both application examples, the semiconductor light-emitting device member of the invention shows excellent light resistance and heat resistance, less frequent crack generation and peeling, as well as less decrease in luminance, as compared to conventional optical members for semiconductor light-emitting devices. Therefore, a member exhibiting high reliability over a long period of time can be provided, by the semiconductor light-emitting device member of the invention.

A) Semiconductor light-emitting devices utilizing the emission color of the light-emitting element just as it is.

B) Semiconductor light-emitting devices that emit light of desired wavelengths utilizing fluorescence, by means of disposing a phosphor part near the light-emitting element so as to make the phosphor or phosphor components in the phosphor part be excited by the light from the light-emitting element.

In the application example A), the semiconductor light-emitting device member of the invention can be used even singly as a highly durable encapsulant, light extracting film, and various functional-components retaining agents, by utilizing its high durability, transparency, and encapsulating properties. Particularly, when the semiconductor light-emitting device member of the invention is used as a functional-component retaining agent for retaining the above-mentioned inorganic particles or the like and a transparent and highly refractive component is retained in the semiconductor light-emitting device member of the invention, the reflection on the light emitting surface of the light-emitting element can be reduced and thus it becomes possible to obtain higher efficiency of extracting light, by using the semiconductor light-emitting device member of the invention that is in close contact with the light emitting surface of the light-emitting element and making the member have a refractive index close to that of the light-emitting element.

Also, in the application example B), the semiconductor light-emitting device member of the invention can demonstrate superior capabilities similar to those in the above-mentioned application example A). In addition, it makes possible to form a phosphor part that is highly durable and can extract light with high efficiency, by retaining a phosphor or phosphor components. Further, when the semiconductor light-emitting device member of the invention retains a transparent and highly refractive component in addition to the phosphor or phosphor components, the interface reflection can be reduced and thus it becomes possible to obtain higher efficiency of extracting light, by adjusting the refractive index of the semiconductor light-emitting device member of the invention to be close to that of the light-emitting element or the phosphor.

Figure 50:
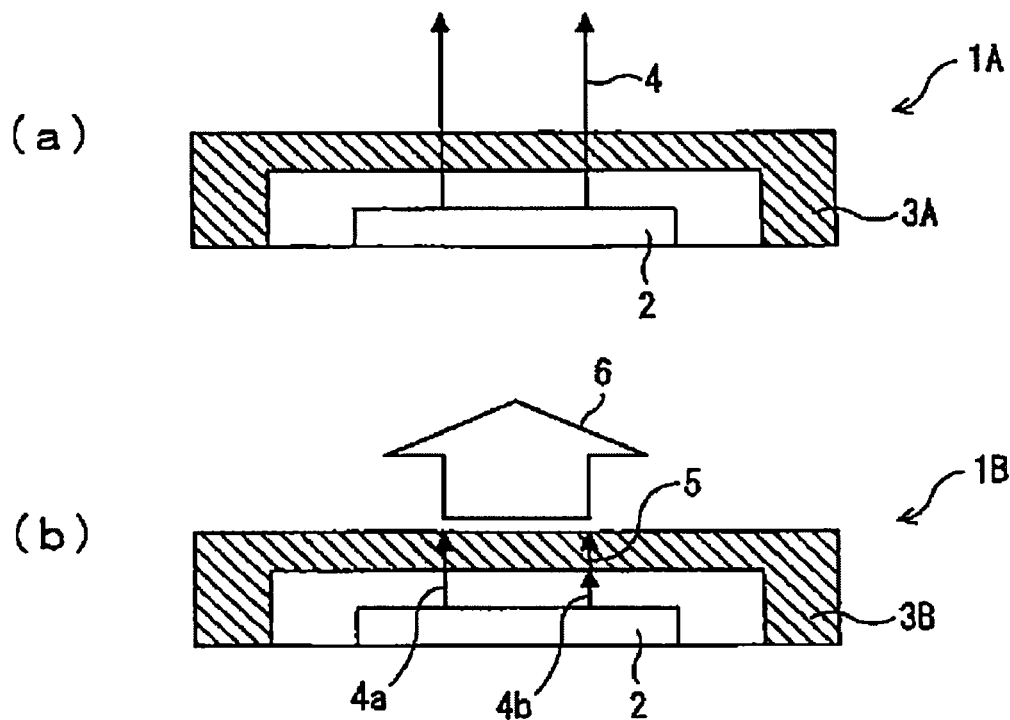
[FIG. 50]

A basic concept of each embodiment to which the semiconductor light-emitting device member of the invention is applied will be described below with reference to FIG. 50(a) and FIG. 50(b). FIG. 50(a) and FIG. 50(b) are explanatory drawings of the basic concept of each embodiment. FIG. 50(a) corresponds to the above application example A) and FIG. 50(b) corresponds to the above application example B).

As shown in FIG. 50(a) and FIG. 50(b), the light emitting devices (semiconductor light-emitting devices) 1A, 1B of each embodiment comprises a light-emitting element 2 comprised of an LED chip and a semiconductor light-emitting device member 3A, 3B of the invention, disposed close to the light-emitting element 2.

However, in embodiments (Embodiments A-1 and A-2) corresponding to the above application example A), as shown in FIG. 50(a), light emitting device 1A does not comprise any phosphor or phosphor component in semiconductor light-emitting device member 3A. In this case, semiconductor light-emitting device member 3A performs various functions such as encapsulating of light-emitting element 2, extracting light and retaining functional components. In the description below, semiconductor light-emitting device member 3A comprising no phosphor or phosphor component will be called a "transparent member" when appropriate.

On the other hand, in embodiments (Embodiments B-1 to B-41) corresponding to the above application example B), as shown in FIG. 50(b), light emitting device 1B comprise a phosphor or phosphor component in semiconductor light-emitting device member 3B. In this case, semiconductor light-emitting device member 3B can perform a function of wavelength conversion, in addition to the functions that can be performed by semiconductor light-emitting device member 3A in FIG. 50(a). In the description below, semiconductor light-emitting device member 3B comprising a phosphor or phosphor component will be called a "phosphor part" when appropriate. The phosphor part may be shown by numerals 33 and 34 according to its shape or functions when appropriate.

Light-emitting element 2 is comprised of an LED chip emitting blue light or ultraviolet light, but it may be an LED chip of other emission color.

Transparent member 3A performs functions of a highly durable encapsulant for light-emitting element 2, light extracting film, various-functions adding film and the like. Transparent member 3A may be used alone. Otherwise, it can comprise any additives, excluding the phosphor and phosphor components, as far as the advantage of the invention is not significantly impaired.

Phosphor part 3B, on the other hand, can perform not only functions of a highly durable encapsulant for light-emitting element 2, light extracting film, various-functions adding film and the like, but also a function of wavelength conversion, that is, a function to emit light of the desired wavelength after the excitation by the light from light-emitting element 2. Phosphor part 3B has to comprise at least a phosphor material that emits light of the desired wavelength after being excited by the light from light-emitting element 2. Examples of such a phosphor material include various phosphors exemplified above. Emission colors of the light that can be emitted by phosphor part 3B include white of a fluorescent lamp and yellow of a light bulb, as well as three primary colors red (R), green (G) and blue (B). In summary, phosphor part 3B has a wavelength conversion function for emitting light of the desired wavelength that is different from that of the excitation light.

In the above light emitting device 1A shown in FIG. 50(a), light 4 emitted from light-emitting element 2 passes through transparent member 3A to be emitted out of light emitting device 1A. Therefore, in light emitting device 1A, light 4 emitted from light-emitting element 2 will be used unchanged in emission color of the light emitted from light-emitting element 2.

In light emitting device 1B shown in FIG. 50(b), on the other hand, light 4a, a part of the light emitted from light-emitting element 2, passes through phosphor part 3B unchanged to be emitted out of light emitting device 1B. Also in light emitting device 1B, light 4b, another part of the light emitted from light-emitting element 2, is absorbed by phosphor part 3B, resulting in that phosphor part 3B is excited and light 5 having wavelengths specific to phosphor components contained in phosphor part 3B, such as phosphor particles, fluorescent ions and fluorescent dyes, is emitted out of light emitting device 1B.

Therefore, synthesized light 6 synthesized from light 4a, which has passed through phosphor part 3B after being emitted from light-emitting element 2, and light 5, which is emitted from phosphor part 3B, will be emitted from light emitting device 1B as light with converted wavelength. The emission color of the whole light emitted from light emitting device 1B will be determined by the emission color of light-emitting element 2 and that of phosphor part 3B. In this context, light 4a, which passes through phosphor part 3B after being emitted from light-emitting element 2, is not always necessary.

[5-2] Embodiments

[A. Embodiments that do not Use Fluorescence]

[Embodiment A-1]

In light emitting device 1A of the present embodiment, as shown in FIG. 1, light-emitting element 2 is surface-mounted on an insulating substrate 16 on which printed wiring 17 is provided. In light-emitting element 2, a p-type semiconductor layer (not shown) and an n-type semiconductor layer (not shown) in light-emitting layer part 21 are each connected electrically to printed wirings 17 and 17 via conductive wires 15 and 15, respectively. Conductive wires 15 and 15 have a small cross sectional area so that the light emitted from light-emitting element 2 may not be interfered.

As light-emitting element 2, one that emits light of any wavelengths, from ultraviolet to infrared regions, may be used. In this embodiment, a gallium nitride-based LED chip is assumed to be used. In light-emitting element 2, an n-type semiconductor layer (not shown) is formed on the lower side in FIG. 1 and a p-type semiconductor layer (not shown) is formed on the upper side in FIG. 1. The upper side of FIG. 1 is assumed to be the front side in the following description because light output is extracted from the side of the p-type semiconductor layer.

A frame-shaped frame 18 surrounding light-emitting element 2 is fixed on the insulating substrate 16. A encapsulating part 19 for encapsulating and protecting light-emitting element 2 is provided inside the frame 18. This encapsulating part 19 is formed of transparent member 3A, which is the semiconductor light-emitting device member of the invention, and the formation thereof can be performed by potting with the raw material of the above polysiloxane cured product.

Thus, because light emitting device 1A of the present embodiment comprises light-emitting element 2 and transparent member 3A, the light resistance and heat resistance of light emitting device 1A can be improved. Moreover, since crack generation and peeling are less likely to occur in encapsulating part 3A, the transparency in encapsulating part 3A can be increased.

Further, the color blurring and color unevenness can be reduced and also the efficiency of extracting light to the outside can be enhanced, in comparison with conventional devices. This is because encapsulating part 3A can be allowed to have high transparent without causing blurring and turbidity. For that reason, light emitting device 1A is superior in uniformity in color appearance with little color unevenness among the light emitting devices 1A, and also can enhance the efficiency of extracting light from light-emitting element 2 to the outside, as compared with conventional devices. Also, the weather resistance of the light-emitting material can be enhanced and thus the lifetime of light emitting device 1A can be prolonged in comparison with conventional devices.

[Embodiment A-2]

Figure 2:
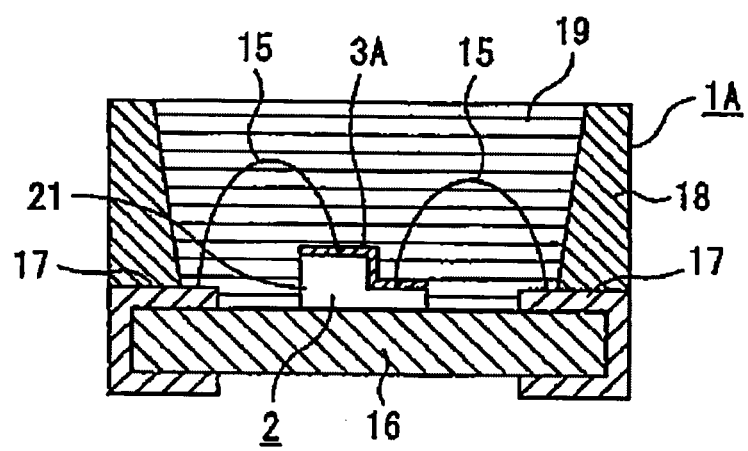
[FIG. 2]

Light emitting device 1A of the present embodiment is constituted, as shown in FIG. 2, in the same manner as the above embodiment A-1, except that the front side of light-emitting element 2 is covered with transparent member 3A and the encapsulating part 19, formed on the transparent member, is formed of a material different from that of transparent member 3A. Transparent member 3A on the surface of light-emitting element 2 is a transparent thin film, functioning as a light extracting film and encapsulating film. Transparent member 3A can be formed, for example, by coating the above raw material of the polysiloxane cured product, by a method of spin coating or the like, during the formation of a chip of light-emitting element 2. Meanwhile, the same components as in the embodiment A-1 are designated by the same reference numerals to omit redundant explanations.

Thus, because light emitting device 1A of the present embodiment also comprises light-emitting element 2 and transparent member 3(*a*), like the embodiment A-1, the light resistance and heat resistance of light emitting device 1A can be improved. Moreover, since crack generation and peeling are also less likely to occur in encapsulating part 3A, the transparency in encapsulating part 3A can be increased.

Further, advantages, like those of embodiment A-1, can be also obtained.

[B. Embodiments Using Fluorescence]
[Embodiment B-1]

Figure 3:
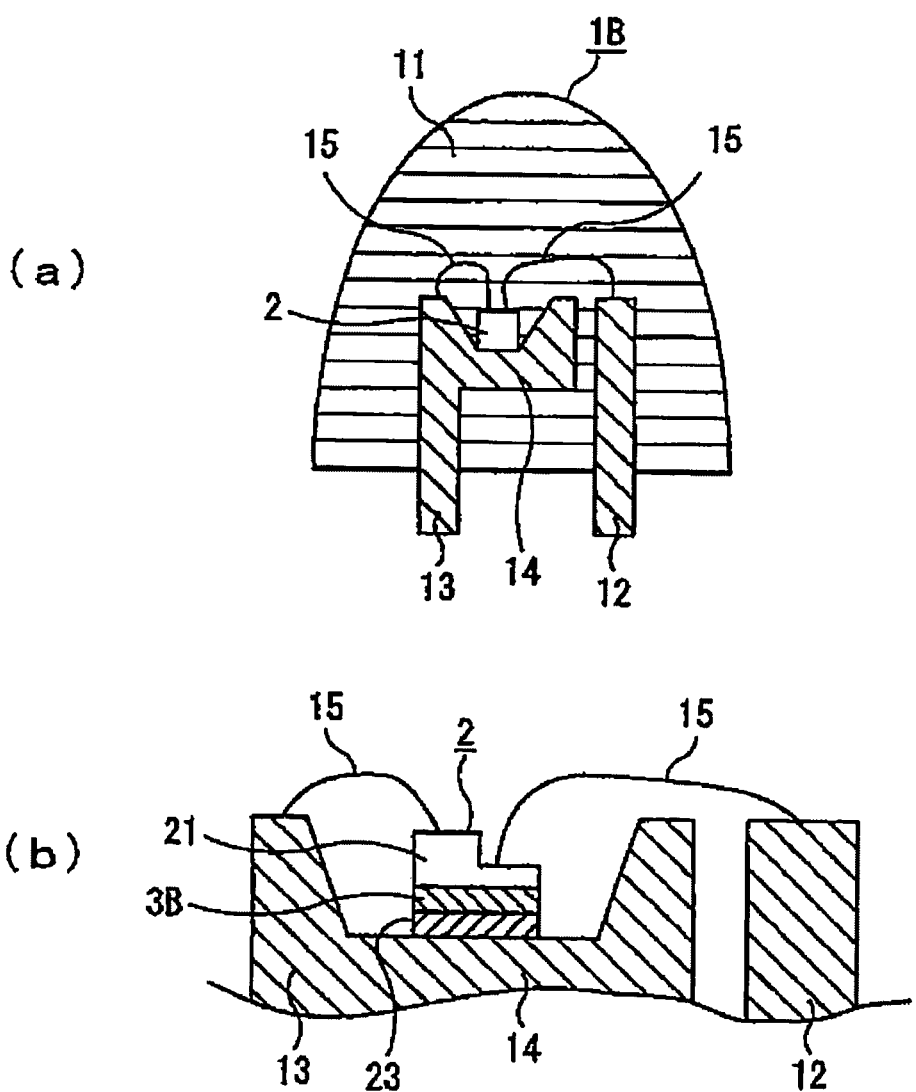
[FIG. 3]

Light emitting device 1B of the present embodiment comprises, as shown in FIG. 3(*a*), light-emitting element 2 comprised of an LED chip and a mold part 11 obtained by forming a light-transmissible and transparent material into a shell type shape. Mold part 11 covers light-emitting element 2. Light-emitting element 2 is electrically connected to lead terminals 12 and 13, formed of a conductive material. Lead terminals 12 and 13 are formed of a lead frame.

Light-emitting element 2 is comprised of a gallium nitride-based LED chip. In light-emitting element 2, an n-type semiconductor layer (not shown) is formed on the lower side in FIG. 3(*a*) and a p-type semiconductor layer (not shown) is formed on the upper side in FIG. 3(*a*). The upper sides of FIG. 3 are assumed to be the front sides in the following description because light output is extracted from the side of the p-type semiconductor layer. The rear surface of light-emitting element 2 is joined to a mirror (cup part) 14, which is attached to the front end part of lead terminal 13 by die bonding. Light-emitting element 2, in which the above p-type semiconductor layer and n-type semiconductor layer are connected to conductive wires (for example, gold wires) 15 and 15 by bonding, respectively, is electrically connected to lead terminals 12 and 13 via conductive wires 15 and 15. Conductive wires 15 and 15 have a small cross sectional area so that the light emitted from light-emitting element 2 may not be interfered.

Mirror 14 has a function to reflect light emitted from both lateral sides and the rear surface of light-emitting element 2 forward. The light emitted from the LED chip and light reflected by mirror 14 in the front direction are emitted forward via the front end part of mold part 11, which functions as a lens. The mold part 11 covers light-emitting element 2 along with mirror 14, conductive wires 15 and 15, and a part of lead terminals 12 and 13, so that the degradation of properties of light-emitting element 2, due to a reaction with moisture in the air or the like, is prevented. The rear ends of each lead terminals 12 and 13 project from the rear surface of mold part 11.

In light-emitting element 2, as shown in FIG. 3(*b*), light-emitting layer part 21, composed of a gallium nitride-based semiconductor, is formed on phosphor part 3B by means of a semiconductor process. A reflective layer 23 is formed on the rear surface of phosphor part 3B. Light emitted from light-emitting layer part 21 is emitted in all directions, but a part of that light, which is absorbed by phosphor part 3B, excites phosphor part 3B to emit light having wavelength specific to the above-mentioned phosphor components. This light, emitted from phosphor part 3B, is reflected by reflective layer 3 to be emitted forward. Therefore, light, synthesized from the light emitted from light-emitting layer part 21 and light emitted from phosphor part 3B, is obtained in light emitting device 1B.

Thus, light emitting device 1B of the present embodiment comprises light-emitting element 2 and phosphor part 3B which emits light of the desired wavelength after being excited by the light from light-emitting element 2. Here, if phosphor part 3B is superior in light-transmission, a part of the light emitted from light-emitting element 2 is emitted unchanged to the outside, and the phosphor components, which play the role of emission center, are excited by another part of the light emitted from light-emitting element 2 and emits light, which is specific to the phosphor components, to the outside. Thus, it becomes possible to obtain light, synthesized from the light emitted from light-emitting element 2 and light emitted from phosphor components of phosphor part 3B, and also to reduce the color blurring and color unevenness, as well as to enhance the efficiency of extracting light to the outside, in comparison with conventional devices. That is, if phosphor part 3B is highly transparent without causing blurring and turbidity, light emitting device 1B is superior in uniformity in color appearance with little color unevenness among light-emitting devices 1B, and also can enhance the efficiency of extracting light from light-emitting element 2 to the outside, as compared with conventional devices. Also, the weather resistance of the light-emitting material can be enhanced and thus the lifetime of light emitting device 1B can be prolonged in comparison with conventional devices.

Also in light emitting device 1B of the present embodiment, phosphor part 3B serves also as a substrate for forming light-emitting element 2, and therefore the phosphor in the phosphor part, which play the role of emission center, can efficiently be excited by a part of the light from light-emitting element 2, leading to the enhancement in luminance of the emitted light specific to the phosphor components.

[Embodiment B-2]

Figure 4:
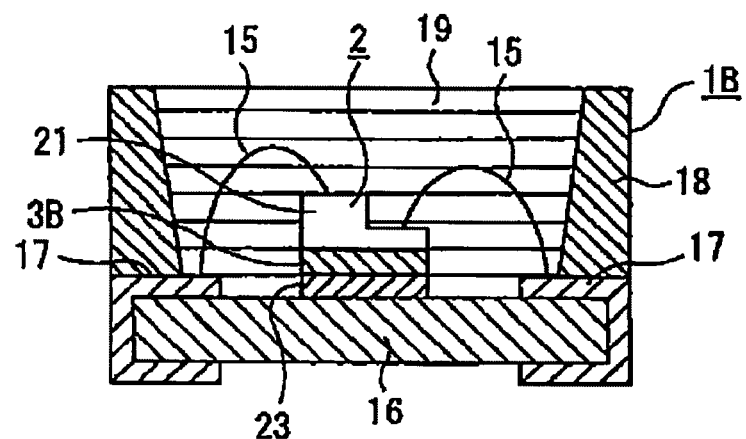
[FIG. 4]

In light emitting device 1B of the present embodiment, as shown in FIG. 4, light-emitting element 2 is surface-mounted on an insulating substrate 16 on which printed wiring 17 is provided. Here, light-emitting element 2 is constituted in the same manner as in embodiment B-1, in which light-emitting layer part 21, composed of a gallium nitride-based semiconductor, is formed on phosphor part 3B and reflective layer 23 is formed on the rear surface of phosphor part 3B. In light-emitting element 2, a p-type semiconductor layer (not shown) and an n-type semiconductor layer (not shown) in light-emitting layer part 21 are connected electrically to printed wirings 17 and 17 via conductive wires 15 and 15, respectively.

A frame-shaped frame 18 surrounding light-emitting element 2 is fixed on the insulating substrate 16. An encapsulating part 19 for encapsulating and protecting light-emitting element 2 is provided inside frame 18.

Thus, since light emitting device 1B in the present embodiment also comprises light-emitting element 2 and phosphor part 3B, which emits light of the desired wavelength after being excited by the light from light-emitting element 2, similarly to Embodiment B-1, light, synthesized from the light from light-emitting element 2 and light from the phosphor, can be obtained. Also, like Embodiment B-1, it becomes possible to reduce the color blurring and color unevenness, enhance the efficiency of extracting light to the outside, and as well as prolong the lifetime, in comparison with conventional devices.

[Embodiment B-3]

Figure 5:
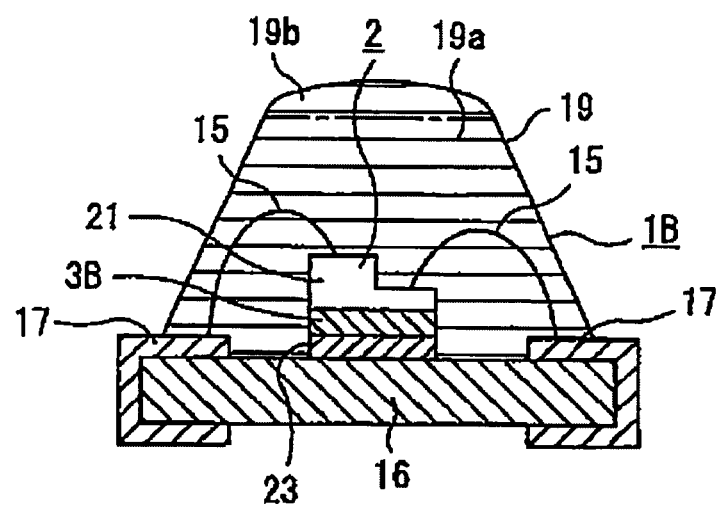
[FIG. 5]

Light emitting device 1B of the present embodiment has a basic structure that is about the same as that in Embodiment B-2. However, frame 18 (see FIG. 4) described in Embodiment B-2 is not used and, as shown in FIG. 5, the shape of encapsulating part 19 is different. Meanwhile, the same components as in embodiment B-2 are designated by the same reference numerals to omit redundant explanations.

Encapsulating part 19 in the present embodiment comprises encapsulating function part 19a in a truncated cone shape for encapsulating light-emitting element 2 and a lens function part 19b in a lens shape to function as a lens at the front end part of encapsulating part 19.

Thus, light emitting device 1B of the present embodiment can reduce the number of components, compared with Embodiment B-2, allowing the miniaturization and weight reduction. Moreover, by providing lens function part 19b functioning as a lens at one part of encapsulating part 19, distribution of light that is superior in directivity can be obtained.

[Embodiment B-4]

Figure 6:
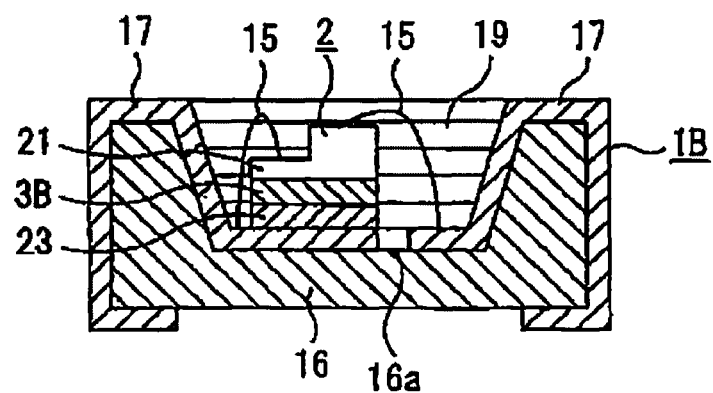
[FIG. 6]

Light emitting device 1B of the present embodiment has a basic structure that is about the same as that in Embodiment B-2. As shown in FIG. 6, it is characterized in that a hollow 16a for accommodating light-emitting element 2 is provided on one surface (upper surface in FIG. 6) of insulating substrate 16, light-emitting element 2 is mounted at the bottom of hollow 16a, and encapsulating part 19 is provided inside hollow 16a. Here, printed wirings 17 and 17, formed on insulating substrate 16, are extended to the bottom of hollow 16a, and connected electrically to light-emitting layer part 21, composed of a gallium nitride-based semiconductor, in light-emitting element 2 via conductive wires 15 and 15. Meanwhile, the same components as in embodiment B-2 are designated by the same reference numerals to omit redundant explanations.

Thus, encapsulating part 19 of light emitting device 1B of the present embodiment is formed by filling hollow 16a, formed on the upper surface of insulating substrate 16, and therefore encapsulating part 19 can be formed without using frame 18 (see FIG. 5) described in Embodiment B-2 or the molding die described in Embodiment B-3. This advantageously simplifies the encapsulating process of light-emitting element 2, compared with Embodiments B-2 and B-3.

[Embodiment B-5]

Figure 7:
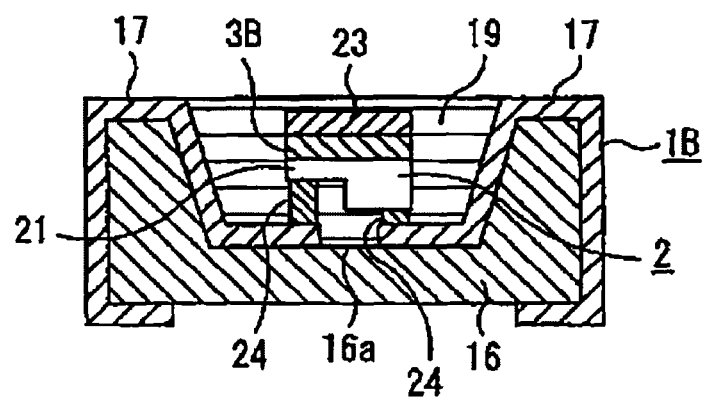
[FIG. 7]

Light emitting device 1B of the present embodiment has a basic structure that is about the same as that in Embodiment B-4. As shown in FIG. 7, it is characterized in that light-emitting element 2 is so-called flip-chip-mounted on insulating substrate 16. That is, light-emitting element 2 is provided with bumps 24 and 24, made of conductive material, on the respective surface side of the p-type semiconductor layer (not shown) and n-type semiconductor layer (not shown) in light-emitting layer part 21, and light-emitting layer part 21 is electrically connected to printed wiring 17 and 17 of insulating substrate 16, with its face down, via bumps 24 and 24. Accordingly, in light-emitting element 2 of the present embodiment, light-emitting layer part 21 is disposed on the side nearest to insulating substrate 16, reflective layer 23 is disposed on the side farthest from insulating substrate 16, and phosphor part 3B is sandwiched by light-emitting layer part 21 and reflective layer 23. Meanwhile, the same components as in embodiment B-4 are designated by the same reference numerals to omit redundant explanations.

In light emitting device 1B of the present embodiment, the light reflected by reflective layer 23 in the downward (back) direction in FIG. 7 is then reflected by the inner circumferential surface of hollow 16a to be emitted in the upward (front) direction in FIG. 7. In this context, it is desirable to provide separately a reflective layer that is made of material whose reflectance is high, in the inner circumferential surface of hollow 16a, except at printed wirings 17 and 17.

Thus, light emitting device 1B of the present embodiment does not require conductive wires 15 and 15 like those in Embodiment B-4 for connecting printed wirings 17 and 17 provided on insulating substrate 16 and light-emitting element 2. This enables improvement in mechanical strength and reliability, compared with Embodiment B-4.

[Embodiment B-6]

Figure 8:
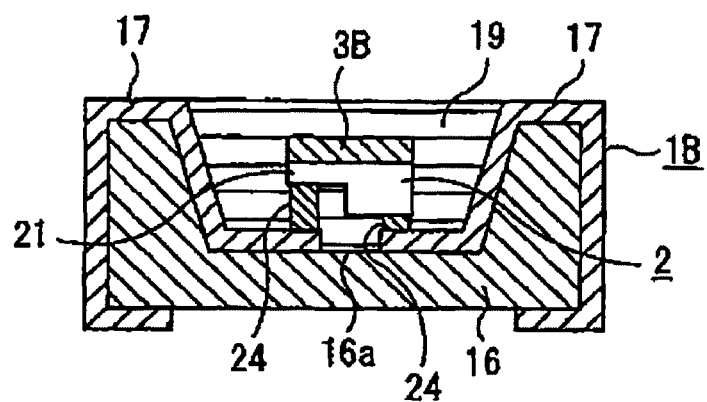
[FIG. 8]

Light emitting device 1B of the present embodiment has a basic structure that is about the same as that in Embodiment B-5. However, as shown in FIG. 8, it is different in that reflective layer 23, described in Embodiment B-5, is not provided. In other words, in light emitting device 1B of the present embodiment, the light emitted from light-emitting layer part 21 and light emitted from phosphor part 3B are emitted in the front direction directly after passing through encapsulating part 19. Meanwhile, the same components as in embodiment B-5 are designated by the same reference numerals to omit redundant explanations.

Thus, light emitting device 1B of the present embodiment can reduce the number of components, compared with Embodiment B-5, which results in facilitating the manufacture thereof.

[Embodiment B-7]

Figure 9:
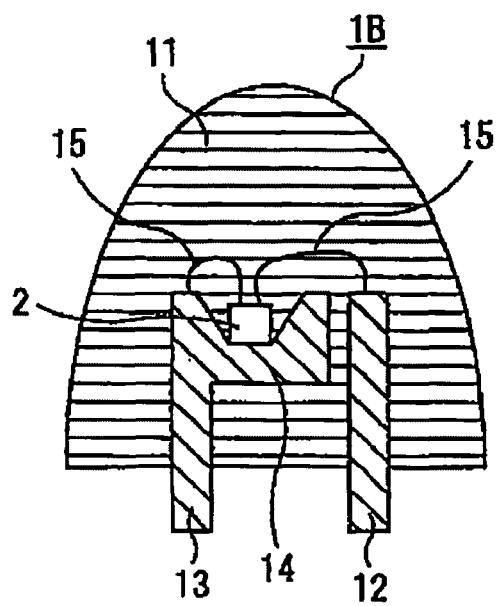
[FIG. 9]

Light emitting device 1B of the present embodiment has a basic structure that is about the same as that in Embodiment B-1. As shown in FIG. 9, it is characterized in that mold part 11, covering light-emitting element 2, is provided and mold part 11 is formed integrally with the phosphor part. Meanwhile, the same components as in Embodiment B-1 are designated by the same reference numerals to omit redundant explanations.

While producing light emitting device 1B of the present embodiment, mold part 11 is formed by a method, for example, in which a product in progress without mold part 11 is immersed in a molding die storing a phosphor part formation liquid and the phosphor part formation liquid (polycondensation product) is cured.

Since mold part 11 and the phosphor part are integrally formed in the present embodiment, it becomes possible to enhance encapsulating properties, transparency, light resistance and heat resistance of mold part 11 and to inhibit crack generation and peeling accompanying a long-term use, by means of using the semiconductor light-emitting device member of the invention as phosphor part, as described later.

[Embodiment B-8]

Figure 10:
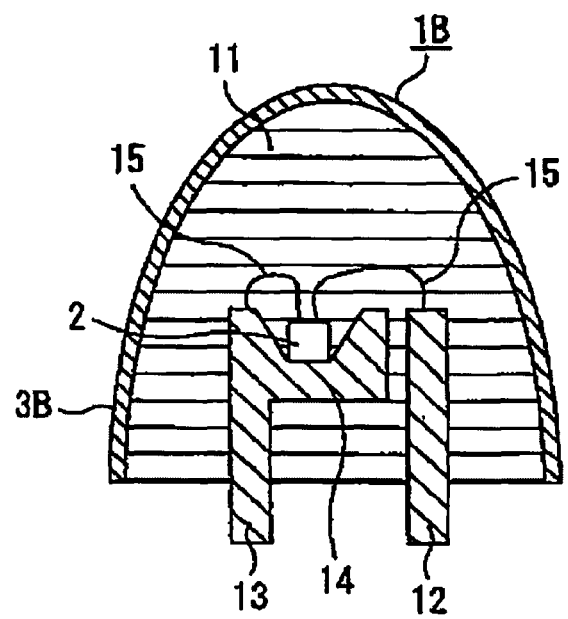
[FIG. 10]

Light emitting device 1B of the present embodiment has a basic structure that is about the same as that in Embodiment B-1. As shown in FIG. 10, it is characterized in that a cup-shaped phosphor part 3B whose rear surface is open is mounted on the outer surface of mold part 11. That is, in the present embodiment, instead of providing phosphor part 3B in light-emitting element 2 like Embodiment B-1, phosphor part 3B in a shape along an outer circumference of mold part 11 is provided. Meanwhile, the same components as in Embodiment B-1 are designated by the same reference numerals to omit redundant explanations.

Phosphor part 3B in the present embodiment may be formed as a thin film by the method of curing the phosphor part formation liquid (polycondensation product) as described in Embodiment B-7. Otherwise, it may be formed by mounting a member, in which a solid phosphor part is molded in a cup-shape in advance, on mold part 11.

Thus, in light emitting device 1B of the present embodiment, the amount of the material used for the phosphor part can be reduced, compared with the case of light emitting device 1B of Embodiment B-7, in which the whole mold part 11 is formed integrally with the phosphor part, as well as cost reduction is achieved.

[Embodiment B-9]

Figure 11:
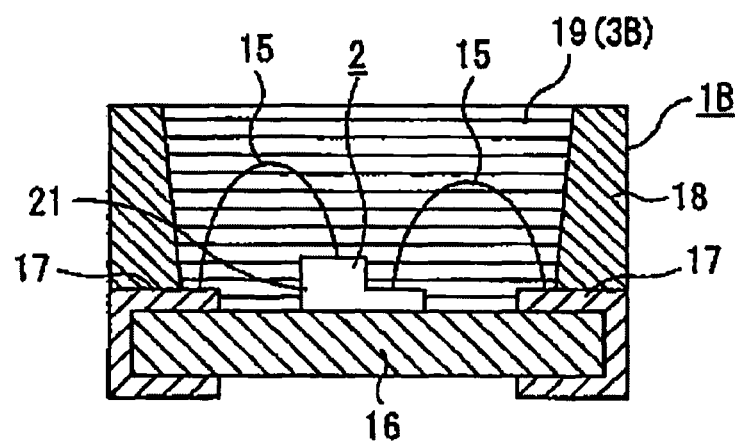
[FIG. 11]

Light emitting device 1B of the present embodiment has a basic structure that is about the same as that in Embodiment B-2. As shown in FIG. 11, it is characterized in that frame-shaped frame 18, surrounding light-emitting element 2 on one surface (upper surface in FIG. 11) of insulating substrate 16, is provided and encapsulating part 19 inside frame 18 is formed of a phosphor part same as that of phosphor part 3B described in Embodiment B-2. Meanwhile, the same components as in embodiment B-2 are designated by the same reference numerals to omit redundant explanations.

Since encapsulating part 19 is formed of the phosphor part in the present embodiment, it becomes possible to enhance encapsulating properties, transparency, light resistance, heat resistance and the like of encapsulating part 19 and to inhibit crack generation and peeling accompanying a long-term use, by means of using the semiconductor light-emitting device member of the invention as phosphor part, as described later.

[Embodiment B-10]

Figure 12:
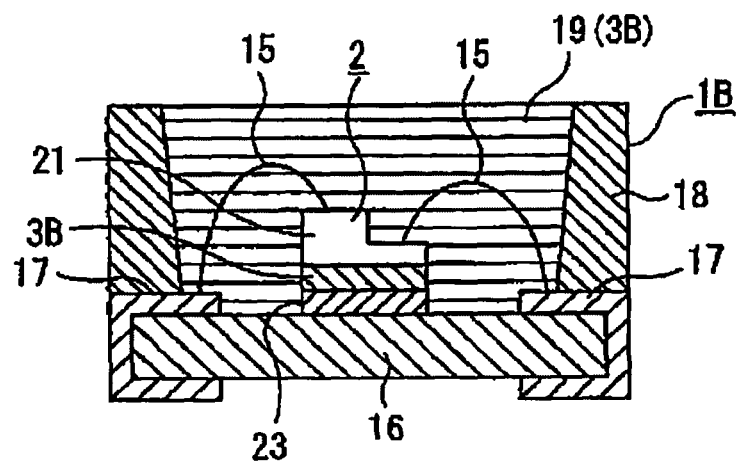
[FIG. 12]

Light emitting device 1B of the present embodiment has a basic structure that is about the same as that in Embodiment B-2. As shown in FIG. 12, it is characterized in that a frame-shaped frame 18, surrounding light-emitting element 2 on one surface (upper surface in FIG. 12) of insulating substrate 16, is provided and encapsulating part 19 inside frame 18 is formed of a phosphor part same as that of phosphor part 3B described in Embodiment B-2. Meanwhile, the same components as in embodiment B-2 are designated by the same reference numerals to omit redundant explanations.

Since encapsulating part 19 is formed of the phosphor part in the present embodiment, it becomes possible to enhance encapsulating properties, transparency, light resistance, heat resistance and the like of encapsulating part 19 and to inhibit crack generation and peeling accompanying a long-term use, by means of using the semiconductor light-emitting device member of the invention as phosphor part, as described later.

Furthermore, in the present embodiment, phosphor part 3B is formed on the rear surface of light-emitting layer part 21 in light-emitting element 2, and encapsulating part 19 covering light-emitting element 2 is formed of a phosphor part. This results in that the phosphor parts are present in all directions from light-emitting layer part 21 of light-emitting element 2. This structure leads to the advantageous effect that excitation and emission of the phosphor parts can be performed more efficiently than Embodiment B-9.

[Embodiment B-11]

Figure 13:
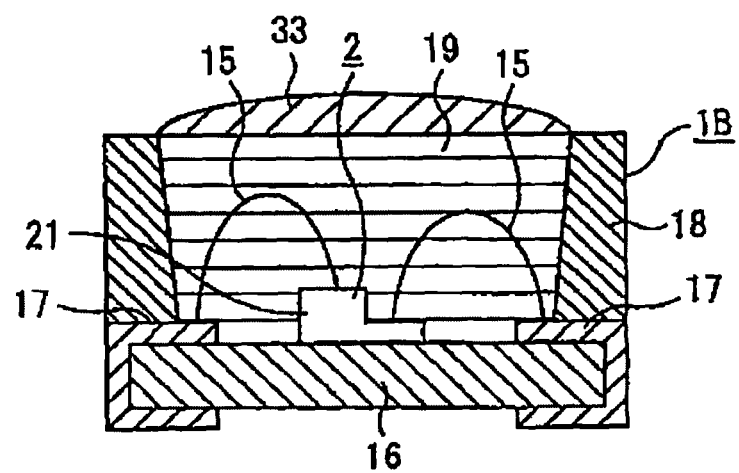
[FIG. 13]

Light emitting device 1B of the present embodiment has a basic structure that is about the same as that in Embodiment B-2. As shown in FIG. 13, it is characterized in that phosphor part 33 formed in advance in a lens shape is disposed on the upper surface of encapsulating part 19, which is made of light-transmissible material. Here, phosphor part 33 is made of the same material as that of phosphor part 3B described in Embodiment B-2 and is used to emit light of the desired wavelength after being excited by the light from light-emitting element 2. Meanwhile, the same components as in embodiment B-2 are designated by the same reference numerals to omit redundant explanations.

Thus, in light emitting device 1B of the present embodiment, phosphor part 33 performs not only function of wavelength conversion, but also of a lens. This lens effect enables the directivity control of the emission.

[Embodiment B-12]

Figure 14:
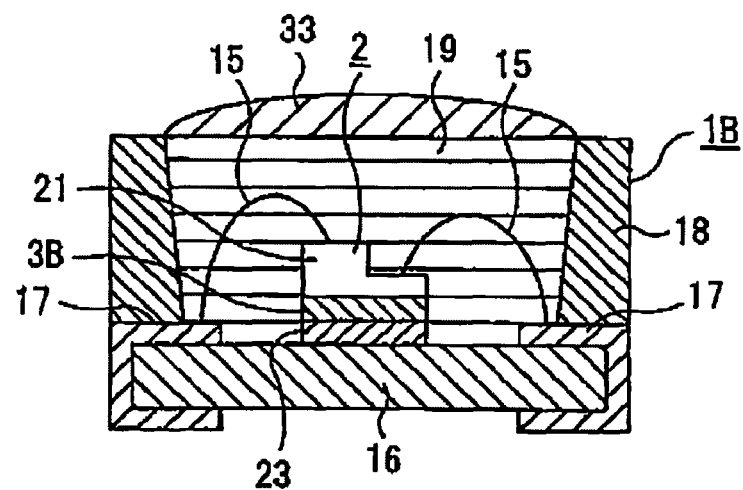
[FIG. 14]

Light emitting device 1B of the present embodiment has a basic structure that is about the same as that in Embodiment B-2. As shown in FIG. 14, it is characterized in that phosphor part 33 formed in advance in a lens shape is disposed on the upper surface of encapsulating part 19, which is made of light-transmissible material. Here, phosphor part 33 is made of the same material as that of phosphor part 3B described in Embodiment B-2 and is used to emit light of the desired wavelength after being excited by the light from light-emitting element 2. Meanwhile, the same components as in embodiment B-2 are designated by the same reference numerals to omit redundant explanations.

Thus, in light emitting device 1B of the present embodiment, phosphor part 33 performs not only function of wavelength conversion, but also of a lens. This lens effect enables the directivity control of the emission. Furthermore, in the present embodiment, phosphor part 3B is formed on the rear surface of light-emitting layer part 21 in light-emitting element 2. This structure leads to the advantageous effect that excitation and emission of the phosphor parts can be performed more efficiently than Embodiment B-11.

[Embodiment B-13]

Figure 15:
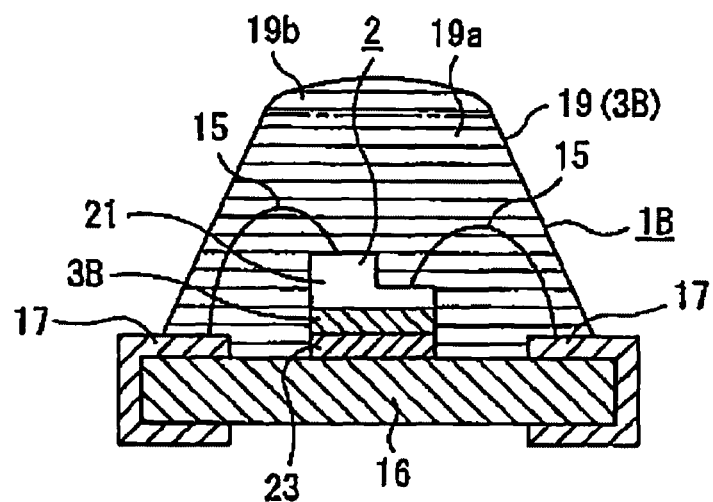
[FIG. 15]

Light emitting device 1B of the present embodiment has a basic structure that is about the same as that in Embodiment B-3. However, as shown in FIG. 15, it is characterized in that encapsulating part 19, covering light-emitting element 2, is provided on the upper surface side of insulating substrate 16, and is formed of the phosphor part. Here, encapsulating part 19 of the present embodiment comprises, like Embodiment B-3, encapsulating function part 19a in a truncated cone shape for encapsulating light-emitting element 2 and a lens function part 19*b* in a lens shape to function as a lens at the front end part of encapsulating part 19. Meanwhile, the same components as in Embodiment B-3 are designated by the same reference numerals to omit redundant explanations.

Thus, in light emitting device 1B of the present embodiment, encapsulating part 19 has functions of, not only encapsulating/protecting light-emitting element 2, but also converting the wavelength of the light from light-emitting element 2 and being a lens to control the directivity of emission. Also, the weather resistance of encapsulating part 19 can be enhanced and thus the lifetime can be prolonged. Furthermore, in the present embodiment, phosphor part 3B is formed on the rear surface of light-emitting layer part 21 in light-emitting element 2, and encapsulating part 19, covering light-emitting element 2, is formed of a phosphor part. This results in that the phosphor parts are present in all directions from light-emitting layer part 21 of light-emitting element 2. This structure leads to the advantageous effect that excitation and emission of the phosphor parts can be performed more efficiently than Embodiment B-12.

[Embodiment B-14]

Figure 16:
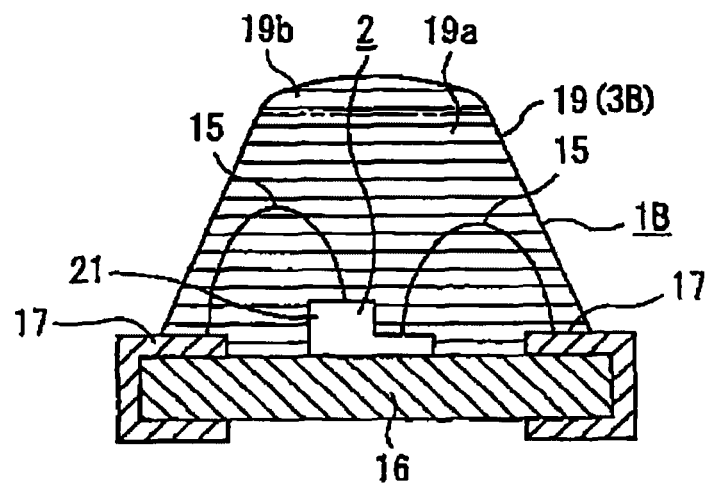
[FIG. 16]

Light emitting device 1B of the present embodiment has a basic structure that is about the same as that in Embodiment B-3. However, as shown in FIG. 16, it is characterized in that encapsulating part 19, covering light-emitting element 2 is provided on one surface (the upper surface in FIG. 16) side of insulating substrate 16, and is formed of phosphor part 3B. Here, encapsulating part 19 of the present embodiment comprises, like Embodiment B-3, encapsulating function part 19*a* in a truncated cone shape for encapsulating light-emitting element 2 and a lens function part 19*b* in a lens shape to function as a lens at the front end part of encapsulating part 19. Meanwhile, the same components as in Embodiment B-3 are designated by the same reference numerals to omit redundant explanations.

Thus, in light emitting device 1B of the present embodiment, encapsulating part 19 has functions of, not only encapsulating/protecting light-emitting element 2, but also converting the wavelength of the light from light-emitting element 2 and being a lens to control the directivity of emission. Also, the weather resistance of encapsulating part 19 can be enhanced and thus the lifetime can be prolonged.

[Embodiment B-15]

Figure 17:
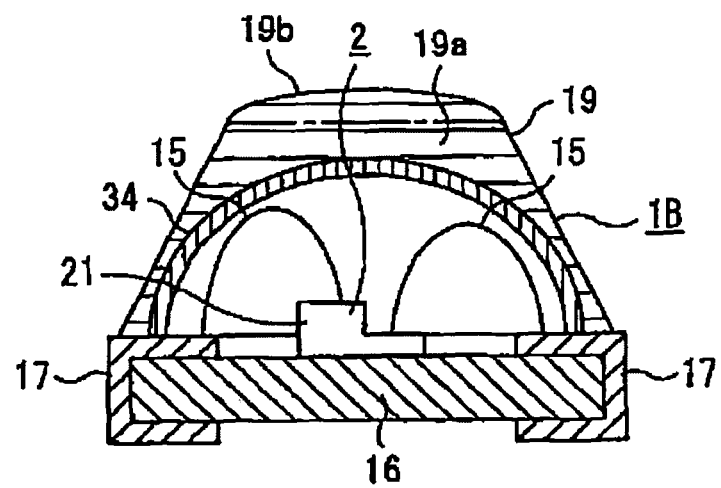
[FIG. 17]

Light emitting device 1B of the present embodiment has a basic structure that is about the same as that in Embodiment B-3. As shown in FIG. 17, it is characterized in that dome-shaped phosphor part 34 covering light-emitting element 2 is disposed on the upper surface side of insulating substrate 16 and encapsulating part 19, made of light-transmissible resin, is formed on the outer surface side of phosphor part 34. Here, encapsulating part 19 of the present embodiment comprises, like Embodiment B-3, encapsulating function part 19*a* for encapsulating light-emitting element 2 and a lens function part 19*b* in a lens shape to function as a lens at the front end part of encapsulating part 19. Meanwhile, the same components as in Embodiment B-3 are designated by the same reference numerals to omit redundant explanations.

Thus, in light emitting device 1B of the present embodiment, the amount of the material used for phosphor part 34 can be reduced, compared with Embodiments B-13 and B-14. In addition, since dome-shaped phosphor part 34 covering light-emitting element 2 is disposed in the present embodiment, the degradation of light-emitting element 2, due to moisture from outside or the like, can be prevented more reliably, by means of using the semiconductor light-emitting device member of the invention as phosphor part, as described later. This enables the lifetime to be prolonged.

[Embodiment B-16]

Figure 18:
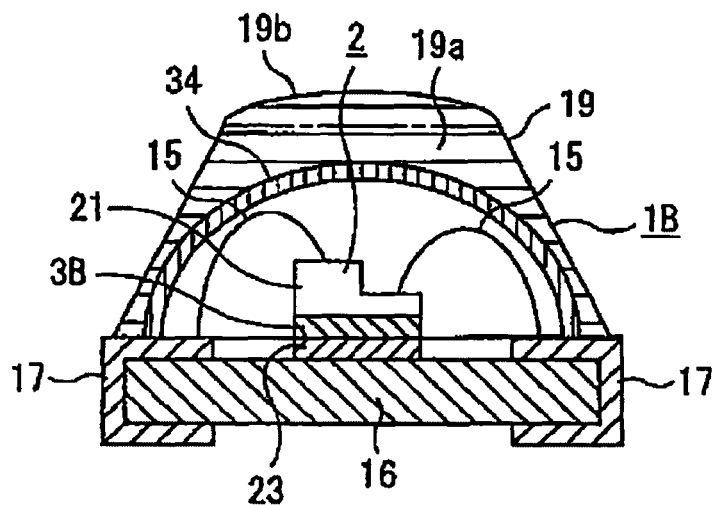
[FIG. 18]

Light emitting device 1B of the present embodiment has a basic structure that is about the same as that in Embodiment B-3. As shown in FIG. 18, it is characterized in that dome-shaped phosphor part 34 covering light-emitting element 2 is disposed on the upper surface side of insulating substrate 16 and encapsulating part 19 is formed on the outer surface side of phosphor part 34. Here, encapsulating part 19 of the present embodiment comprises, like Embodiment B-3, encapsulating function part 19*a* for encapsulating light-emitting element 2 and a lens function part 19*b* in a lens shape to function as a lens at the front end part of encapsulating part 19. Meanwhile, the same components as in Embodiment B-3 are designated by the same reference numerals to omit redundant explanations.

Thus, in light emitting device 1B of the present embodiment, the amount of the material used for phosphor part 34 can be reduced, compared with Embodiments B-13 and B-14. In addition, since dome-shaped phosphor part 34 covering light-emitting element 2 is disposed in the present embodiment, the degradation of light-emitting element 2, due to moisture from outside or the like, can be prevented more reliably, by means of using the semiconductor light-emitting device member of the invention as phosphor part, as described later. This enables the lifetime to be prolonged. Furthermore, in the present embodiment, phosphor part 3B is formed on the rear surface of light-emitting layer part 21 in light-emitting element 2, and encapsulating part 19, covering light-emitting element 2, is formed of a phosphor part. This results in that the phosphor parts are present in all directions from light-emitting layer part 21 of light-emitting element 2. This structure leads to the advantageous effect that excitation and emission of the phosphor parts can be performed more efficiently than Embodiment B-15.

[Embodiment B-17]

Figure 19:
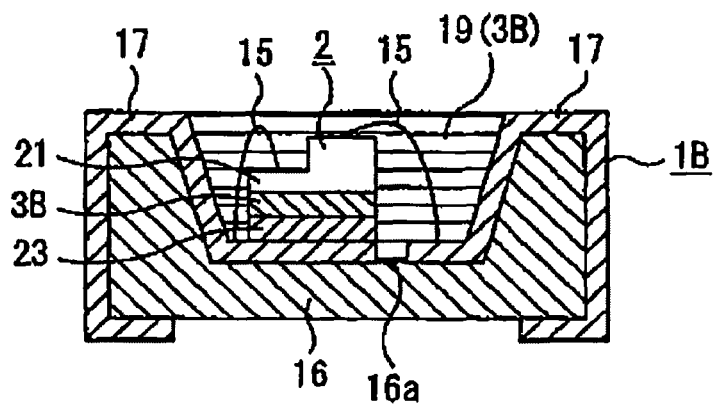
[FIG. 19]

Light emitting device 1B of the present embodiment has a basic structure that is about the same as that in Embodiment B-4. As shown in FIG. 19, it is characterized in that encapsulating part 19 for encapsulating light-emitting element 2, disposed at the bottom of hollow 16*a* formed on one surface (upper surface in FIG. 19) of insulating substrate 16, is provided and that encapsulating part 19 is formed of the phosphor part. Here, the phosphor part is used to emit light of the desired wavelength after being excited by the light from light-emitting element 2, just like phosphor part 3B described in Embodiment B-1. Meanwhile, the same components as in embodiment B-4 are designated by the same reference numerals to omit redundant explanations.

Since encapsulating part 19 is formed of the phosphor part in light emitting device 1B of the present embodiment, it becomes possible to enhance encapsulating properties, transparency, light resistance, heat resistance and the like of encapsulating part 19 and to inhibit crack generation and peeling accompanying a long-term use, by means of using the semiconductor light-emitting device member of the invention as phosphor part, as described later. Furthermore, in the present embodiment, phosphor part 3B is formed on the rear surface of light-emitting layer part 21 in light-emitting element 2, and encapsulating part 19, covering light-emitting element 2, is formed of phosphor part 3B. This results in that the phosphor parts are present in all directions from light-emitting layer part 21 of light-emitting element 2. This structure leads to the advantageous effect that excitation and emission of the phosphor parts can be performed more efficiently than Embodiment B-15.

[Embodiment B-18]

Figure 20:
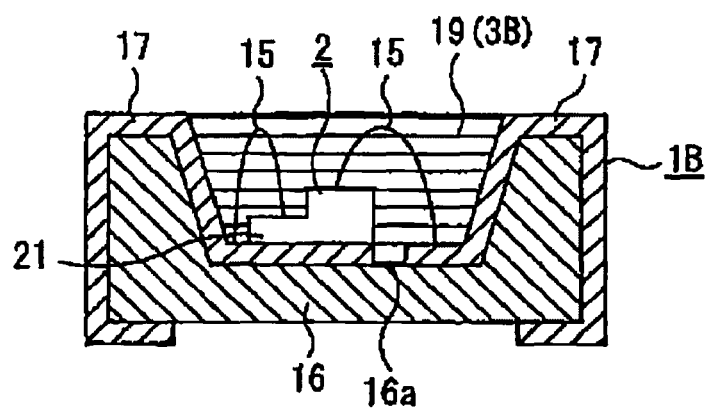
[FIG. 20]

Light emitting device 1B of the present embodiment has a basic structure that is about the same as that in Embodiment B-4. As shown in FIG. 20, it is characterized in that encapsulating part 19 for encapsulating light-emitting element 2, disposed at the bottom of hollow 16a formed on one surface (upper surface in FIG. 20) of insulating substrate 16, is provided and that encapsulating part 19 is formed of phosphor part 3B. Here, that phosphor part 3B is used to emit light of the desired wavelength after being excited by the light from light-emitting element 2, just like phosphor part 3B described in Embodiment B-1. Meanwhile, the same components as in embodiment B-4 are designated by the same reference numerals to omit redundant explanations.

Since encapsulating part 19 is formed of the phosphor part in light emitting device 1B of the present embodiment, it becomes possible to enhance encapsulating properties, transparency, light resistance, heat resistance and the like of encapsulating part 19 and to inhibit crack generation and peeling accompanying a long-term use, by means of using the semiconductor light-emitting device member of the invention as phosphor part 3B, as described later.

[Embodiment B-19]

Figure 21:
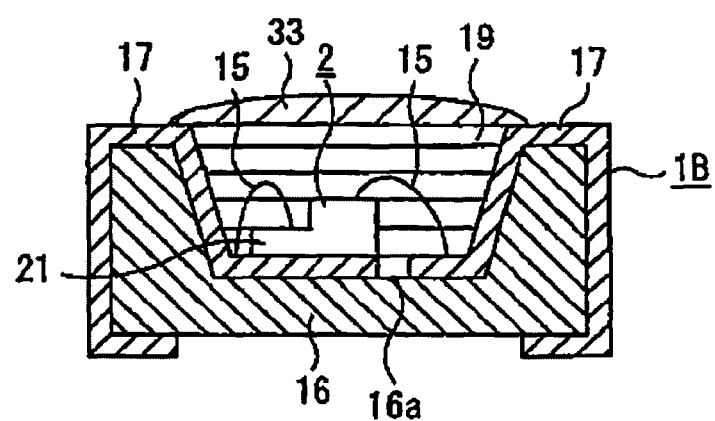
[FIG. 21]

Light emitting device 1B of the present embodiment has a basic structure that is about the same as that in Embodiment B-4. As shown in FIG. 21, it is characterized in that phosphor part 33 formed in a lens shape in advance is disposed on the upper surface (which is, the light extraction surface) of encapsulating part 19. Here, that phosphor part 33 is used to emit light of the desired wavelength after being excited by the light from light-emitting element 2, just like phosphor part 3B described in Embodiment B-1. Meanwhile, the same components as in embodiment B-4 are designated by the same reference numerals to omit redundant explanations.

Thus, in light emitting device 1B of the present embodiment, phosphor part 33 performs not only function of wavelength conversion, but also of a lens. This lens effect enables the directivity control of the emission.

[Embodiment B-20]

Figure 22:
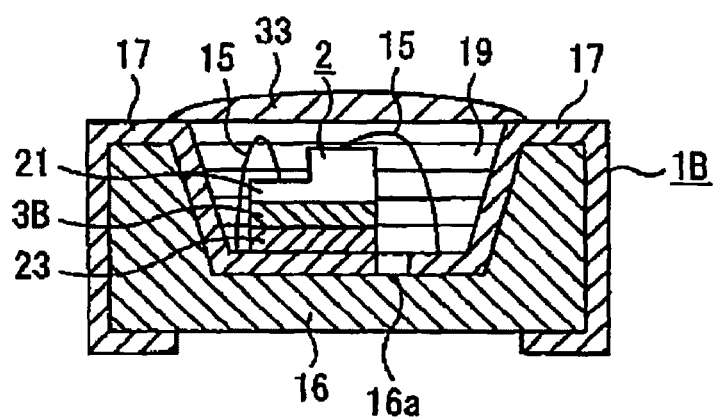
[FIG. 22]

Light emitting device 1B of the present embodiment has a basic structure that is about the same as that in Embodiment B-4. As shown in FIG. 22, it is characterized in that phosphor part 33 formed in a lens shape in advance is disposed on the upper surface (which is, the light extraction surface) of encapsulating part 19. Here, that phosphor part 33 is used to emit light of the desired wavelength after being excited by the light from light-emitting element 2, just like phosphor part 3B described in Embodiment B-1. Meanwhile, the same components as in embodiment B-4 are designated by the same reference numerals to omit redundant explanations.

Thus, in light emitting device 1B of the present embodiment, phosphor part 33 performs not only function of wavelength conversion, but also of a lens. This lens effect enables the directivity control of the emission. Furthermore, in the present embodiment, since phosphor part 3B is formed also on the rear surface of light-emitting layer part 21 in light-emitting element 2, the excitation and emission of the phosphor part is performed more efficiently than Embodiment B-19.

[Embodiment B-21]

Figure 23:
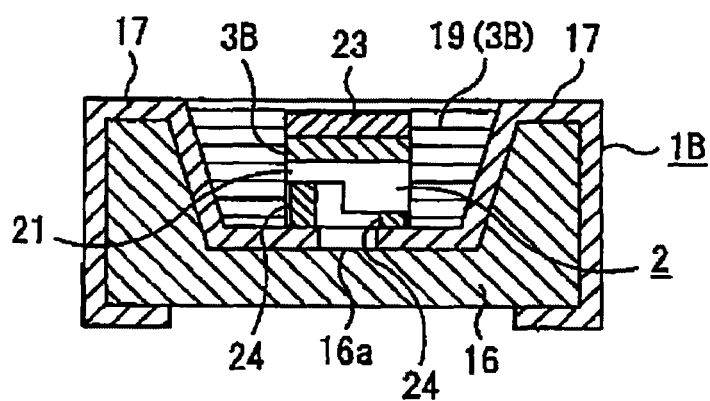
[FIG. 23]
Figure 24:
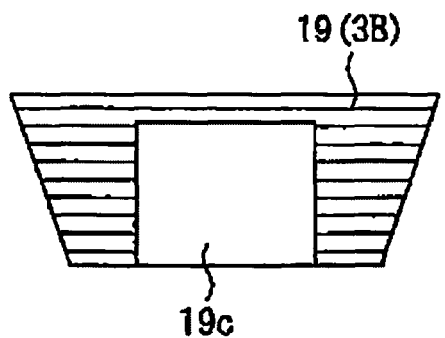
[FIG. 24]

Light emitting device 1B of the present embodiment has a basic structure that is about the same as that in Embodiment B-5. As shown in FIG. 23, it is characterized in that encapsulating part 19 for encapsulating light-emitting element 2 disposed at the bottom of hollow 16a formed on one surface (upper surface in FIG. 23) of insulating substrate 16 is provided and that encapsulating part 19 is formed of phosphor part 3B. Encapsulating part 19 is, as shown in FIG. 24, inserted into hollow 16a of insulating substrate 16 on which light-emitting element 2 is mounted, after it is processed in advance to have the outer circumferential, the shape of which corresponds to hollow 16a, and recess 19c at a position corresponding to light-emitting element 2 for accommodating light-emitting element 2. This structure enables the encapsulating process to be simplified. Moreover, phosphor part 3B, constituting encapsulating part 19, is used to emit light of the desired wavelength after being excited by the light from light-emitting element 2, just like phosphor part 3B described in Embodiment B-1. Meanwhile, the same components as in embodiment B-5 are designated by the same reference numerals to omit redundant explanations.

Since encapsulating part 19 is formed of the phosphor part in light emitting device 1B of the present embodiment, it becomes possible to enhance encapsulating properties, transparency, light resistance, heat resistance and the like of encapsulating part 19 and to inhibit crack generation and peeling accompanying a long-term use, by means of using the semiconductor light-emitting device member of the invention as phosphor part 3B, as described later. In addition, in the present embodiment, light emitted in the front direction from light-emitting layer part 21 of light-emitting element 2 is once reflected by reflective layer 23 toward the inner bottom surface of hollow 16a. Therefore, if reflective layers are provided on the inner bottom surface and inner circumferential surface of hollow 16a, the reflected light will be reflected further by that inner bottom surface and inner circumferential surface, to be emitted in the front direction. With this structure, length of the optical path can be extended, and therefore, the advantageous effect of more efficient excitation and emission by phosphor part 3B can be realized.

[Embodiment B-22]

Figure 25:
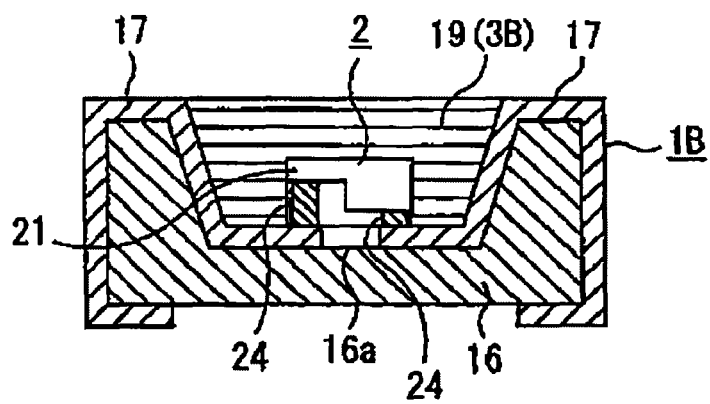
[FIG. 25]
Figure 26:
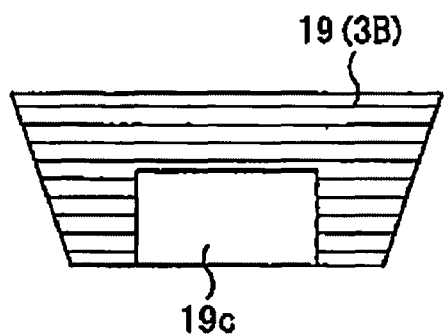
[FIG. 26]

Light emitting device 1B of the present embodiment has a basic structure that is about the same as that in Embodiment B-5. As shown in FIG. 25, it is characterized in that encapsulating part 19 for encapsulating light-emitting element 2 disposed at the bottom of hollow 16a formed on one surface (upper surface in FIG. 25) of insulating substrate 16 is provided and that encapsulating part 19 is formed of phosphor part 3B. Encapsulating part 19 is, as shown in FIG. 26, inserted into hollow 16a of insulating substrate 16 on which light-emitting element 2 is mounted, after it is processed in advance to have the outer circumferential, the shape of which corresponds to hollow 16a, and a recess 19c at a position corresponding to light-emitting element 2, for accommodating light-emitting element 2. This structure enables the encapsulating process to be simplified. Moreover, phosphor part 3B, constituting encapsulating part 19, is used to emit light of the desired wavelength after being excited by the light from light-emitting element 2, just like phosphor part 3B described in Embodiment B-1. Meanwhile, the same components as in embodiment B-5 are designated by the same reference numerals to omit redundant explanations.

Since encapsulating part 19 is formed of phosphor part 3B in light emitting device 1B of the present embodiment, it becomes possible to enhance encapsulating properties, transparency, light resistance, heat resistance and the like of encapsulating part 19 and to inhibit crack generation and peeling accompanying a long-term use, by means of using the semiconductor light-emitting device member of the invention as phosphor part 3B, as described later.

[Embodiment B-23]

Figure 27:
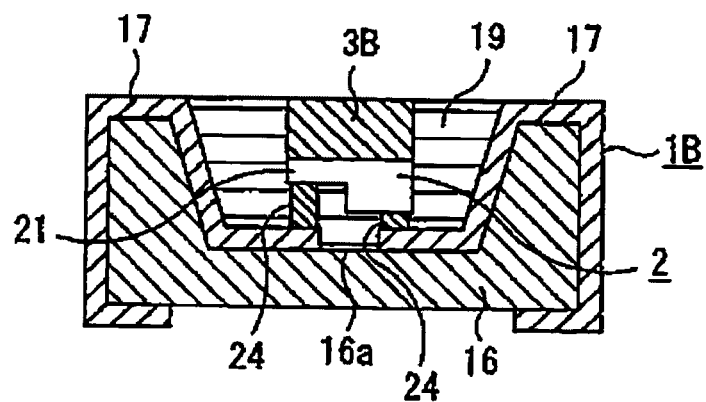
[FIG. 27]

Light emitting device 1B of the present embodiment has a basic structure that is about the same as that in Embodiment B-6. As shown in FIG. 27, it is characterized in that phosphor part 3B that is processed in a rod-shape in advance is disposed on the upper surface of light-emitting element 2. Around light-emitting element 2 and phosphor part 3B, encapsulating part 19, made of light-transmissible material, is formed. As regards phosphor part 3B, one end surface (lower end surface in FIG. 27) thereof is in close contact with light-emitting layer part 21 of light-emitting element 2, and another end surface (upper end surface in FIG. 27) thereof is exposed. Meanwhile, the same components as in Embodiment B-6 are designated by the same reference numerals to omit redundant explanations.

Figure 28:
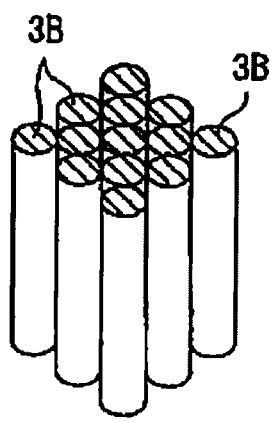
[FIG. 28]

Thus, in light emitting device 1B of the present embodiment, since phosphor part 3B, whose one end surface is in close contact with light-emitting layer part 21 of light-emitting element 2, is formed in a rod-shape, the light emitted from light-emitting layer part 21 can be absorbed efficiently into phosphor part 3B through the one end surface of phosphor part 3B. Then, phosphor part 3B emits light, when excited by the absorbed light, to the outside efficiently through the above another end surface, of phosphor part 3B. In the present embodiment, only one phosphor part 3B, formed to be in a rod-shape having a relatively large diameter, is used. Or otherwise, a plurality of phosphor parts 3B, formed to be like a bundle of fibers having relatively small diameters respectively, can be disposed, as shown in FIG. 28. In addition, the sectional shape of phosphor part 3B is not limited to a round shape, but may be, for example, a quadrangular shape, or other, as a matter of course.

[Embodiment B-24]

Figure 29:
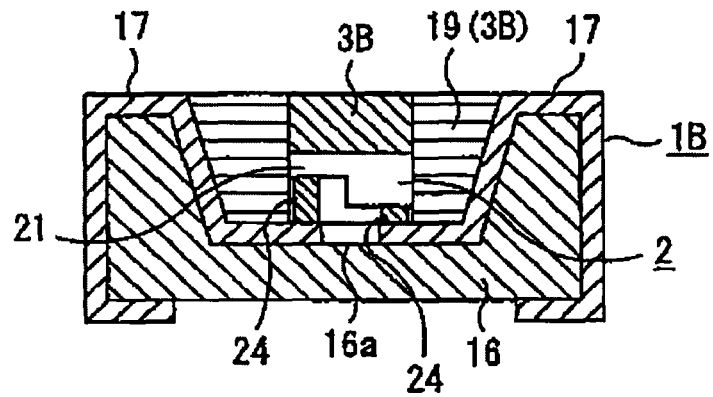
[FIG. 29]
Figure 30:
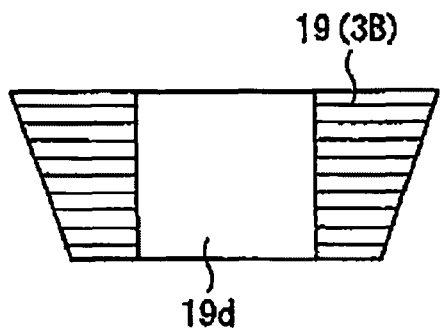
[FIG. 30]

Light emitting device 1B of the present embodiment has a basic structure that is about the same as that in Embodiment B-23. As shown in FIG. 29, it is characterized in that the encapsulating part 19, provided inside hollow 16a of insulating substrate 16, is provided and that encapsulating part 19 is formed of phosphor part 3B. Encapsulating part 19 is, as shown in FIG. 30, inserted into hollow 16a of insulating substrate 16 on which light-emitting element 2 is mounted, after it is processed in advance to have outer circumferential, the shape of which corresponds to hollow 16a, and a through-hole 19d at a position corresponding to light-emitting element 2 for accommodating light-emitting element 2. This structure enables the encapsulating process to be simplified. Moreover, phosphor part 3B, constituting encapsulating part 19, is used to emit light of the desired wavelength after being excited by the light from light-emitting element 2, just like phosphor part 3B described in Embodiment B-1. Meanwhile, the same components as in Embodiment B-23 are designated by the same reference numerals to omit redundant explanations.

Figure 31:
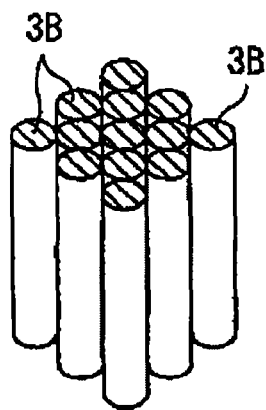
[FIG. 31]

Thus, in light emitting device 1B of the present embodiment, since encapsulating part 19 is also formed of phosphor part 3B, it becomes possible to prolong the lifetime and enhance in efficiency of the emission. Though, in the present embodiment, only one phosphor part 3B, formed to be in a rod-shape having a relatively large diameter, is used, a plurality of phosphor parts 3B, formed to be like a bundle of fibers having relatively small diameters, can be disposed, as shown in FIG. 31. In addition, the sectional shape of phosphor part 3B is not limited to a round shape, but may be, for example, a quadrangular shape, or other, as a matter of course.

[Embodiment B-25]

Figure 32:
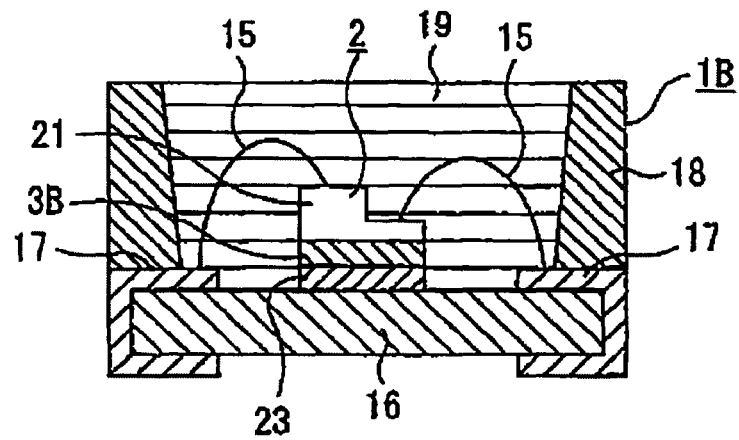
[FIG. 32]

Light emitting device 1B of the present embodiment has a basic structure that is about the same as that in Embodiment B-2. As shown in FIG. 32, it is characterized in that frame 18 is disposed on one surface (the upper surface in FIG. 32) of insulating substrate 16, light-emitting layer part 21 in light-emitting element 2 is based on AlGaN and emits near ultraviolet light, and phosphor powder (for example, powder of a YAG:$Ce^{3+}$ phosphor emitting yellow light after being excited by near ultraviolet light) is dispersed in a light-transmissible material which is used as encapsulating part 19 disposed inside frame 18. In the present embodiment, fluorophosphates-based glass (for example, $P_2O_5.AlF_3.MgF.CaF_2.SrF_2.BaCl_2$:$Eu^{2+}$ emitting blue light after being excited by near ultraviolet light) is used as phosphor part 3B. Meanwhile, the same components as in embodiment B-2 are designated by the same reference numerals to omit redundant explanations.

Thus, in light emitting device 1B of the present embodiment, since a phosphor powder that emits light after being excited by the light from light-emitting element 2 is dispersed in encapsulating part 19, light output of light synthesized from the light emitted from light-emitting element 2, light emitted from phosphor part 3B and light emitted from the phosphor powder is obtained.

Consequently, by selecting material that emits near ultraviolet light as material of light-emitting layer part 21 in light-emitting element 2, both phosphor part 3B and the phosphor powder in encapsulating part 19 will be excited by the light emitted from light-emitting element 2 and emit lights intrinsic to each of them. Thus, the light synthesized from those lights can be obtained.

In the present embodiment, blue light is emitted from phosphor part 3B and yellow light is emitted from the phosphor powder, so as to obtain white light, which is different from both emission colors.

Light-emitting materials for existing phosphor particles in the phosphor part or for existing phosphor powders are limited, and therefore sometimes the desired light color may not be obtainable by using either the phosphor powder or phosphor part. The present embodiment is very effective in such a case. That is, even if the desired properties of light appearance cannot be obtained from phosphor part 3B alone, light emitting device 1B of the desired properties of light appearance can be realized just by using a phosphor powder having suitable, complementary light-appearance properties, which lacks in phosphor part 3B. In addition, the emission color of the phosphor powder is set different from that of phosphor part 3B in the present embodiment, but the emission color of the phosphor powder can be set identical to that of phosphor part 3B. With that configuration, it becomes possible to increase the light output and enhance the emission efficiency because the light emitted from the phosphor powder is superimposed on the light emitted from phosphor part 3B. In this context, when the emission colors of phosphor part 3B and the phosphor powder are set to be approximately identical, for example, by using $P_2O_5.SrF_2.BaF_2$:$Eu^{3+}$ emitting red light, as phosphor particles of phosphor part 3B, and $Y_2O_2S$:$Eu^{3+}$ emitting red light, as phosphor particles of phosphor part 3B as the phosphor powder, an efficient red emission light can be obtained. This combination of phosphor part 3B and the phosphor powder is only an example, and any other combination may naturally be adopted.

[Embodiment B-26]

Figure 33:
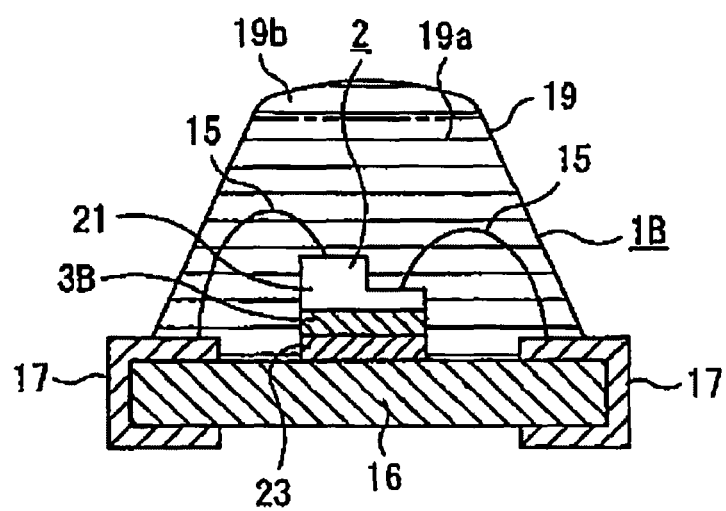
[FIG. 33]

Light emitting device 1B of the present embodiment has a basic structure that is about the same as that in Embodiment B-3. As shown in FIG. 33, it is characterized in that encapsulating part 19 for encapsulating light-emitting element 2 is provided at one side (the upper side in FIG. 33) of insulating substrate 16, light-emitting layer part 21 in light-emitting element 2 is based on AlGaN and emits near ultraviolet light, and phosphor powder (for example, powder of a YAG:$Ce^{3+}$ phosphor emitting yellow light after being excited by near ultraviolet light) is dispersed in a light-transmissible material which is used as encapsulating part 19, and encapsulating part 19 functions as a phosphor part. In the present embodiment, fluorophosphates-based glass (for example, $P_2O_5.AlF_3.MgF.CaF_2.SrF_2.BaCl_2:Eu^{2+}$ emitting blue light after being excited by near ultraviolet light) is used as phosphor particles in phosphor part 3B. Meanwhile, the same components as in Embodiment B-3 are designated by the same reference numerals to omit redundant explanations.

Thus, in light emitting device 1B of the present embodiment, just as in Embodiment B-25, since a phosphor powder that emits light after being excited by the light from light-emitting element 2 is dispersed in encapsulating part 19, light output of light synthesized from the light emitted from light-emitting element 2, light emitted from phosphor part 3B and light emitted from the phosphor powder is obtained. Consequently, just as in Embodiment B-25, by selecting material that emits near ultraviolet light as material of light-emitting layer part 21 in light-emitting element 2, both phosphor part 3B and the phosphor powder in encapsulating part 19 will be excited by the light emitted from light-emitting element 2 and emit lights intrinsic to each of them. And the light synthesized from those lights can be obtained. In addition, the emission color of the phosphor powder is set different from that of phosphor part 3B also in the present embodiment, but the emission color of the phosphor powder can be set identical to that of phosphor part 3B. With that configuration, it becomes possible to increase the light output and enhance the emission efficiency because the light emitted from the phosphor powder is superimposed on the light emitted from phosphor part 3B.

[Embodiment B-27]

Figure 34:
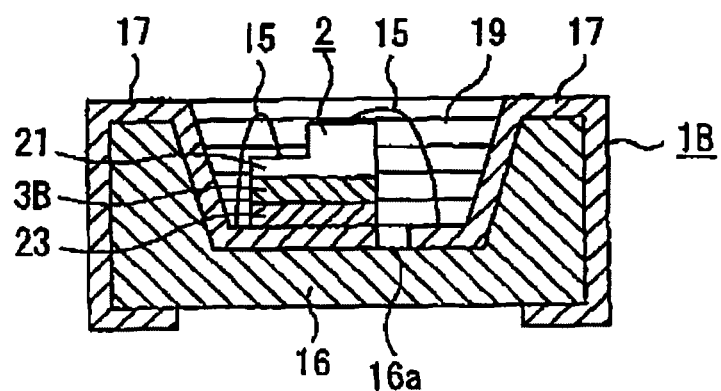
[FIG. 34]

Light emitting device 1B of the present embodiment has a basic structure that is about the same as that in Embodiment B-4. As shown in FIG. 34, it is characterized in that encapsulating part 19 for encapsulating light-emitting element 2, which fills up hollow 16a formed on the upper surface of insulating substrate 16, is provided, light-emitting layer part 21 in light-emitting element 2 is based on AlGaN and emits near ultraviolet light, and phosphor powder (for example, powder of a YAG:$Ce^{3+}$ phosphor emitting yellow light after being excited by near ultraviolet light) is dispersed in a light-transmissible material which is used as encapsulating part 19, and encapsulating part 19 functions as a phosphor part. In the present embodiment, fluorophosphates-based glass (for example, $P_2O_5.AlF_3.MgF.CaF_2.SrF_2.BaCl_2:Eu^{2+}$ emitting blue light after being excited by near ultraviolet light) is used as phosphor particles in phosphor part 3B. Meanwhile, the same components as in embodiment B-4 are designated by the same reference numerals to omit redundant explanations.

Thus, in light emitting device 1B of the present embodiment, just as in Embodiment B-25, since a phosphor powder that emits light after being excited by the light from light-emitting element 2 is dispersed in encapsulating part 19, light output of light synthesized from the light emitted from light-emitting element 2, light emitted from phosphor part 3B and light emitted from the phosphor powder is obtained. Consequently, just as in Embodiment B-25, by selecting material that emits near ultraviolet light as material of light-emitting layer part 21 in light-emitting element 2, both phosphor part 3B and the phosphor powder in encapsulating part 19 will be excited by the light emitted from light-emitting element 2 and emit lights intrinsic to each of them. Thus, the light synthesized from those lights can be obtained. In addition, the emission color of the phosphor powder is set different from that of phosphor part 3B also in the present embodiment, but the emission color of the phosphor powder can be set identical to that of phosphor part 3B. With that configuration, it becomes possible to increase the light output and enhance the emission efficiency because the light emitted from the phosphor powder is superimposed on the light emitted from phosphor part 3B.

[Embodiment B-28]

Figure 35:
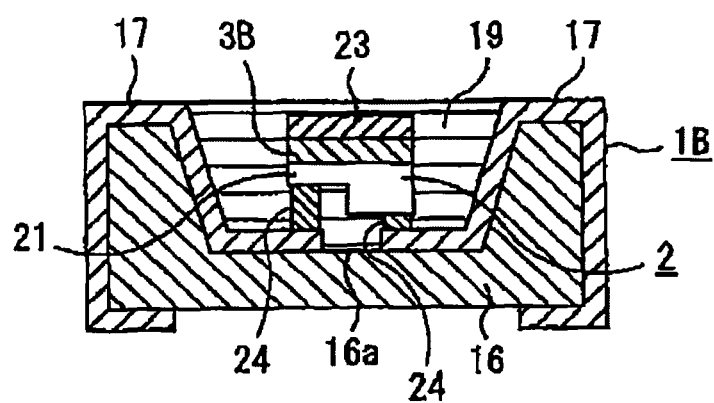
[FIG. 35]

Light emitting device 1B of the present embodiment has a basic structure that is about the same as that in Embodiment B-5. As shown in FIG. 35, it is characterized in that encapsulating part 19 for encapsulating light-emitting element 2, which fills up hollow 16a formed on one surface (the upper surface in FIG. 35) of insulating substrate 16, is provided, light-emitting layer part 21 in light-emitting element 2 is based on AlGaN and emits near ultraviolet light, and phosphor powder (for example, powder of a YAG:$Ce^{3+}$ phosphor emitting yellow light after being excited by near ultraviolet light) is dispersed in a light-transmissible material which is used as encapsulating part 19, and encapsulating part 19 functions as a phosphor part. In the present embodiment, fluorophosphates-based glass (for example, $P_2O_5.AlF_3.MgF.CaF_2.SrF_2.BaCl_2:Eu^{2+}$ emitting blue light after being excited by near ultraviolet light) is used as phosphor particles in phosphor part 3B. Meanwhile, the same components as in embodiment B-5 are designated by the same reference numerals to omit redundant explanations.

Thus, in light emitting device 1B of the present embodiment, just as in Embodiment B-25, since a phosphor powder that emits light after being excited by the light from light-emitting element 2 is dispersed in encapsulating part 19, light output of light synthesized from the light emitted from light-emitting element 2, light emitted from phosphor part 3B and light emitted from the phosphor powder is obtained. Consequently, just as in Embodiment B-25, by selecting material that emits near ultraviolet light as material of light-emitting layer part 21 in light-emitting element 2, both phosphor part 3B and the phosphor powder in encapsulating part 19 will be excited by the light emitted from light-emitting element 2 and emit lights intrinsic to each of them. And the light synthesized from those lights can be obtained. In addition, the emission color of the phosphor powder is set different from that of phosphor part 3B also in the present embodiment, but the emission color of the phosphor powder can be set identical to that of phosphor part 3B. With that configuration, it becomes possible to increase the light output and enhance the emission efficiency because the light emitted from the phosphor powder is superimposed on the light emitted from phosphor part 3B.

[Embodiment B-29]

Figure 36:
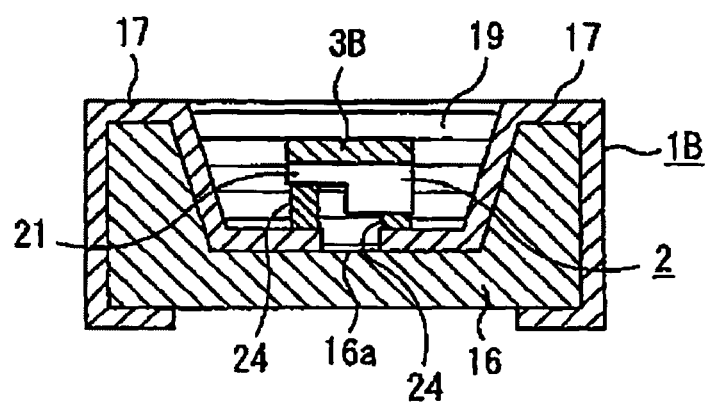
[FIG. 36]

Light emitting device 1B of the present embodiment has a basic structure that is about the same as that in Embodiment B-6. As shown in FIG. 36, it is characterized in that encapsulating part 19 for encapsulating light-emitting element 2, which fills up hollow 16a formed on one surface (the upper surface in FIG. 36) of insulating substrate 16, is provided, light-emitting layer part 21 in light-emitting element 2 is based on AlGaN and emits near ultraviolet light, and phosphor powder (for example, powder of a YAG:$Ce^{3+}$ phosphor emitting yellow light after being excited by near ultraviolet light) is dispersed in a light-transmissible material which is used as encapsulating part 19, and encapsulating part 19 functions as a phosphor part. In the present embodiment, fluorophosphates-based glass (for example, $P_2O_5.AlF_3.MgF.CaF_2.SrF_2.BaCl_2:Eu^{2+}$ emitting blue light after being excited by near ultraviolet light) is used as phosphor particles in phosphor part 3B. Meanwhile, the same components as in Embodiment B-6 are designated by the same reference numerals to omit redundant explanations.

Thus, in light emitting device 1B of the present embodiment, just as in Embodiment B-25, since a phosphor powder that emits light after being excited by the light from light-emitting element 2 is dispersed in encapsulating part 19, light output of light synthesized from the light emitted from light-emitting element 2, light emitted from phosphor part 3B and light emitted from the phosphor powder is obtained. Consequently, just as in Embodiment B-25, by selecting material that emits near ultraviolet light as material of light-emitting layer part 21 in light-emitting element 2, both phosphor part 3B and the phosphor powder in encapsulating part 19 will be excited by the light emitted from light-emitting element 2 and emit lights intrinsic to each of them. And the light synthesized from those lights can be obtained. In addition, the emission color of the phosphor powder is set different from that of phosphor part 3B also in the present embodiment, but the emission color of the phosphor powder can be set identical to that of phosphor part 3B. With that configuration, it becomes possible to increase the light output and enhance the emission efficiency because the light emitted from the phosphor powder is superimposed on the light emitted from phosphor part 3B.

[Embodiment B-30]

Figure 37:
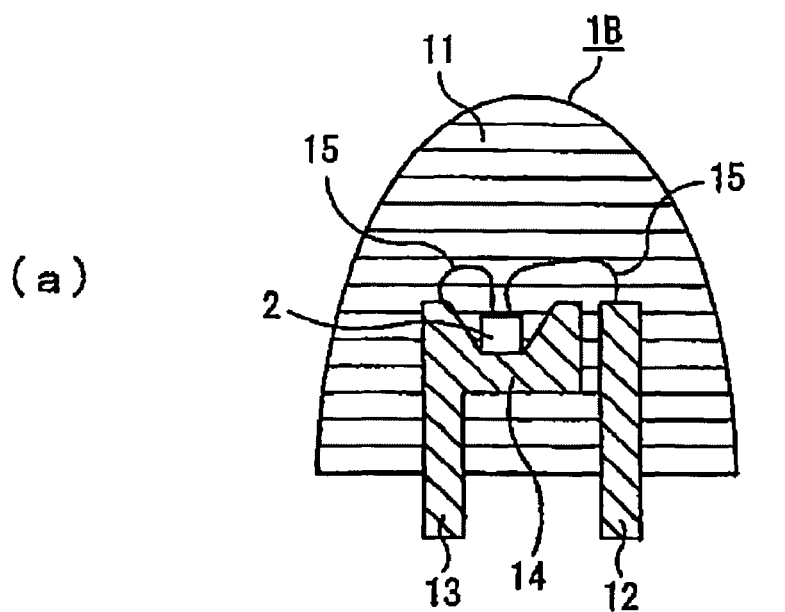
[FIG. 37]
Figure 37:
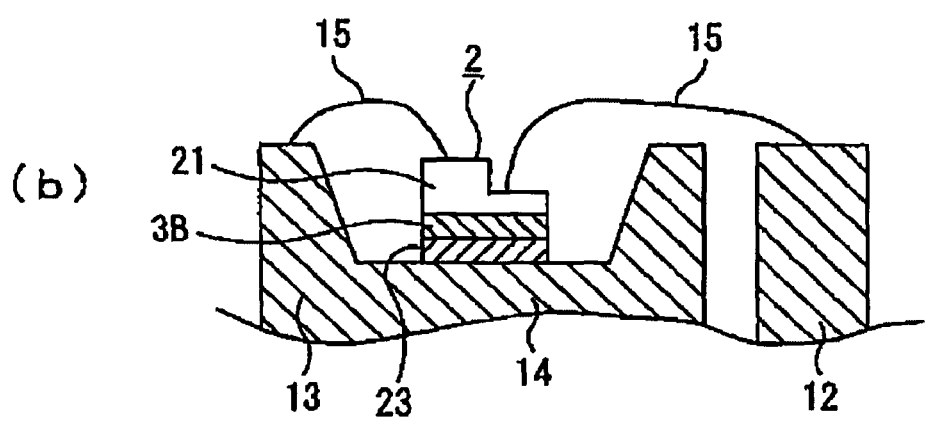

Light emitting device 1B of the present embodiment has a basic structure that is about the same as that in Embodiment B-1. As shown in FIG. 37(a) and FIG. 37(b), it is characterized in that the shell type shape mold part 11 is provided, light-emitting layer part 21 in light-emitting element 2 is based on AlGaN and emits near ultraviolet light, and phosphor powder (for example, powder of a YAG:Ce$^{3+}$ phosphor emitting yellow light after being excited by near ultraviolet light) is dispersed in a light-transmissible material which is used as mold part 11, and mold part 11 functions as a phosphor part. In the present embodiment, fluorophosphates-based glass (for example, $P_2O_5.AlF_3.MgF.CaF_2.SrF_2.BaCl_2$:$Eu^{2+}$ emitting blue light after being excited by near ultraviolet light) is used as phosphor particles in phosphor part 3B. Meanwhile, the same components as in Embodiment B-1 are designated by the same reference numerals to omit redundant explanations.

Thus, in light emitting device 1B of the present embodiment, just as in Embodiment B-25, since a phosphor powder that emits light after being excited by the light from light-emitting element 2 is dispersed in mold part 11, light output of light synthesized from the light emitted from light-emitting element 2, light emitted from phosphor part 3B and light emitted from the phosphor powder is obtained. Consequently, just as in Embodiment B-25, by selecting material that emits near ultraviolet light as material of light-emitting layer part 21 in light-emitting element 2, both phosphor part 3B and the phosphor powder in mold part 11 will be excited by the light emitted from light-emitting element 2 and emit lights intrinsic to each of them. And the light synthesized from those lights can be obtained. In addition, the emission color of the phosphor powder is set different from that of phosphor part 3B also in the present embodiment, but the emission color of the phosphor powder can be set identical to that of phosphor part 3B. With that configuration, it becomes possible to increase the light output and enhance the emission efficiency because the light emitted from the phosphor powder is superimposed on the light emitted from phosphor part 3B.

[Embodiment B-31]

Figure 38:
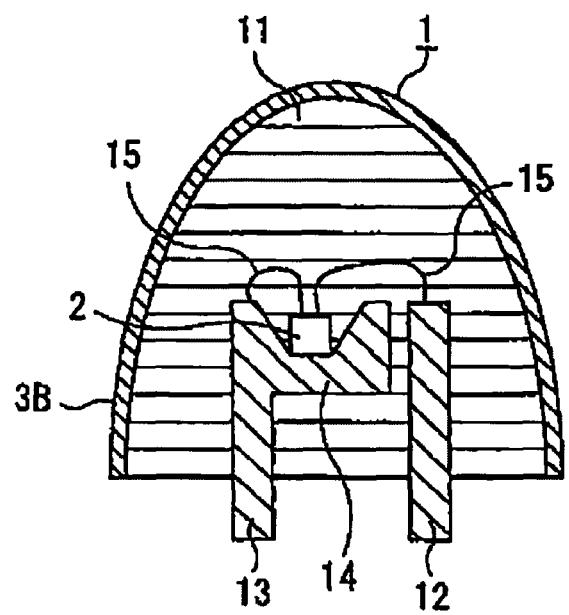
[FIG. 38]

Light emitting device 1B of the present embodiment has a basic structure that is about the same as that in Embodiment B-8. As shown in FIG. 38, it is characterized in that the shell type shape mold part 11 is provided, light-emitting layer part 21 (not shown in FIG. 38) in light-emitting element 2 is based on AlGaN and emits near ultraviolet light, and phosphor powder (for example, powder of a YAG:Ce$^{3+}$ phosphor emitting yellow light after being excited by near ultraviolet light) is dispersed in a light-transmissible material which is used as mold part 11, and mold part 11 functions as a phosphor part. In the present embodiment, fluorophosphates-based glass (for example, $P_2O_5.AlF_3.MgF.CaF_2.SrF_2.BaCl_2$:$Eu^{2+}$ emitting blue light after being excited by near ultraviolet light) is used as phosphor particles in phosphor part 3B. Meanwhile, the same components as in Embodiment B-8 are designated by the same reference numerals to omit redundant explanations.

Thus, in light emitting device 1B of the present embodiment, just as in Embodiment B-25, since a phosphor powder that emits light after being excited by the light from light-emitting element 2 is dispersed in mold part 11, light output of light synthesized from the light emitted from light-emitting element 2, light emitted from phosphor part 3B and light emitted from the phosphor powder is obtained. Consequently, just as in Embodiment B-25, by selecting material that emits near ultraviolet light as material of light-emitting layer part 21 in light-emitting element 2, both phosphor part 3B and the phosphor powder in mold part 11 will be excited by the light emitted from light-emitting element 2 and emit lights intrinsic to each of them. And the light synthesized from those lights can be obtained. In addition, the emission color of the phosphor powder is set different from that of phosphor part 3B also in the present embodiment, but the emission color of the phosphor powder can be set identical to that of phosphor part 3B. With that configuration, it becomes possible to increase the light output and enhance the emission efficiency because the light emitted from the phosphor powder is superimposed on the light emitted from phosphor part 3B.

[Embodiment B-32]

Figure 39:
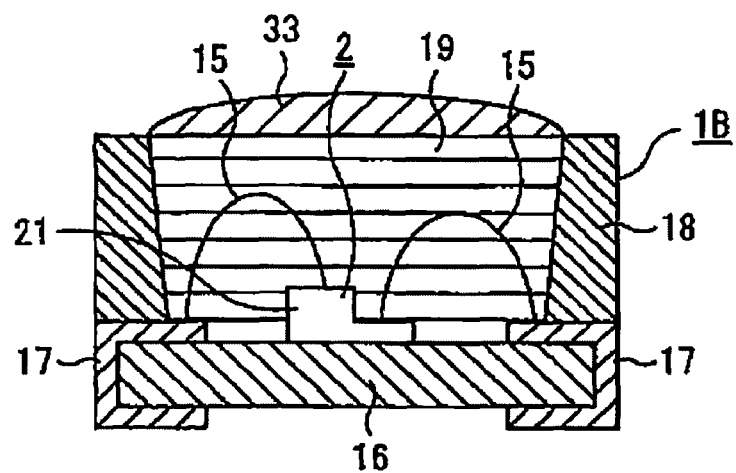
[FIG. 39]

Light emitting device 1B of the present embodiment has a basic structure that is about the same as that in Embodiment B-11. As shown in FIG. 39, it is characterized in that encapsulating part 19 for encapsulating light-emitting element 2 is provided at one side (the upper side in FIG. 39) of insulating substrate 16, light-emitting layer part 21 in light-emitting element 2 is based on AlGaN and emits near ultraviolet light, and phosphor powder (for example, powder of a YAG:Ce$^{3+}$ phosphor emitting yellow light after being excited by near ultraviolet light) is dispersed in a light-transmissible material which is used as encapsulating part 19, and encapsulating part 19 functions as a phosphor part. In the present embodiment, fluorophosphates-based glass (for example, $P_2O_5.AlF_3.MgF.CaF_2.SrF_2.BaCl_2$:$Eu^{2+}$ emitting blue light after being excited by near ultraviolet light) is used as phosphor particles in phosphor part 33. Meanwhile, the same components as in Embodiment B-11 are designated by the same reference numerals to omit redundant explanations.

Thus, in light emitting device 1B of the present embodiment, just as in Embodiment B-25, since a phosphor powder that emits light after being excited by the light from light-emitting element 2 is dispersed in encapsulating part 19, light output of light synthesized from the light emitted from light-emitting element 2, light emitted from phosphor part 33 and light emitted from the phosphor powder is obtained. Consequently, just as in Embodiment B-25, by selecting material that emits near ultraviolet light as material of light-emitting layer part 21 in light-emitting element 2, both phosphor part 33 and the phosphor powder in encapsulating part 19 will be excited by the light emitted from light-emitting element 2 and emit lights intrinsic to each of them. And the light synthesized from those lights can be obtained. In addition, the emission color of the phosphor powder is set different from that of phosphor part 33 also in the present embodiment, but the emission color of the phosphor powder can be set identical to that of phosphor part 33. With that configuration, it becomes possible to increase the light output and enhance the emission efficiency because the light emitted from the phosphor powder is superimposed on the light emitted from phosphor part 33.

[Embodiment B-33]

Figure 40:
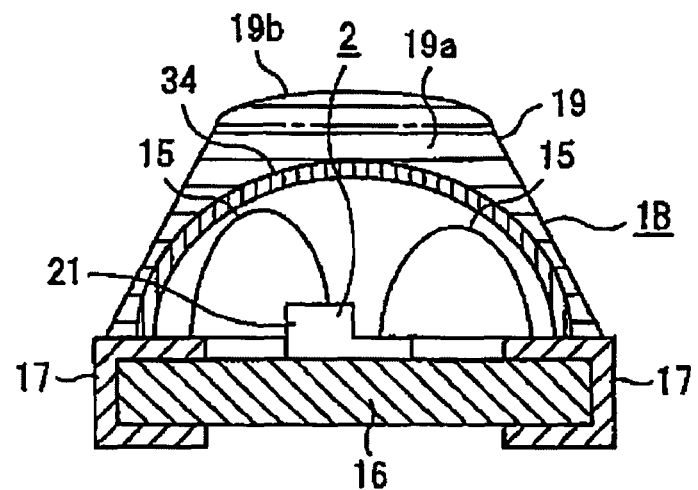
[FIG. 40]

Light emitting device 1B of the present embodiment has a basic structure that is about the same as that in Embodiment B-15. As shown in FIG. 40, it is characterized in that encapsulating part 19 for encapsulating light-emitting element 2 is provided at one side (the upper side in FIG. 40) of insulating substrate 16, light-emitting layer part 21 in light-emitting element 2 is based on AlGaN and emits near ultraviolet light, and phosphor powder (for example, powder of a YAG:Ce$^{3+}$ phosphor emitting yellow light after being excited by near ultraviolet light) is dispersed in a light-transmissible material which is used as encapsulating part 19, and encapsulating part 19 functions as a phosphor part. In the present embodiment, fluorophosphates-based glass (for example, $P_2O_5.AlF_3.MgF.CaF_2.SrF_2.BaCl_2:Eu^{2+}$ emitting blue light after being excited by near ultraviolet light) is used as phosphor particles in phosphor part 34. Meanwhile, the same components as in embodiment B-15 are designated by the same reference numerals to omit redundant explanations.

Thus, in light emitting device 1B of the present embodiment, just as in Embodiment B-25, since a phosphor powder that emits light after being excited by the light from light-emitting element 2 is dispersed in encapsulating part 19, light output of light synthesized from the light emitted from light-emitting element 2, light emitted from phosphor part 34 and light emitted from the phosphor powder is obtained. Consequently, just as in Embodiment B-25, by selecting material that emits near ultraviolet light as material of light-emitting layer part 21 in light-emitting element 2, both phosphor part 34 and the phosphor powder in encapsulating part 19 will be excited by the light emitted from light-emitting element 2 and emit lights intrinsic to each of them. And the light synthesized from those lights can be obtained. In addition, the emission color of the phosphor powder is set different from that of phosphor part 34 also in the present embodiment, but the emission color of the phosphor powder can be set identical to that of phosphor part 34. With that configuration, it becomes possible to increase the light output and enhance the emission efficiency because the light emitted from the phosphor powder is superimposed on the light emitted from phosphor part 34.

[Embodiment B-34]

Figure 41:
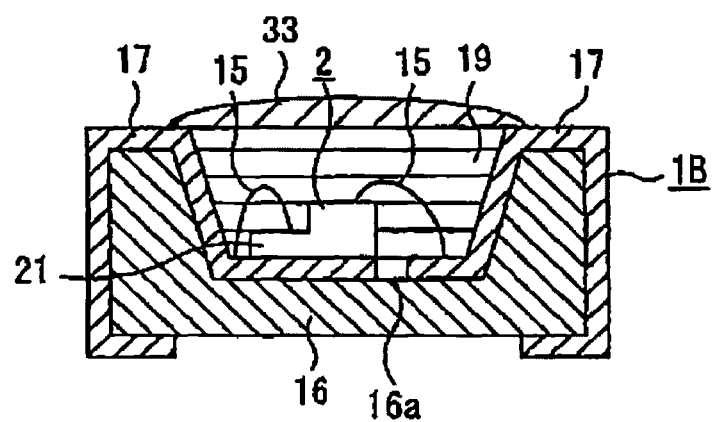
[FIG. 41]

Light emitting device 1B of the present embodiment has a basic structure that is about the same as that in Embodiment B-19. As shown in FIG. 41, it is characterized in that encapsulating part 19 for encapsulating light-emitting element 2, which fills up hollow 16a formed on one surface (the upper surface in FIG. 41) of insulating substrate 16, is provided, light-emitting layer part 21 in light-emitting element 2 is based on AlGaN and emits near ultraviolet light, and phosphor powder (for example, powder of a YAG:Ce$^{3+}$ phosphor emitting yellow light after being excited by near ultraviolet light) is dispersed in a light-transmissible material which is used as encapsulating part 19, and encapsulating part 19 functions as a phosphor part. In the present embodiment, fluorophosphates-based glass (for example, $P_2O_5.AlF_3.MgF.CaF_2.SrF_2.BaCl_2:Eu^{2+}$ emitting blue light after being excited by near ultraviolet light) is used as phosphor particles in phosphor part 33. Meanwhile, the same components as in embodiment B-19 are designated by the same reference numerals to omit redundant explanations.

Thus, in light emitting device 1B of the present embodiment, just as in Embodiment B-25, since a phosphor powder that emits light after being excited by the light from light-emitting element 2 is dispersed in encapsulating part 19, light output of light synthesized from the light emitted from light-emitting element 2, light emitted from phosphor part 33 and light emitted from the phosphor powder is obtained. Consequently, just as in Embodiment B-25, by selecting material that emits near ultraviolet light as material of light-emitting layer part 21 in light-emitting element 2, both phosphor part 33 and the phosphor powder in encapsulating part 19 will be excited by the light emitted from light-emitting element 2 and emit lights intrinsic to each of them. And the light synthesized from those lights can be obtained. In addition, the emission color of the phosphor powder is set different from that of phosphor part 33 also in the present embodiment, but the emission color of the phosphor powder can be set identical to that of phosphor part 33. With that configuration, it becomes possible to increase the light output and enhance the emission efficiency because the light emitted from the phosphor powder is superimposed on the light emitted from phosphor part 33.

[Embodiment B-35]

Figure 42:
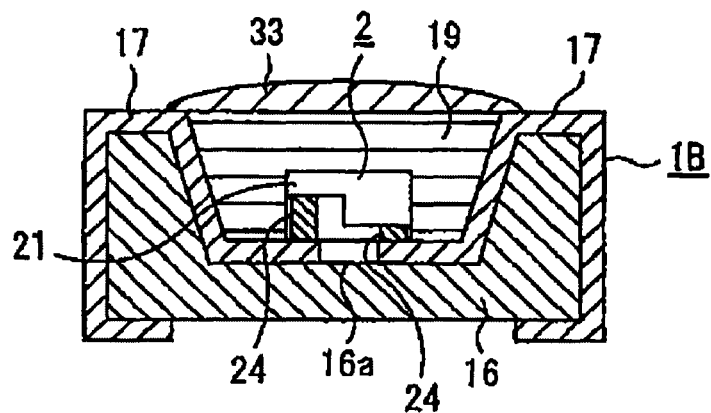
[FIG. 42]

Light emitting device 1B of the present embodiment has a basic structure that is about the same as that in Embodiments B-12 and B-22. As shown in FIG. 42, it is characterized in that encapsulating part 19 for encapsulating light-emitting element 2, which fills up hollow 16a formed on one surface (the upper surface in FIG. 42) of insulating substrate 16, is provided, light-emitting layer part 21 in light-emitting element 2 is based on AlGaN and emits near ultraviolet light, and phosphor powder (for example, powder of a YAG:Ce$^{3+}$ phosphor emitting yellow light after being excited by near ultraviolet light) is dispersed in a light-transmissible material which is used as encapsulating part 19, and encapsulating part 19 functions as a phosphor part. In the present embodiment, fluorophosphates-based glass (for example, $P_2O_5.AlF_3.MgF.CaF_2.SrF_2.BaCl_2:Eu^{2+}$ emitting blue light after being excited by near ultraviolet light) is used as phosphor particles in phosphor part 33. Meanwhile, the same components as in Embodiments B-12 and B-22 are designated by the same reference numerals to omit redundant explanations.

Thus, in light emitting device 1B of the present embodiment, just as in Embodiment B-25, since a phosphor powder that emits light after being excited by the light from light-emitting element 2 is dispersed in encapsulating part 19, light output of light synthesized from the light emitted from light-emitting element 2, light emitted from phosphor part 3B and light emitted from the phosphor powder is obtained. Consequently, just as in Embodiment B-25, by selecting material that emits near ultraviolet light as material of light-emitting layer part 21 in light-emitting element 2, both phosphor part 33 and the phosphor powder in encapsulating part 19 will be excited by the light emitted from light-emitting element 2 and emit lights intrinsic to each of them. And the light synthesized from those lights can be obtained. In addition, the emission color of the phosphor powder is set different from that of phosphor part 33 also in the present embodiment, but the emission color of the phosphor powder can be set identical to that of phosphor part 33. With that configuration, it becomes possible to increase the light output and enhance the emission efficiency because the light emitted from the phosphor powder is superimposed on the light emitted from phosphor part 33.

[Embodiment B-36]

Figure 43:
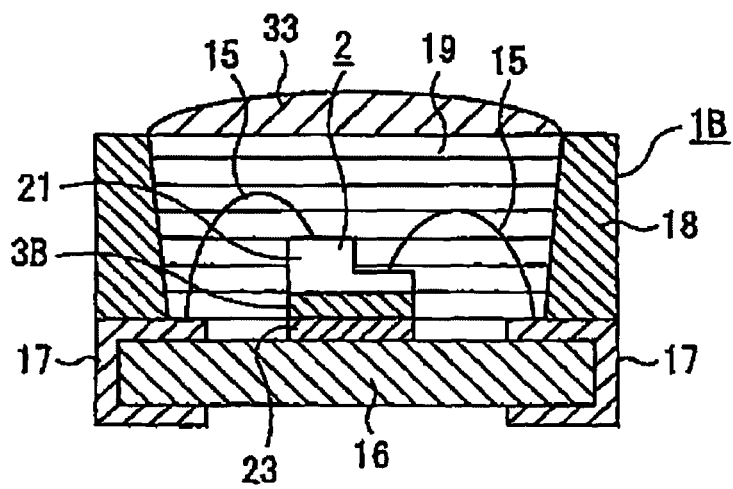
[FIG. 43]

Light emitting device 1B of the present embodiment has a basic structure that is about the same as that in Embodiment B-12. As shown in FIG. 43, it is characterized in that encapsulating part 19 for encapsulating light-emitting element 2 is provided at the upper side of insulating substrate 16, light-emitting layer part 21 in light-emitting element 2 is based on AlGaN and emits near ultraviolet light, and phosphor powder (for example, powder of a YAG:$Ce^{3+}$ phosphor emitting yellow light after being excited by near ultraviolet light) is dispersed in a light-transmissible material which is used as encapsulating part 19, and encapsulating part 19 functions as a phosphor part. In the present embodiment, fluorophosphates-based glass (for example, $P_2O_5.AlF_3.MgF.CaF_2.SrF_2.BaCl_2$:$Eu^{2+}$ emitting blue light after being excited by near ultraviolet light) is used as phosphor particles in phosphor part 3B. Meanwhile, the same components as in embodiment B-12 are designated by the same reference numerals to omit redundant explanations.

Thus, in light emitting device 1B of the present embodiment, just as in Embodiment B-25, since a phosphor powder that emits light after being excited by the light from light-emitting element 2 is dispersed in encapsulating part 19, light output of light synthesized from the light emitted from light-emitting element 2, light emitted from phosphor part 3B and light emitted from the phosphor powder is obtained. Consequently, just as in Embodiment B-25, by selecting material that emits near ultraviolet light as material of light-emitting layer part 21 in light-emitting element 2, both phosphor part 3B and the phosphor powder in encapsulating part 19 will be excited by the light emitted from light-emitting element 2 and emit lights intrinsic to each of them. And the light synthesized from those lights can be obtained. In addition, the emission color of the phosphor powder is set different from that of phosphor part 3B also in the present embodiment, but the emission color of the phosphor powder can be set identical to that of phosphor part 3B. With that configuration, it becomes possible to increase the light output and enhance the emission efficiency because the light emitted from the phosphor powder is superimposed on the light emitted from phosphor part 3B.

[Embodiment B-37]

Figure 44:
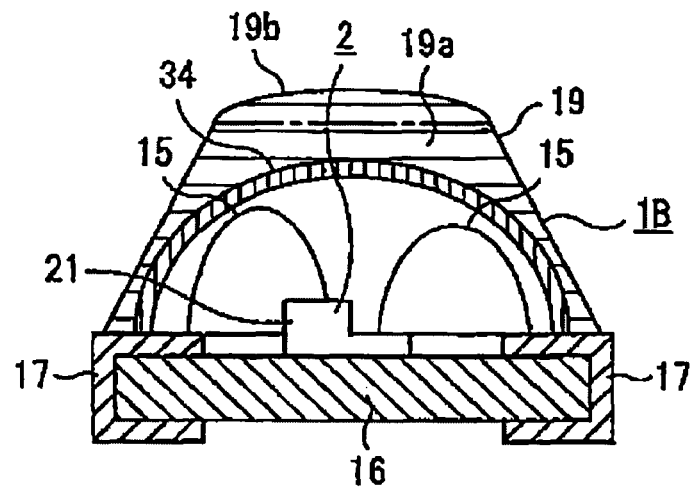
[FIG. 44]

Light emitting device 1B of the present embodiment has a basic structure that is about the same as that in Embodiment B-16. As shown in FIG. 44, it is characterized in that encapsulating part 19 for encapsulating light-emitting element 2 is provided at one side (the upper side in FIG. 44) of insulating substrate 16, light-emitting layer part 21 in light-emitting element 2 is based on AlGaN and emits near ultraviolet light, and phosphor powder (for example, powder of a YAG:$Ce^{3+}$ phosphor emitting yellow light after being excited by near ultraviolet light) is dispersed in a light-transmissible material which is used as encapsulating part 19, and encapsulating part 19 functions as a phosphor part. In the present embodiment, fluorophosphates-based glass (for example, $P_2O_5.AlF_3.MgF.CaF_2.SrF_2.BaCl_2$:$Eu^{2+}$ emitting blue light after being excited by near ultraviolet light) is used as phosphor particles in phosphor part 34. Meanwhile, the same components as in Embodiment B-16 are designated by the same reference numerals to omit redundant explanations.

Thus, in light emitting device 1B of the present embodiment, just as in Embodiment B-25, since a phosphor powder that emits light after being excited by the light from light-emitting element 2 is dispersed in encapsulating part 19, light output of light synthesized from the light emitted from light-emitting element 2, light emitted from phosphor part 34 and light emitted from the phosphor powder is obtained. Consequently, just as in Embodiment B-25, by selecting material that emits near ultraviolet light as material of light-emitting layer part 21 in light-emitting element 2, both phosphor part 34 and the phosphor powder in encapsulating part 19 will be excited by the light emitted from light-emitting element 2 and emit lights intrinsic to each of them. And the light synthesized from those lights can be obtained. In addition, the emission color of the phosphor powder is set different from that of phosphor part 34 also in the present embodiment, but the emission color of the phosphor powder can be set identical to that of phosphor part 34. With that configuration, it becomes possible to increase the light output and enhance the emission efficiency because the light emitted from the phosphor powder is superimposed on the light emitted from phosphor part 34.

[Embodiment B-38]

Figure 45:
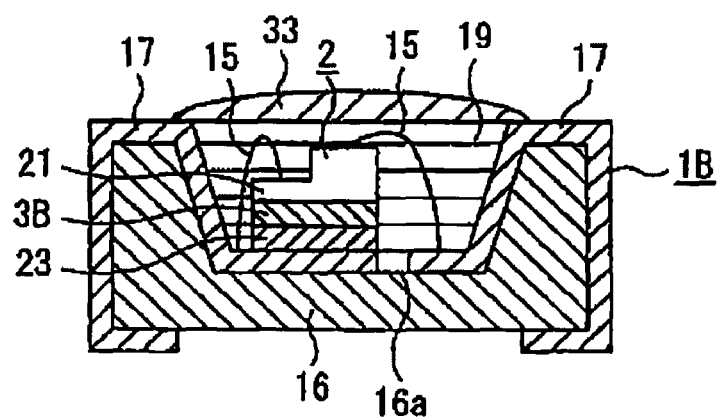
[FIG. 45]

Light emitting device 1B of the present embodiment has a basic structure that is about the same as that in Embodiment B-20. As shown in FIG. 45, it is characterized in that encapsulating part 19 for encapsulating light-emitting element 2, which fills up hollow 16a formed on one surface (the upper surface in FIG. 45) of insulating substrate 16, is provided, light-emitting layer part 21 in light-emitting element 2 is based on AlGaN and emits near ultraviolet light, and phosphor powder (for example, powder of a YAG:$Ce^{3+}$ phosphor emitting yellow light after being excited by near ultraviolet light) is dispersed in a light-transmissible material which is used as encapsulating part 19, and encapsulating part 19 functions as a phosphor part. In the present embodiment, fluorophosphates-based glass (for example, $P_2O_5.AlF_3.MgF.CaF_2.SrF_2.BaCl_2$:$Eu^{2+}$ emitting blue light after being excited by near ultraviolet light) is used as phosphor particles in phosphor part 3B. Meanwhile, the same components as in Embodiment B-20 are designated by the same reference numerals to omit redundant explanations.

Thus, in light emitting device 1B of the present embodiment, just as in Embodiment B-25, since a phosphor powder that emits light after being excited by the light from light-emitting element 2 is dispersed in encapsulating part 19, light output of light synthesized from the light emitted from light-emitting element 2, light emitted from phosphor part 3B and light emitted from the phosphor powder is obtained. Consequently, just as in Embodiment B-25, by selecting material that emits near ultraviolet light as material of light-emitting layer part 21 in light-emitting element 2, both phosphor part 3B and the phosphor powder in encapsulating part 19 will be excited by the light emitted from light-emitting element 2 and emit lights intrinsic to each of them. And the light synthesized from those lights can be obtained. In addition, the emission color of the phosphor powder is set different from that of phosphor part 3B also in the present embodiment, but the emission color of the phosphor powder can be set identical to that of phosphor part 3B. With that configuration, it becomes possible to increase the light output and enhance the emission efficiency because the light emitted from the phosphor powder is superimposed on the light emitted from phosphor part 3B.

[Embodiment B-39]

Figure 46:
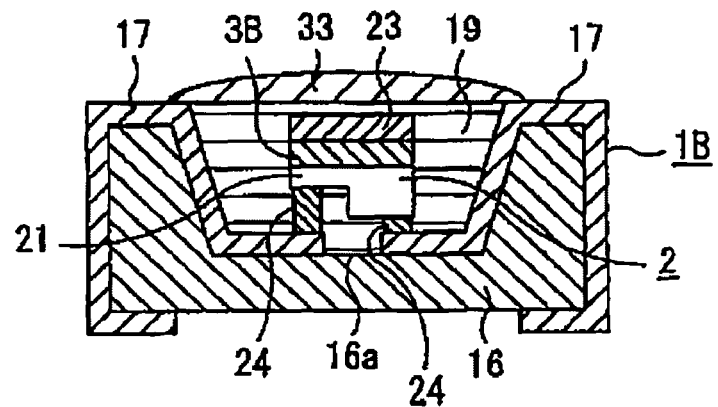
[FIG. 46]

Light emitting device 1B of the present embodiment has a basic structure that is about the same as that in Embodiments B-5 and B-12. As shown in FIG. 46, it is characterized in that encapsulating part 19 for encapsulating light-emitting element 2, which fills up hollow 16a formed on one surface (the upper surface in FIG. 46) of insulating substrate 16, is provided, light-emitting layer part 21 in light-emitting element 2 is based on AlGaN and emits near ultraviolet light, and phosphor powder (for example, powder of a YAG:$Ce^{3+}$ phosphor emitting yellow light after being excited by near ultraviolet light) is dispersed in a light-transmissible material which is used as encapsulating part 19, and encapsulating part 19 functions as a phosphor part. In the present embodiment, fluorophosphates-based glass (for example, $P_2O_5.AlF_3.MgF.CaF_2.SrF_2.BaCl_2:Eu^{2+}$ emitting blue light after being excited by near ultraviolet light) is used as phosphor particles in phosphor part 3B. Meanwhile, the same components as in Embodiments B-5 and B-12 are designated by the same reference numerals to omit redundant explanations.

Thus, in light emitting device 1B of the present embodiment, just as in Embodiment B-25, since a phosphor powder that emits light after being excited by the light from light-emitting element 2 is dispersed in encapsulating part 19, light output of light synthesized from the light emitted from light-emitting element 2, light emitted from phosphor part 3B and light emitted from the phosphor powder is obtained. Consequently, just as in Embodiment B-25, by selecting material that emits near ultraviolet light as material of light-emitting layer part 21 in light-emitting element 2, both phosphor part 3B and the phosphor powder in encapsulating part 19 will be excited by the light emitted from light-emitting element 2 and emit lights intrinsic to each of them. And the light synthesized from those lights can be obtained. In addition, the emission color of the phosphor powder is set different from that of phosphor part 3B also in the present embodiment, but the emission color of the phosphor powder can be set identical to that of phosphor part 3B. With that configuration, it becomes possible to increase the light output and enhance the emission efficiency because the light emitted from the phosphor powder is superimposed on the light emitted from phosphor part 3B.

[Embodiment B-40]

Figure 47:
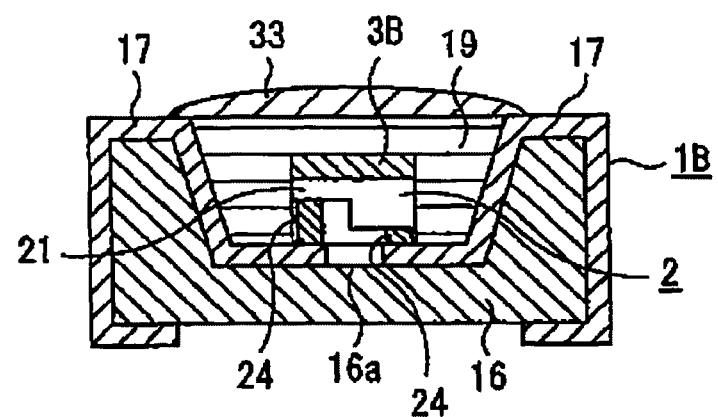
[FIG. 47]

Light emitting device 1B of the present embodiment has a basic structure that is about the same as that in Embodiments B-20 and B-21. As shown in FIG. 47, it is characterized in that encapsulating part 19 for encapsulating light-emitting element 2, which fills up hollow 16a formed on one surface (the upper surface in FIG. 47) of insulating substrate 16, is provided, light-emitting layer part 21 in light-emitting element 2 is based on AlGaN and emits near ultraviolet light, and phosphor powder (for example, powder of a YAG:$Ce^{3+}$ phosphor emitting yellow light after being excited by near ultraviolet light) is dispersed in a light-transmissible material which is used as encapsulating part 19, and encapsulating part 19 functions as a phosphor part. In the present embodiment, fluorophosphates-based glass (for example, $P_2O_5.AlF_3.MgF.CaF_2.SrF_2.BaCl_2:Eu^{2+}$ emitting blue light after being excited by near ultraviolet light) is used as phosphor particles in phosphor part 3B. Meanwhile, the same components as in Embodiments B-20 and B-21 are designated by the same reference numerals to omit redundant explanations.

Thus, in light emitting device 1B of the present embodiment, just as in Embodiment B-25, since a phosphor powder that emits light after being excited by the light from light-emitting element 2 is dispersed in encapsulating part 19, light output of light synthesized from the light emitted from light-emitting element 2, light emitted from phosphor part 3B and light emitted from the phosphor powder is obtained. Consequently, just as in Embodiment B-25, by selecting material that emits near ultraviolet light as material of light-emitting layer part 21 in light-emitting element 2, both phosphor part 3B and the phosphor powder in encapsulating part 19 will be excited by the light emitted from light-emitting element 2 and emit lights intrinsic to each of them. And the light synthesized from those lights can be obtained. In addition, the emission color of the phosphor powder is set different from that of phosphor part 3B also in the present embodiment, but the emission color of the phosphor powder can be set identical to that of phosphor part 3B. With that configuration, it becomes possible to increase the light output and enhance the emission efficiency because the light emitted from the phosphor powder is superimposed on the light emitted from phosphor part 3B.

[Embodiment B-41]

Figure 48:
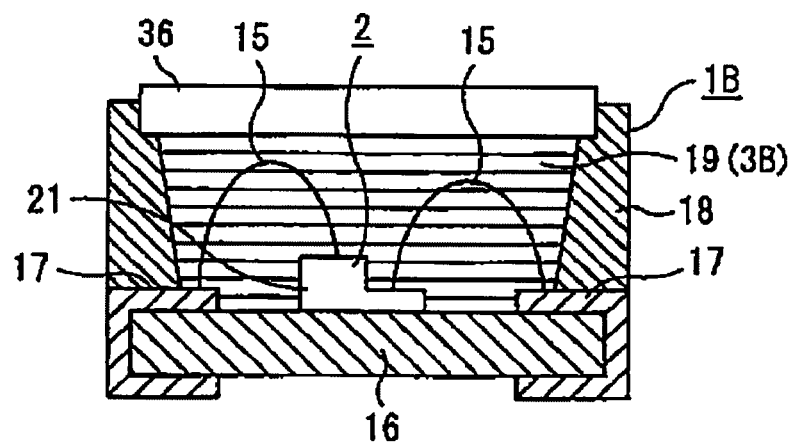
[FIG. 48]

Light emitting device 1B of the present embodiment has a basic structure that is about the same as that in Embodiment B-2. As shown in FIG. 48, it is characterized in that a frame-shaped frame 18, surrounding light-emitting element 2 on one surface (upper surface in FIG. 48) of insulating substrate 16, is provided and encapsulating part 19 inside frame 18 is formed of a phosphor part that is the same as that of phosphor part 3B described in Embodiment B-2. The upper surface side of light-emitting element 2 and encapsulating part 19 is cut off from oxygen or moisture of outside by a transparent lid 36 formed of glass, ┐ra highly air-tight resin. Meanwhile, the same components as in embodiment B-2 are designated by the same reference numerals to omit redundant explanations. Lid 36 and encapsulating part 19 may be in direct contact with each other or have a gap between them. However, when there is no gap, a semiconductor light-emitting device that is high in efficiency of extracting light and luminance can be achieved. When they have a gap between them, it is preferable to be encapsulated with vacuum or inert gas.

Since encapsulating part 19 is formed of the phosphor part in the present embodiment, it becomes possible to enhance encapsulating properties, transparency, light resistance and heat resistance of encapsulating part 19 and to inhibit crack generation and peeling accompanying a long-term use, by means of using the semiconductor light-emitting device member of the invention as phosphor part, as described later.

In addition, in the present embodiment, lid 36 can inhibit an intrusion of external-factor such as moisture or oxygen, which accelerates deterioration of the phosphor and encapsulating resin, and volatilization of gas generated by thermal or photolytic degradation of the encapsulating resin. This leads to another advantageous effect of reducing luminance decrease and peeling induced by shrinkage of the encapsulating part.

Figure 49:
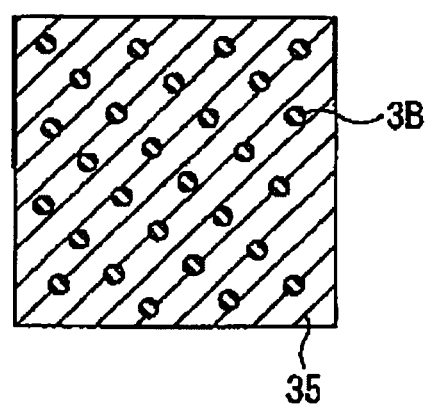
[FIG. 49]

Meanwhile, in each of the above embodiments, phosphor part 3B is processed into a respective desired form or is formed by means of the sol-gel method, but phosphor part 3B may be used instead of the phosphor parts in each of the above Embodiments by forming spherical with a diameter a little larger than the visible wavelength and disposing a large number of such phosphor parts 3B in a solid medium 35 that is made of light-transmissible material, as shown in FIG. 49. With that configuration, the amount of the material used for the phosphor part can be reduced while maintaining transparency of the phosphor part with respect to the visible wavelength range, which can lead to cost reduction.

Each light-emitting device 1B comprises only one light-emitting element 2 in each of the above embodiments, but as a matter of course, a plurality of light-emitting elements 2 may constitute one unit of module and a phosphor part as an emission material may be disposed close to at least a part of the module. Incidentally, for example, in the case of a light-emitting device comprising mold part 11 in a shell-type shape, such as the one described in Embodiment B-1, a plurality of light-emitting devices may be mounted on the same printed board so as to constitute one unit of module. As another example, for a surface-mount type light-emitting device, such as the one described in Embodiment B-2, a plurality of light-emitting elements 2 may be mounted on the same insulating substrate 16 so as to constitute one unit of module.

[Application of Semiconductor Light-emitting Device Member]

The part to which the semiconductor light-emitting device member of the invention is applied in the light-emitting device (semiconductor light-emitting device) 1A, 1B, of each Embodiments of A-1, A-2 and B-1 to B-41 described above, is not particularly limited. In each of the above-described embodiments, the semiconductor light-emitting device member of the invention is applied, as an example, as a member which constitutes transparent member 3A, or as phosphor parts 3B, 33, 34, and the like. However, as other examples, the semiconductor light-emitting device member of the invention can also be suitably used as members that constitutes the above-mentioned mold part 11, frame 18, encapsulating part 19 and the like. By using the semiconductor light-emitting device member of the invention as these members, it becomes possible to obtain the above-mentioned various advantageous effects such as superior encapsulating properties, transparency, light resistance, heat resistance, film-formation capability and inhibition of crack generation and peeling accompanying a long-term use.

When applying the semiconductor light-emitting device member of the invention, it is preferable to make a modification thereto as appropriate, depending on the part to which the present invention is applied. For example, when the present invention is applied to phosphor part 3B, 33 or 34, the above-mentioned phosphor components such as phosphor particles, phosphor ions or fluorescent dyes may be mixed into the semiconductor light-emitting device member of the invention. Such a modification brings about an advantageous effect of enhancing retention capacity of the phosphor, in addition to the above-mentioned various advantageous effects.

Since the semiconductor light-emitting device member of the invention is excellent in durability, it can encapsulate a light-emitting element (such as an LED chip) as an encapsulating material (a use as inorganic adhesive) superior in light durability (UV resistance) and heat durability, even when it is used alone without including a phosphor.

If the above-mentioned inorganic particles are mixed into the semiconductor light-emitting device member of the invention, it becomes possible to obtain the advantageous effects mentioned above in the explanation for the combined use of inorganic particles, in addition to the above-mentioned various advantageous effects. Particularly, a semiconductor light-emitting device member of the invention that is adjusted to have a refractive index close to that of the light-emitting element by the combined use of the inorganic particles can act as a suitable light extracting film.

[Uses or the Like of Semiconductor Light-emitting Device]

The semiconductor light-emitting device can be used, for example, for a light-emitting device. In order to use the semiconductor light-emitting device for a light-emitting device, it is possible to place a phosphor-containing layer comprising a mixture of red phosphor, blue phosphor and green phosphor, over a light source. In this case, it is not always necessary for the red, blue and green phosphors to be mixed in the same layer, but, for example, a layer comprising the red phosphor may be stacked on the top of a layer comprising the blue and green phosphors.

In a light-emitting device, a phosphor-containing layer can be provided over the light source. The phosphor-containing layer can be provided as a contact layer located between the light source and the encapsulating resin part, as a coating layer located outside the encapsulating resin part, or as a coating layer located inside an outside cap. Also, it is possible to be a form where a phosphor is contained in the encapsulating resin.

As the encapsulating resin to be used, the curable polysiloxane composition of the invention can be used. Alternatively, other kinds of resins can also be used. Such kinds of resins usually include thermoplastic resins, thermosetting resins, photo-curable resins and the like. More specific examples include, for example: methacrylic resins such as methyl polymethacrylate; styrene resins such as polystyrene and styrene-acrylonitrile copolymer; polycarbonate resins; polyester resins; phenoxy resin; butyral resin; polyvinyl alcohol; cellulose-based resins such as ethyl cellulose, cellulose acetate and cellulose acetate butyrate; epoxy resins; phenol resins; silicone resins; and the like. Also, inorganic materials, for example, solutions obtained by hydrolytic polymerization of a metal alkoxide, a ceramic precursor polymer or a solution comprising a metal alkoxide by the sol-gel method, or inorganic materials obtained by solidifying a combination them such as inorganic materials comprising siloxane bond, may be used. The encapsulating resin may be used either as a single kind or two or more kinds thereof may be used in any combination and in any ratio.

The amount of phosphor to be used, relative to that of the encapsulating resin, is not particularly limited. However, it is usually 0.01 part by weight or more, preferably 0.1 part by weight or more and more preferably 1 part by weight or more, and usually 100 parts by weight or less, preferably 80 parts by weight or less and more preferably 60 parts by weight or less, based on 100 parts by weight of the encapsulating resin.

The encapsulating resin may comprise substances other than phosphors or inorganic particles. For example, it can comprise a dye used for correcting color tone, an antioxidant, a stabilizer for processing, oxidation and heat such as a phosphorus processing stabilizer, a light-resistant stabilizer such as a UV absorbent and a silane coupling agent. These components can be used either as a single kind or two or more kinds thereof may be used in any combination and in any ratio.

No particular limitation is imposed on the light source, but the one having peak wavelength in the range of 350 nm to 500 nm is preferable. Concrete examples thereof include a light-emitting diode (LED), a laser diode (LD) and the like. Of these, a GaN-based LED and a GaN-based LD, which utilize GaN-based compound semiconductors, are preferable. This is because a GaN-based LED and a GaN-based LD have emission output and external quantum efficiency far greater than those of an SiC-based LED and the like that emit light in the same range and therefore they can give very bright emission with very low electric power when used in combination with the above-mentioned phosphor. For example, when applying current load of 20 mA, a GaN-based LED and a GaN-based LD usually have emission intensity 100 times or higher than that of an SiC-based ones. Among GaN-based LEDs and GaN-based LDs, the one having an $Al_XGa_YN$ light-emitting layer, GaN light-emitting layer or $In_XGa_YN$ light-emitting layer is preferable. Among GaN-based LEDs in particular, the one having an $In_XGa_YN$ light-emitting layer is particularly preferable because emission intensity thereof is very high. Among GaN-based LDs, the one having a multiple quantum well structure of $In_XGa_YN$ layer and GaN layer is particularly preferable because emission intensity thereof is very high.

In the above description, the value X+Y usually takes a value in the range of 0.8 to 1.2. A GaN-based LED having the above-mentioned kind of light-emitting layer that is doped with Zn or Si or without any dopant is preferable for the purpose of adjusting the emission properties.

A GaN-based LED comprises such kind of light-emitting layer, p-layer, n-layer, electrode and substrate, as its basic components. Of these, the one having a heterostructure in which a light-emitting layer is sandwiched by n-type and p-type layers of $Al_xGa_yN$ layer, GaN layer or $In_xGa_yN$ layer is preferable because it can have high emission efficiency. Moreover, the one whose heterostructure is replaced by a quantum well structure is more preferable because it can have higher emission efficiency.

The light-emitting device emits white light. The emission efficiency of the light emitting device is 20 lm/W or more, preferably 22 lm/W or more, more preferably 25 lm/W or more, and particularly preferably 28 lm/W or more. The general color rendering index Ra thereof is 80 or more, preferably 85 or more, and more preferably 88 or more.

The light-emitting device can be used, for example, as various kinds of illuminating devices and image display devices such as a lamp for an illuminating device, a backlight for a liquid crystal panel and the like, and an ultra-thin-type illuminating device, by using it alone or a plurality of them in combination.

Furthermore, the optical member of the invention is useful for encapsulating an LED element, particularly a blue or ultraviolet LED element. Also, it can be preferably used for retaining a phosphor for a light source of a high-power illuminating device, such as a white LED or a warm-white LED, in which the light from an excitation light source of blue light-emitting element or ultraviolet light-emitting element is converted in its wavelength by the phosphor. It can also be used in uses such as various display materials shown below, owing to its excellent properties such as heat resistance, UV resistance and transparency.

Examples of the display materials include, for example: peripheral materials of liquid crystal displays such as substrate materials, optical guide plates, prism sheets, polarizing plates, retardation plates (films), viewing angle-correction films, adhesives and polarizer-protective films of liquid crystal displays; encapsulants, antireflection films, optical correction films, protective films for housing materials or front glass, substitution materials for front glass, adhesives and the like of color plasma display panels (PDP), which are one of next-generation flat-panel displays; substrate materials, optical guide plates, prism sheets, polarizing plates, retardation plates (films), viewing angle-correction films, adhesives, polarizer-protective films and the like of plasma address liquid crystal (PALC) displays; protective films for front glass, substitution materials for front glass, adhesives and the like of organic EL (electroluminescence) displays; and various film substrates, protective films for front glass, substitution materials for front glass, adhesives, and the like of field emission displays (FED).

The optical member of the invention is superior in adhesion and it can be laminated by means of recoating, which has been difficult. Utilizing this properties, a laminar structure having different refractive indexes can be formed by such a method that, for example, an optical member of the invention that mainly comprises a methyl group is used as a low-refractive-index layer and is laminated with a high-refractive-index layer into which zirconia nano particles or a high-refractive-index organic group such as phenyl group has been introduced. Thus, a light guiding layer that is highly durable and excellent in adhesion and flexibility can be easily formed.

[6] Optical Guide Plate

As an example of the optical member of the invention comprising at least the polysiloxane cured product of the invention, the following will explain the optical guide plate comprising at least the optical member of the invention (hereinafter referred to as an "optical guide plate of the invention" when appropriate).

The curable polysiloxane composition or polysiloxane cured product of the invention can be used in an optical communication system, particularly optical transmitter and receiver modules, as an optical member. In the optical waveguide for transmitting optical signals, there are required not only a high productivity and a low cost but also various properties such as light transmittance (transparency), light resistance, heat resistance, hydrothermal resistance, and UV resistance. Since it has the above-mentioned properties, particularly in optical devices, it is preferably utilized as an optical guide plate which emits light emitted from a light source at any desired site, for example, when displaying a display part of display devices such as displays, bottom parts of facsimiles, phones, mobile phones, and other various electrical applications, or the like. The curable polysiloxane composition and polysiloxane cured product of the invention can achieve particularly a high refractive index, they are suitable for an optical guide plate, and a so-called core layer (core part) of an optical waveguide, as an optical member.

[7] Member for Aerospace Industry

As an example of the optical member of the invention comprising at least the polysiloxane cured product of the invention, the following will explain the member for aerospace industry comprising at least the optical member of the invention (hereinafter referred to as a "member for aerospace industry of the invention" when appropriate).

When the curable polysiloxane composition or polysiloxane cured product of the invention is used as an optical member, it is high in various properties such as light transmittance (transparency), light resistance, heat resistance, hydrothermal resistance, and UV resistance and thus can be used in materials for aerospace industry for which these properties are required. As the materials for aerospace industry, for examples, it can be used as a static electricity eliminating material, a conductive adhesive, a gasket material, a flash defense material, an electromagnetic shield material, a tank material, a rocket external material, or the like, by making a composite material with a carbon-based nano material.

EXAMPLES

The present invention will be described more specifically below with reference to Examples, but these Examples are intended for explaining the invention and do not intend to limit the invention to these aspects.

Example 1

Into a 20 mL screw tube were added 6 g of both terminal silanol dimethylsiloxane-diphenylsiloxane copolymer silicone oil YF-3057 manufactured by Momentive Performance Materials, Inc., 0.14 g of methyl/hydride-based silicone oil KF-9901 manufactured by Shin-Etsu Chemical Co., Ltd. (SiH/Si—OH=6), and 0.006 g of NEO STANN U-810 (dioctyltin laurate) manufactured by Nitto Chem. Co., Ltd. as a catalyst, and the whole was stirred at room temperature under atmospheric pressure for 30 minutes to obtain a reaction solution (curable polysiloxane compound). 2 g of the reaction solution was placed in a polytetrafluoroethylene-made petri dish having a diameter of 5 cm and the petri dish was covered with an aluminum foil on which small holes had been opened and kept in a constant-temperature oven at 150° C. for 3 hours to obtain a colorless transparent elastomeric film (polysiloxane cured product) having a thickness of 1.08 mm. Only one foam having a diameter of about 0.5 mm was observed and Shore A hardness was 20.

Example 2

A colorless transparent elastomeric film having a thickness of 1.09 mm was obtained according to the method of Example 1 except that the both terminal silanol dimethylsiloxane-diphenylsiloxane copolymer silicone oil YF-3057 manufactured by Momentive Performance Materials, Inc. was changed to YF-3807 and 0.08 g of KF-9901 was used (Si—H/Si—OH=4). No foam was observed and Shore A hardness was 16.

Example 3

A colorless transparent elastomeric film having a thickness of 1.05 mm was obtained according to the method of Example 1 except that 0.03 g of KF-99 manufactured by Shin-Etsu Chemical Co., Ltd. was used instead of KF-9901 (Si—H/Si-011=3). No foam was observed and Shore A hardness was 20.

Example 4

A colorless transparent elastomeric film having a thickness of 1.10 mm was obtained according to the method of Example 1 except that tin 2-ethylhexanoate manufactured by STREM was used instead of NEO STANN U-810 (dioctyltin laurate) manufactured by Nitto Chem. Co., Ltd. Only three foams having a diameter of about 0.5 mm were observed and Shore A hardness was 24.

Example 5

A colorless transparent elastomeric film having a thickness of 1.12 mm was obtained according to the method of Example 1 except that 0.012 g of diethylhydroxylamine manufactured by Tokyo Chemical Industry Co., Ltd. was used instead of NEO STANN U-810 (dioctyltin laurate) manufactured by Nitto Chem. Co., Ltd. and no hole was opened on the aluminum foil at curing. No foam was observed and Shore A hardness was 20.

Example 6

A colorless transparent elastomeric film having a thickness of 1.11 mm was obtained according to the method of Example 1 except that 0.0004 g of trispentafluorophenylborane manufactured by Aldrich was used instead of NEO STANN U-810 (dioctyltin laurate) manufactured by Nitto Chem. Co., Ltd. No foam was observed and Shore A hardness was 18.

Example 7

3 g of the main agent of an addition type silicone resin LPS2410 manufactured by Shin-Etsu Chemical Co., Ltd., 0.3 g of the curing agent of the same, and 1.39 g of a both terminal silanol dimethylpolysiloxane YF-3057 manufactured by Momentive Performance Materials, Japan, Consolidated Company were weighed in a glass screw tube bottle, which was then tightly encapsulated. The whole was mixed and stirred at 25° C. for 5 minutes using a magnetic stirrer. The liquid obtained by mixing the main agent and curing agent of LPS-2410 had a vinyl group content of 1.19 mmol and an SiH group content of 1.48 mmol. An SiH/SiOH ratio of the composition to which YF-3057 (silanol group content: 0.0417 mmol) had been further added was 5. 2 g of the resultant composition was placed in a polytetrafluoroethylene-made petri dish having a diameter of 5 cm and defoamed in vacuo under conditions of 25° C., 15 minutes and 0.1 kPa, and the petri dish was covered with an aluminum foil on which small holes had been opened and kept in a constant-temperature oven at 150° C. for 2 hours to obtain a colorless transparent elastomeric film (polysiloxane cured product) having a thickness of 1.08 mm. No foam was observed and Shore A hardness was 28.

Example 8

1.5 g of the main agent of an addition type silicone resin OE6351 manufactured by Shin-Etsu Chemical Co., Ltd., 1.5 g of the curing agent of the same, and 2.1 g of a both terminal silanol dimethylpolysiloxane YF-3057 manufactured by Momentive Performance Materials, Japan, Consolidated Company were weighed in a glass screw tube bottle, which was then tightly encapsulated. The whole was mixed and stirred at 25° C. for 5 minutes using a magnetic stirrer. The liquid obtained by mixing the main agent and curing agent of OE6351 had a vinyl group content of 0.828 mmol and an SiH group content of 1.269 mmol. An SiH/SiOH ratio of the composition to which YF-3057 (silanol group content: 0.0417 mmol) had been further added was 5. 2 g of the resultant composition was treated according to the same method of Example 7 to obtain a colorless transparent elastomeric film having a thickness of 1.10 mm. No foam was observed and Shore A hardness was 25.

[Measurement of Refractive Index of Polysiloxane Cured Product]

The refractive index of the polysiloxane cured product was measured at 20° C. using a smooth-surface single/independent cured product film formed into a film thickness of about 1 mm or more as a sample and using an Abbe refractometer (using sodium D line (589 nm)).

[Measurement of Transmittance of Polysiloxane Cured Product]

The transmittance of the polysiloxane cured product was measured by transmittance measurement at 200 nm to 800 nm using a smooth-surface single/independent cured product film formed into a film thickness of about 1 mm as a sample and using an ultraviolet spectrophotometer (UV-3100 manufactured by Shimadzu Corporation as an example).

[Measurement of UV Resistance of Polysiloxane Cured Product]

Regarding the UV resistance of the polysiloxane cured product, UV irradiation was performed using a smooth-surface single/independent cured product film formed into a film thickness of about 1 mm or more as a sample and using a UV irradiation apparatus (Aicure ANUP5204) manufactured by Panasonic Electric Works Machine & Vision Co., Ltd. The irradiation and measurement were carried out with cutting off the light of 250 nm or shorter by a filter and keeping the distance from the sample to the optical fiber at 2 mm including the thickness of the filter.

As a result, the polysiloxane cured products of Examples 1 to 6 all did not result in discoloration, crack generation and the like even when irradiated for 20 h.

[Measurement of Heat Resistance/Hydrothermal Resistance of Polysiloxane Cured Product]

Regarding the heat resistance/hydrothermal resistance of the polysiloxane cured product, a smooth-surface single/independent cured product film formed into a film thickness of about 1 mm or more as a sample was stored for 500 hours either at 200° C. under normal humidity for heat resistance or at 85° C. under 85% RH for hydrothermal resistance. Evaluation was performed by a weight reduction rate before and after the storage.

As a result, the polysiloxane cured products of Examples 1 to 6 all showed 99% or more of the weight maintenance rate under 200° C. and 99% or more of the weight maintenance rate under 85° C. and 85% RH after storage for 500 hours, and discoloration or crack generation, remarkable hardness change, and the like did not occur at all.

TABLE 2

| | Polysiloxane Compound (1) (weight-average molecular weight) | Polysiloxane Compound (2) Ratio of hydrogen atom (%) | Ratio of alkyl group (methyl group) in $R^1$ to $R^{18}$ (mol %) | Curing catalyst | Curability in treatment at 150° C. for 6 hours | Average height in curing test (cm) | Refractive index | Shore A | Advantages exhibited by the invention | |
|---|---|---|---|---|---|---|---|---|---|---|
| | | | | | | | | | (*) Light transmittance | (**) Foaming property |
| Example 1 | "YF-3057" (48000) | "KF-9901" (48%) | 100% | Dioctyltin dilaurate | Cured | 0.108 | 1.41 | 20 | A | A |
| Example 2 | "YF-3807" (85300) | "KF-9901" (48%) | 100% | Dioctyltin dilaurate | Cured | 0.109 | 1.41 | 16 | A | A |
| Example 3 | "YF-3057" (48000) | "KF-99" (100%) | 100% | Dioctyltin dilaurate | Cured | 0.105 | 1.41 | 20 | A | A |
| Example 4 | "YF-3057" (48000) | "KF-9901" (48%) | 100% | Tin 2-ethyl-hexanoate | Cured | 0.110 | 1.41 | 24 | A | A |
| Example 5 | "YF-3057" (48000) | "KF-9901" (48%) | 100% | Diethyl-hydroxylamine | Cured | 0.112 | 1.41 | 20 | A | A |
| Example 6 | "YF-3057" (48000) | "KF-9901" (48%) | 100% | Tris(pentafluoro-phenyl)borane | Cured | 0.111 | 1.41 | 18 | A | A |

(*) Light transmittance was based on the following evaluation.
A: transmittance is 90% or more at 400 nm to 800 nm
B: transmittance is 85% or more at 400 nm to 800 nm
C: transmittance is 80% or more at 400 nm to 800 nm
D: transmittance is less than 80% at 400 nm to 800 nm
(**) Foaming property was based on the following evaluation.
A: the number of visually confirmed foams having a diameter of about 1 mm or less is 3 or less
B: the number of visually confirmed foams having a diameter of about 1 mm is 3 or more and 6 or less
C: the number of visually confirmed foams having a diameter of about 1 mm is 6 or more and 10 or less
D: the number of visually confirmed foams having a diameter of about 1 mm is more than 10

While the invention has been described in detail and with reference to specific embodiments thereof, it will be apparent to one skilled in the art that various changes and modifications can be made therein without departing from the spirit and scope thereof.

The present application is based on Japanese Patent Application No. 2008-088316 filed on Mar. 28, 2008, and the contents thereof are incorporated herein by reference.

Industrial Applicability

The uses of the curable polysiloxane composition and polysiloxane cured product of the invention are not particularly limited but can be suitably used as an encapsulant in the semiconductor fields, particularly semiconductor light-emitting device fields. For example, they can be suitably used in wide variety of fields of light sources for liquid crystal backlight of illuminating devices, image display devices, thin TV sets, and the like. Particularly, owing to the feature of excellent UV resistance, industrial applicability thereof is extremely high in respective fields of semiconductor light-emitting devices emitting near ultraviolet/ultraviolet rays for which no suitable encapsulant is hitherto present, and illuminating devices and image display devices to which the devices may be applied.

Furthermore, by using them as a binder for holding phosphors to be excited by near ultraviolet/ultraviolet rays, it becomes possible to select a wider range of phosphors than those to be excited by blue light, enabling the provision of semiconductor light-emitting devices having high color rendering and high luminance. Such a white light source derived from red/green/blue phosphors to be excited by ultraviolet rays has high color rendering and excellent in color reproducibility. Thus, by using the curable polysiloxane composition of the invention and the cured product thereof in backlighting for liquid crystal displays, illumination for houses and stores, lighting for photographic development for physics and chemistry, medical use, and process inspection, there can be provided high quality illuminating devices which hardly induce eyestrain and physical disorder even when they are looked on for a long period of time.

Moreover, the curable polysiloxane composition and polysiloxane cured product of the invention are highly applicable to not only the above-mentioned semiconductor light-emitting device fields but also materials for aerospace industry and the other materials for which various properties such as light transmittance (transparency), light resistance, heat resistance, hydrothermal resistance, and UV resistance are required, for example, heat conductive sheets, heat conductive adhesive materials, insulating heat conductive materials, under filling materials, encapsulants, optical waveguide structural materials, optical guide plates, optical guide sheets, reflection light regulation materials, microfluid materials for diagnosis, microorganism culture media, and materials for nonoimprint, so that the industrial applicability is extremely high in aerospace fields, optics fields, electrics/electronics fields, biochemistry fields, and the like.

The invention claimed is:

1. A non-foamed optical member comprising a polysiloxane cured product obtained by curing a heat-curable polysiloxane composition, said heat-curable polysiloxane composition comprising a dehydrogenative condensation reaction catalyst;
a polysiloxane compound represented by formula (3):

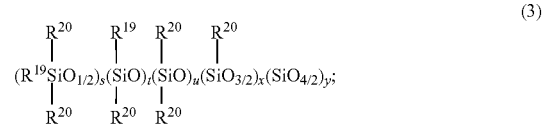

and one of (i) and (ii): (i) a combination of polysiloxane compound (A) and polysiloxane compound (B); (ii): a polysiloxane compound (C), wherein polysiloxane compound (A) is a compound comprising two or more hydrosilyl groups per molecule and no substituent thereof has an aliphatic unsaturated bond, polysiloxane compound (B) is a compound comprising two or more silanol groups per molecule and no substituent thereof has an aliphatic unsaturated bond, polysiloxane compound (C) is a compound at least one hydrosilyl group and at least one silanol group per molecule and no substituent thereof has an aliphatic unsaturated bond, $R^{19}$ is an alkenyl group, $R^{20}$s are the same as or different from each other and are each a monovalent hydrocarbon group having 6 or less carbon atoms or an alkoxy group having 3 or less carbon atoms, s and u are each a positive number, t≥0, x≥0, and y≥0.

2. The non-foamed optical member according to claim 1, wherein said heat-curable polysiloxane is in cured form, and said cured form of the heat-curable polysiloxane composition has an average value in height of 0.12 cm or less determined by a curing test:
(1) 2 g of the curable polysiloxane composition is allowed to stand in a polytetrafluoroethylene container having a basal plane diameter of 5 cm and a height of 1 cm under air at a temperature of 150° C. for 6 hours, giving a cured product; then
(2) after (1), it is confirmed that the composition has no fluidity (is cured) even when it is allowed to stand for 30 minutes in a state wherein the basal plane of the polytetrafluoroethylene container is tilted by 45°; and then
(3) an average value in height from an inner bottom of the container to a top surface of the cured product is measured.

3. The non-foamed optical member according to claim 1, wherein said polysiloxane compound (A) is a compound represented by formula (1):

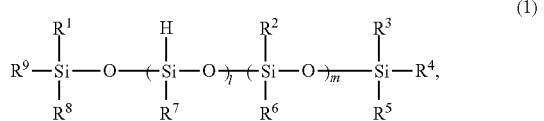
(1)

where
$R^1$ to $R^3$ and $R^5$ to $R^8$ each independently represent a group selected from the group consisting of a hydrogen atom, an alkyl group, an aryl group, and $R^{10}R^{11}R^{12}Si$, $R^4$ and $R^9$ to $R^{12}$ each independently represent a group selected from the group consisting of a hydrogen atom, an alkyl group, and an aryl group, l represents an integer of 2 or larger, and m represents an integer of 0 or larger; and said polysiloxane compound (B) is represented by formula (2):

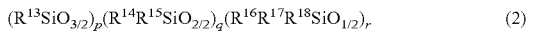
(2)

where
$R^{13}$ to $R^{18}$ each independently represent a group selected from the group consisting of a hydrogen atom, an alkyl group, a hydroxyl group, and an aryl group;

p, q, and r each represent an integer of 0 or larger; and p+q+r≥1.

4. The non-foamed optical member according to claim 1, wherein the dehydrogenative condensation reaction catalyst comprises at least one member selected from the group consisting of a metal, a hydroxylamine, and boron.

5. The non-foamed optical member according to claim 1, wherein said heat-curable polysiloxane composition is a composition that can be cured within 6 hours under air at the temperature of 150° C.

6. The non-foamed optical member according to claim 1, wherein a refractive index of the heat-curable polysiloxane composition at temperature of 20° C. at 589 nm is 1.42 or less.

7. The non-foamed optical member according to claim 1, wherein 95 mol % or more of substituents, excluding hydrogen and hydroxyl groups, among all the substituents bound to the silicon atom of the siloxane compound, are methyl groups.

8. The non-foamed optical member according to claim 1, wherein the polysiloxane cured product has a measurement value of hardness (Shore A) of from 5 or larger and 90 or smaller by durometer type A, and a light transmittance over whole wavelengths of 400 nm or more and 800 nm or less at a film thickness of 1 mm is 80% or more.

9. The non-foamed optical member according to claim 1, wherein the optical member is an encapsulant of a semiconductor light-emitting device.

10. A semiconductor light-emitting device, comprising the optical member according to claim 1.

11. An illuminating device comprising the semiconductor light-emitting device according to claim 10.

12. An image display device comprising the semiconductor light-emitting device according to claim 10.

13. The non-foamed optical member according to claim 1, wherein said dehydrogenative condensation reaction catalyst comprises, as a metal component thereof, at least one metal selected from the group consisting of Pt, Pd, Pb, Sn, Zn, Fe, Ti, Zr, and Bi.

14. The non-foamed optical member according to claim 1, wherein said dehydrogenative condensation reaction catalyst comprises, as a metal component thereof, at least one metal selected from the group consisting of Pt, Pd, and Sn.

15. The non-foamed optical member according to claim 1, wherein 99 mol % or more of substituents, excluding hydrogen and hydroxyl groups, among all the substituents bound to the silicon atom of the siloxane compound, are methyl groups.

16. The non-foamed optical member according to claim 1, wherein said heat-curable polysiloxane composition is a composition that can be cured within 3 hours under air at the temperature of 150° C.

17. The non-foamed optical member according to claim 1, wherein said dehydrogenative condensation reaction catalyst is present in the heat-curable polysiloxane composition in an amount of from 0.001% to 0.3% by weight in the total raw material weight in terms of a hydroxylamine, boron, or a metal element.

18. The non-foamed optical member according to claim 1, wherein said dehydrogenative condensation reaction catalyst is present in the heat-curable polysiloxane composition in an amount of from 0.002% to 0.2% by weight in the total raw material weight in terms of a hydroxylamine, boron, or a metal element.

19. The non-foamed optical member according to claim 1, wherein said dehydrogenative condensation reaction catalyst is present in the heat-curable polysiloxane composition in an amount of from 0.005% to 0.1% by weight in the total raw material weight in terms of a hydroxylamine, boron, or a metal element.

* * * * *